US012733166B2

(12) United States Patent
Baek et al.

(10) Patent No.: US 12,733,166 B2
(45) Date of Patent: Sep. 8, 2026

(54) THREE-DIMENSIONAL SEMICONDUCTOR MEMORY DEVICE INCLUDING SEPARATION REGION AND ELECTRONIC SYSTEM INCLUDING THE SAME

(71) Applicant: SAMSUNG ELECTRONICS CO., LTD., Suwon-si (KR)

(72) Inventors: Seokcheon Baek, Hwaseong-si (KR); Miram Kwon, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 828 days.

(21) Appl. No.: 18/080,916

(22) Filed: Dec. 14, 2022

(65) Prior Publication Data

US 2023/0309307 A1 Sep. 28, 2023

(30) Foreign Application Priority Data

Mar. 22, 2022 (KR) ........................ 10-2022-0035338

(51) Int. Cl.

| | |
|---|---|
| ***H10B 43/27*** | (2023.01) |
| ***H10B 41/27*** | (2023.01) |
| ***H10B 41/41*** | (2023.01) |
| ***H10B 43/10*** | (2023.01) |
| ***H10B 43/40*** | (2023.01) |
| ***H10B 43/50*** | (2023.01) |

(52) U.S. Cl.

CPC ............. *H10B 43/27* (2023.02); *H10B 41/27* (2023.02); *H10B 41/41* (2023.02); *H10B 43/10* (2023.02); *H10B 43/40* (2023.02); *H10B 43/50* (2023.02)

(58) Field of Classification Search

CPC ........ H10B 41/27; H10B 43/27; H10B 41/10; H10B 43/10

See application file for complete search history.

(56) References Cited

U.S. PATENT DOCUMENTS

| | | |
|---|---|---|
| 9,165,937 B2 | 10/2015 | Yip et al. |
| 10,403,636 B2 | 9/2019 | Inokuma et al. |

(Continued)

FOREIGN PATENT DOCUMENTS

| | | |
|---|---|---|
| CN | 109887919 B | 5/2020 |
| EP | 3557622 A2 | 12/2019 |

(Continued)

*Primary Examiner* — Kevin Parendo

(74) *Attorney, Agent, or Firm* — Muir Patent Law, PLLC

(57) ABSTRACT

A three-dimensional semiconductor memory device may include a substrate including a first connection region, a first cell region, a separation region, a second cell region, and a second connection region, which are sequentially disposed in a first direction, a stack structure including electrode layers and insulating layers, which are alternately stacked on the substrate, the electrode layers including upper electrode layers, a first insulating line pattern on the separation region to penetrate the upper electrode layers and extend in a second direction crossing the first direction, second and third insulating line patterns on the separation region to penetrate the first insulating line pattern and the stack structure and to extend in the second direction to divide the stack structure into first and second sub-stack structures, and a remaining stack structure between the second and third insulating line patterns and spaced apart from the first and second sub-stack structures.

20 Claims, 54 Drawing Sheets

(56) References Cited

U.S. PATENT DOCUMENTS

| | | | | |
|---|---|---|---|---|
| 10,658,375 | B2 | 5/2020 | Yon et al. | |
| 2012/0003800 | A1* | 1/2012 | Lee | G11C 16/28 257/E21.645 |
| 2016/0163726 | A1 | 6/2016 | Tanzawa | |
| 2021/0005629 | A1* | 1/2021 | Lim | G11C 7/18 |
| 2021/0193672 | A1 | 6/2021 | Kim et al. | |
| 2021/0335801 | A1 | 10/2021 | Yang et al. | |
| 2022/0037351 | A1 | 2/2022 | Lee et al. | |

FOREIGN PATENT DOCUMENTS

| | | | |
|---|---|---|---|
| EP | 3931869 | A1 | 1/2022 |
| KR | 10-2307487 | B1 | 10/2021 |
| KR | 20220017027 | A | 2/2022 |
| WO | WO 2021/212446 | A1 | 10/2021 |

* cited by examiner

ETHV
A'
WC
CC
CNR2
BLK2
DVS
VS
CAR2
IP4
IP1
SNR
C'
C
IP2
B'
B
IP3
CAR1
EL9
BLK1
EL8
EL7
EL6
EL5
EL4
EL3
EL2
EL1
CNR1
A
PST
201
D1
D2
SBLK
SBLK

FIG. 3B

FIG. 3C 51
53
A'
49
CNR2
BLK2
VS
CAR2
GR2
IP1
SNR
GR1
B'
B
CAR1
DVS
26e
26d
26c
26b
26a
14d
14c
14b
14a
BLK1
CNR1
A
PST
201
SBLK
SBLK
D1
D2

210
45p
SC1
WR
201
109
107
105
103
A'
8
PTR
8
CNR2
BLK2
30b
BH
CAR2
BGP
43
41
11
SNR
CAR1
BLK1
CNR1
A
PST
12e
14d
12d
14c
12c
14b
12b
14a
12a
PLS

PUS
22
26
22
26
22
210
45p
SC1
WR
201
109
107
105
103
A'
A
8
PTR
CNR2
BLK2
30b
BH
BGP
CAR2
43
41
11
SNR
CAR1
BLK1
CNR1
TR1
MK2
MK1
MK3
12e
14d
12d
14c
12c
14b
12b
14a
12a
PLS
PST

FIG. 6G

PUS
22f
26e
22e
26d
22d
26c
22c
26b
22b
26a
22a
210
45p
SC1
WR
201
109
107
105
103
A'
8
PTR
CNR2
BLK2
30b
BH
BGP
CAR2
43
41
11
SNR
CAR1
BLK1
CNR1
A
TR1
MK2
MK1
12e
14d
12d
14c
12c
14b
12b
14a
12a
PLS
PST

FIG. 17

THREE-DIMENSIONAL SEMICONDUCTOR MEMORY DEVICE INCLUDING SEPARATION REGION AND ELECTRONIC SYSTEM INCLUDING THE SAME

CROSS-REFERENCE TO RELATED APPLICATIONS

This U.S. non-provisional patent application claims priority under 35 U.S.C. § 119 to Korean Patent Application No. 10-2022-0035338, filed on Mar. 22, 2022, in the Korean Intellectual Property Office, the entire contents of which are hereby incorporated by reference.

BACKGROUND

1. Field

The present disclosure relates to a semiconductor device and an electronic system including the same, and in particular, to a three-dimensional semiconductor memory device with improved reliability and increased integration density and an electronic system including the same.

2. Description of the Related Art

Higher integration of semiconductor devices is required to satisfy consumer demands for superior performance and inexpensive prices. In the case of semiconductor devices, since their integration is an important factor in determining product prices, increased integration is especially required. In the case of two-dimensional or planar semiconductor devices, since their integration is mainly determined by the area occupied by a unit memory cell, integration is greatly influenced by the level of a fine pattern forming technology. However, the extremely expensive process equipment needed to increase pattern fineness sets a practical limitation on increasing integration for two-dimensional or planar semiconductor devices. Thus, three-dimensional semiconductor memory devices including three-dimensionally arranged memory cells have recently been proposed.

SUMMARY

According to an embodiment, a three-dimensional semiconductor memory device may include a substrate including a first connection region, a first cell region, a separation region, a second cell region, and a second connection region, which are sequentially disposed in a first direction, a stack structure including electrode layers and electrode interlayer insulating layers, which are alternately stacked on the substrate, the electrode layers including upper electrode layers, a first insulating line pattern, which is provided on the separation region to penetrate the upper electrode layers and extends in a second direction crossing the first direction, a second insulating line pattern and a third insulating line pattern, which are provided on the separation region to penetrate the first insulating line pattern and the stack structure and extend in the second direction to divide the stack structure into a first sub-stack structure and a second sub-stack structure, and a remaining stack structure interposed between the second insulating line pattern and the third insulating line pattern and spaced apart from the first and second sub-stack structures.

According to an embodiment, a three-dimensional semiconductor memory device may include a peripheral circuit structure and a cell array structure disposed thereon. The cell array structure may include a substrate including a first connection region, a first cell region, a separation region, a second cell region, and a second connection region, which are sequentially disposed in a first direction, a source structure on the substrate, a stack structure including electrode layers and electrode interlayer insulating layers, which are alternately stacked on the source structure, the electrode layers including upper electrode layers placed near a top surface of the stack structure, a first insulating line pattern, which is provided on the separation region to penetrate the upper electrode layers and extends in a second direction crossing the first direction, a second insulating line pattern and a third insulating line pattern, which are provided on the separation region to penetrate the first insulating line pattern and the stack structure and extend in the second direction to divide the stack structure into a first sub-stack structure and a second sub-stack structure, each of the first and second sub-stack structures including a lower stack structure and an upper stack structure thereon, a planarization insulating layer provided on the first and second connection regions to cover end portions of the first and second sub-stack structures, a plurality of vertical semiconductor patterns, which are provided on the first and second cell regions to penetrate the first and second sub-stack structures and the source structure and to be adjacent to the substrate, and bit line pads disposed on the vertical semiconductor patterns, respectively. Each of side surfaces of the vertical semiconductor patterns may have an inflection point, near an interface between the lower stack structure and the upper stack structure. The electrode layers may further include intermediate electrode layers, which are disposed below the first insulating line pattern. A first intermediate electrode layer, which is the uppermost one of the intermediate electrode layers, may be in contact with a bottom surface of the first insulating line pattern. The first intermediate electrode layer may have a first thickness, below the first insulating line pattern. The first intermediate electrode layer may have a second thickness, between the electrode interlayer insulating layers. The first thickness may be larger than the second thickness.

According to an embodiment, an electronic system may include a semiconductor device, which includes a peripheral circuit structure, a cell array structure on the peripheral circuit structure, and an input/output pad electrically connected to the peripheral circuit structure, and a controller, which is electrically connected to the semiconductor device through the input/output pad and is used to control the semiconductor device. The cell array structure may include a substrate including a first connection region, a first cell region, a separation region, a second cell region, and a second connection region, which are sequentially disposed in a first direction, a stack structure including electrode layers and electrode interlayer insulating layers, which are alternately stacked on the substrate, the electrode layers including upper electrode layers, a first insulating line pattern provided on the separation region to penetrate the upper electrode layers and extended in a second direction crossing the first direction, a second insulating line pattern and a third insulating line pattern provided on the separation region to penetrate the first insulating line pattern and the stack structure and extended in the second direction to divide the stack structure into a first sub-stack structure and a second sub-stack structure, and a remaining stack structure interposed between the second insulating line pattern and the third insulating line pattern and spaced apart from the first and second sub-stack structures.

BRIEF DESCRIPTION OF THE DRAWINGS

Features will become apparent to those of skill in the art by describing in detail exemplary embodiments with reference to the attached drawings, in which:

FIG. 1B is a perspective view schematically illustrating an electronic system including a semiconductor device according to an embodiment.

FIG. 3B is a sectional view taken along line B-B' of FIG. 2.

FIG. 3C is a sectional view taken along line C-C' of FIG. 2.

FIG. 17 is a sectional view illustrating a semiconductor device according to an embodiment.

DETAILED DESCRIPTION

Figure 1A:
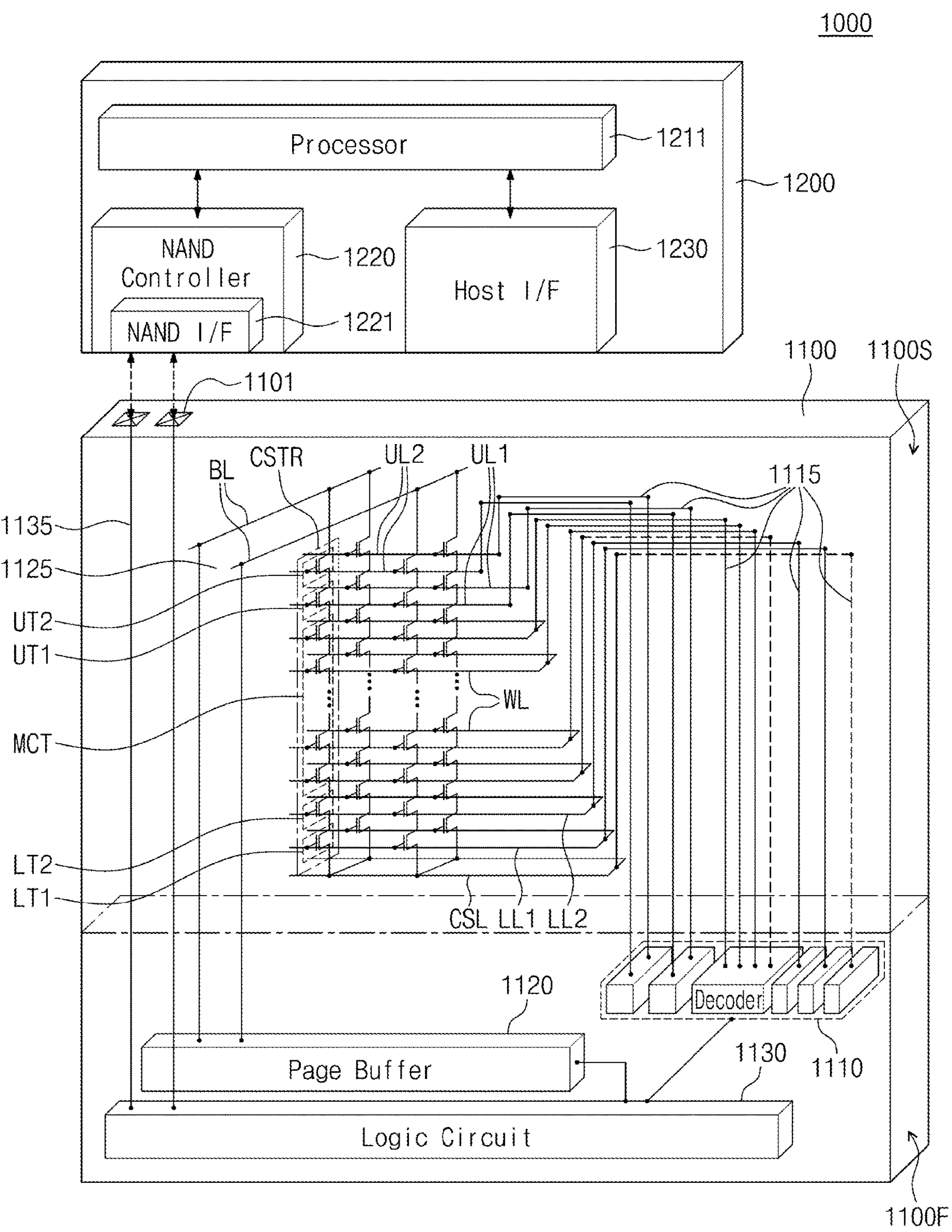
FIG. 1A is a diagram schematically illustrating an electronic system including a semiconductor device according to an embodiment.

FIG. 1A is a diagram schematically illustrating an electronic system including a semiconductor device according to an embodiment.

Referring to FIG. 1A, an electronic system 1000 according to an embodiment may include a semiconductor device 1100 and a controller 1200 electrically connected to the semiconductor device 1100. The electronic system 1000 may be a storage device including one or more semiconductor devices 1100 or an electronic device including the storage device. For example, the electronic system 1000 may be a solid state drive (SSD) device, a universal serial bus (USB), a computing system, a medical system, or a communication system, in which at least one semiconductor device 1100 is provided.

The semiconductor device 1100 may be a nonvolatile memory device (e.g., a NAND FLASH memory device). The semiconductor device 1100 may include a first structure 1100F and a second structure 1100S on the first structure 1100F. In an embodiment, the first structure 1100F may be disposed beside, e.g., laterally adjacent, the second structure 1100S. The first structure 1100F may be a peripheral circuit structure including a decoder circuit 1110, a page buffer circuit 1120, and a logic circuit 1130. The second structure 1100S may be a memory cell structure including a bit line BL, a common source line CSL, word lines WL, first and second gate upper lines UL1 and UL2, first and second gate lower lines LL1 and LL2, and memory cell strings CSTR between the bit line BL and the common source line CSL.

In the second structure 1100S, each of the memory cell strings CSTR may include lower transistors LT1 and LT2 adjacent to the common source line CSL, upper transistors UT1 and UT2 adjacent to the bit line BL, and a plurality of memory cell transistors MCT disposed between the lower transistors LT1 and LT2 and the upper transistors UT1 and UT2. The number of the lower transistors LT1 and LT2 and the number of the upper transistors UT1 and UT2 may be variously changed, according to embodiments.

In an embodiment, the upper transistors UT1 and UT2 may include at least one string selection transistor, and the lower transistors LT1 and LT2 may include at least one ground selection transistor. The gate lower lines LL1 and LL2 may be respectively used as gate electrodes of the lower transistors LT1 and LT2. The word lines WL may be respectively used as gate electrodes of the memory cell transistors MCT, and the gate upper lines UL1 and UL2 may be respectively used as gate electrodes of the upper transistors UT1 and UT2.

In an embodiment, the lower transistors LT1 and LT2 may include a lower erase control transistor LT1 and a ground selection transistor LT2, which are connected in series. The upper transistors UT1 and UT2 may include a string selection transistor UT1 and an upper erase control transistor UT2, which are connected in series. At least one of the lower and upper erase control transistors LT1 and UT2 may be used for an erase operation of erasing data, which are stored in the memory cell transistors MCT, using a gate-induced drain leakage (GIDL) phenomenon.

The common source line CSL, the first and second gate lower lines LL1 and LL2, the word lines WL, and the first and second gate upper lines UL1 and UL2 may be electrically connected to the decoder circuit 1110 through first connection lines 1115, which extend from the first structure 1100F into the second structure 1100S. The bit lines BL may be electrically connected to the page buffer circuit 1120 through second connection lines 1125, which extend from the first structure 1100F to the second structure 1100S.

In the first structure 1100F, the decoder circuit 1110 and the page buffer circuit 1120 may be configured to perform a control operation on at least one of the memory cell transistors MCT. The decoder circuit 1110 and the page buffer circuit 1120 may be controlled by the logic circuit 1130. The semiconductor device 1100 may communicate with the controller 1200 through an input/output pad 1101, which is electrically connected to the logic circuit 1130. The input/output pad 1101 may be electrically connected to the logic circuit 1130 through an input/output connection line 1135, which extends from the first structure 1100F to the second structure 1100S.

The controller 1200 may include a processor 1211, a NAND controller 1220, and a host interface 1230. In an embodiment, the electronic system 1000 may include a plurality of semiconductor devices 1100, and in this case, the controller 1200 may control the semiconductor devices 1100.

The processor 1211 may control overall operations of the electronic system 1000 including the controller 1200. The processor 1211 may be operated based on a specific firmware and may control the NAND controller 1220 to access the semiconductor device 1100. The NAND controller 1220 may include a NAND interface 1221 which is used for communication with the semiconductor device 1100. The NAND interface 1221 may be used to transmit and receive control commands, which are used to control the semiconductor device 1100, and data, which will be written in or read from the memory cell transistors MCT of the semiconductor device 1100. The host interface 1230 may be configured to allow for communication between the electronic system 1000 and an external host. When a control command is received from the external host through the host interface 1230, the processor 1211 may control the semiconductor device 1100 in response to the control command.

Figure 1B:
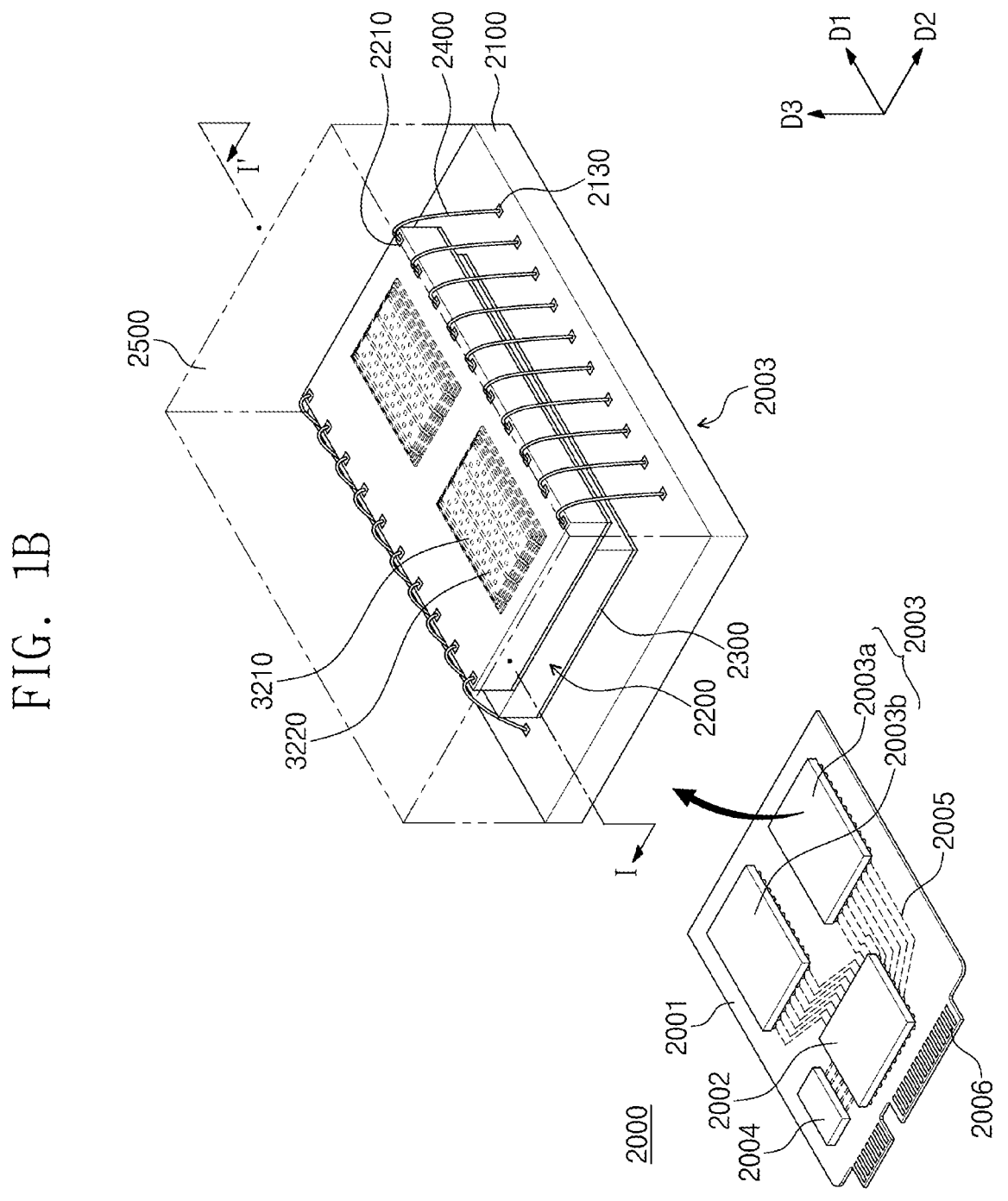

FIG. 1B is a perspective view schematically illustrating an electronic system including a semiconductor device according to an embodiment.

Referring to FIG. 1B, an electronic system 2000 according to an embodiment may include a main substrate 2001 and a controller 2002, at least one semiconductor package 2003, and a dynamic random access memory (DRAM) 2004, mounted on the main substrate 2001. The semiconductor package 2003 and the DRAM 2004 may be connected to the controller 2002 by interconnection patterns 2005, which are formed in the main substrate 2001.

The main substrate 2001 may include a connector 2006, which includes a plurality of pins coupled to an external host. In the connector 2006, the number and arrangement of the pins may be changed depending on a communication interface between the electronic system 2000 and the external host. In an embodiment, the electronic system 2000 may communicate with the external host, in accordance with one of interfaces, e.g., universal serial bus (USB), peripheral component interconnect express (PCI-Express), serial advanced technology attachment (SATA), universal flash storage (UFS) M-Phy, or the like. In an embodiment, the electronic system 2000 may be driven by a power, which is supplied from the external host through the connector 2006. The electronic system 2000 may further include a power management integrated circuit (PMIC) that is configured to distribute a power, which is supplied from the external host, to the controller 2002 and the semiconductor package 2003.

The controller 2002 may be configured to control a writing or reading operation on the semiconductor package 2003 and to improve an operation speed of the electronic system 2000.

The DRAM 2004 may be a buffer memory, which relieves technical difficulties caused by a difference in speed between the semiconductor package 2003, which serves as a data storage device, and an external host. In an embodiment, the DRAM 2004 in the electronic system 2000 may serve as a cache memory and may be used as a storage space, which is configured to store data temporarily during a control operation on the semiconductor package 2003. In the case where the electronic system 2000 includes the DRAM 2004, the controller 2002 may further include a DRAM controller for controlling the DRAM 2004, in addition to a NAND controller for controlling the semiconductor package 2003.

The semiconductor package 2003 may include first and second semiconductor packages **2003*a* and 2003*b* spaced apart from each other. Each of the first and second semiconductor packages 2003*a* and 2003*b* may be a semiconductor package including a plurality of semiconductor chips 2200. Each of the first and second semiconductor packages 2003*a* and 2003*b* may include a package substrate 2100, the semiconductor chips 2200 on the package substrate 2100, adhesive layers 2300 disposed on respective bottom surfaces of the semiconductor chips 2200, a connection structure 2400 electrically connecting the semiconductor chips 2200 to the package substrate 2100, and a molding layer 2500 disposed on the package substrate 2100 to cover the semiconductor chips 2200 and the connection structure 2400**.

The package substrate 2100 may be a printed circuit board including package upper pads 2130. Each of the semiconductor chips 2200 may include an input/output pad 2210. The input/output pad 2210 may correspond to the input/output pad 1101 of FIG. 1A. Each of the semiconductor chips 2200 may include gate stacks 3210 and vertical structures 3220. Each of the semiconductor chips 2200 may include a semiconductor device, which will be described below, according to an embodiment.

In an embodiment, the connection structure 2400 may be a bonding wire, which is provided to electrically connect the input/output pad 2210 to the package upper pads 2130. Thus, in each of the first and second semiconductor packages **2003*a* and 2003*b*, the semiconductor chips 2200 may be electrically connected to each other in a bonding wire manner and may be electrically connected to the package upper pads 2130 of the package substrate 2100. Alternatively, in each of the first and second semiconductor packages 2003*a* and 2003*b*, the semiconductor chips 2200 may be electrically connected to each other by a connection structure including through-silicon vias (TSV), not by the connection structure 2400** provided in the form of bonding wires.

In an embodiment, the controller 2002 and the semiconductor chips 2200 may be included in a single package. In an embodiment, the controller 2002 and the semiconductor chips 2200 may be mounted on an additional interposer substrate different from the main substrate 2001 and may be connected to each other through interconnection lines, which are provided in the interposer substrate.

Figure 1C:
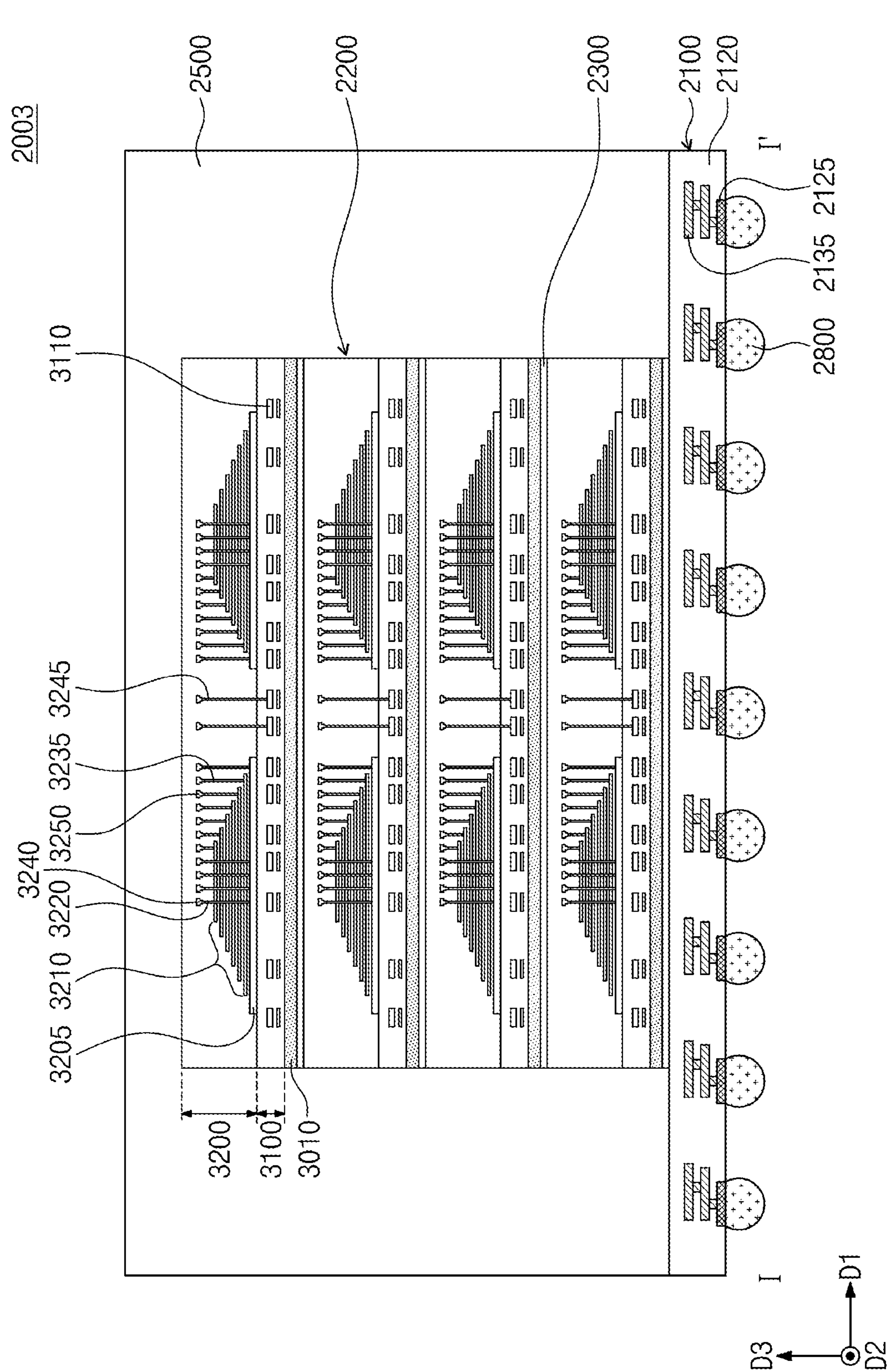
FIGS. 1C and 1D are sectional views schematically illustrating semiconductor packages according to an embodiment.
Figure 1D:
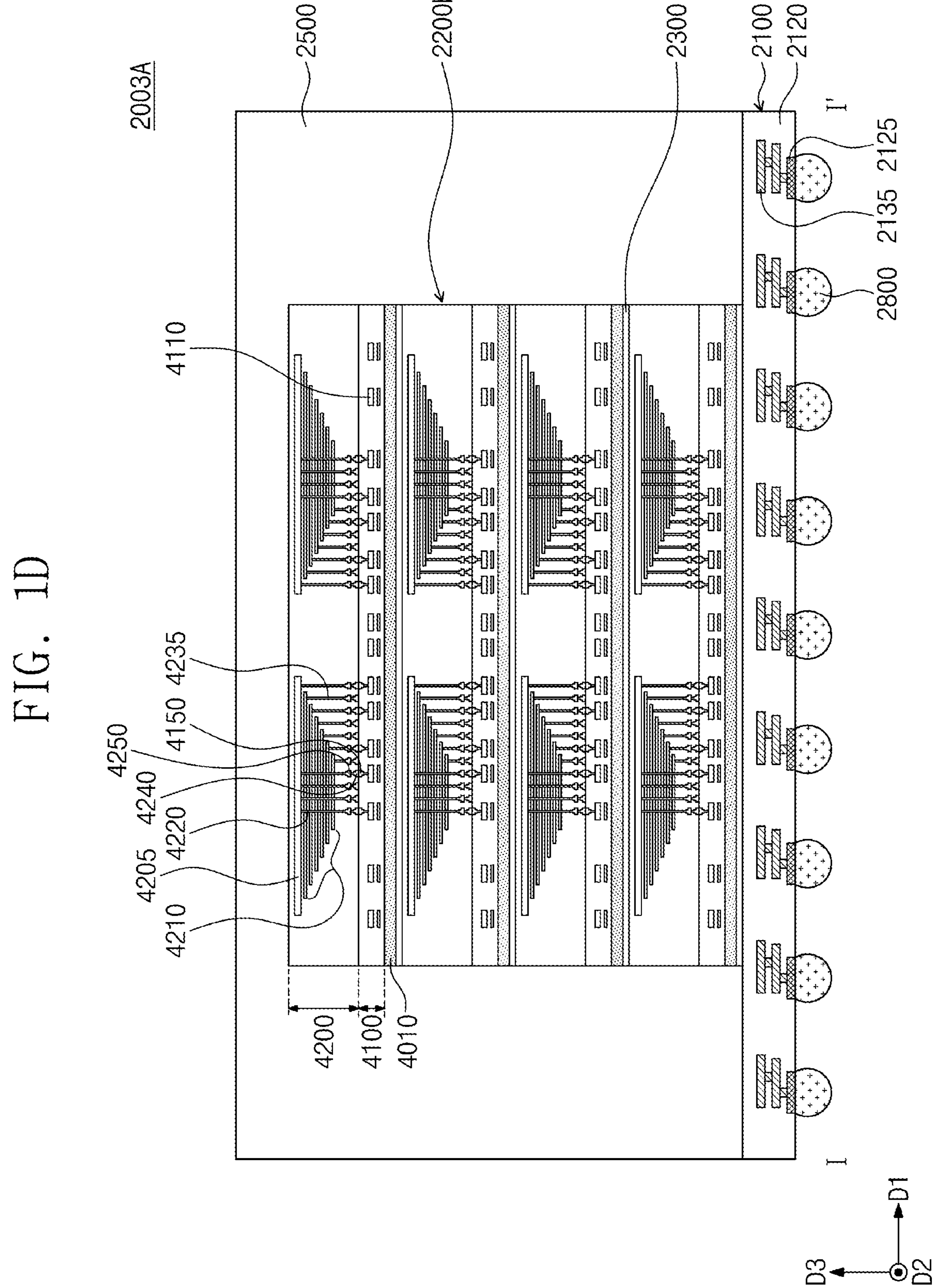

FIGS. 1C and 1D are cross-sectional views, each of which schematically illustrates a semiconductor package according to an embodiment. FIGS. 1C and 1D are cross-sectional views taken along line I-I' of FIG. 1B and illustrate two different examples of the semiconductor package of FIG. 1B.

Referring to FIG. 1C, the package substrate 2100 of the semiconductor package 2003 may be a printed circuit board. The package substrate 2100 may include a package substrate body portion 2120, the package upper pads 2130 (e.g., see FIG. 1B), which are disposed on a top surface of the package substrate body portion 2120, lower pads 2125, which are disposed on or exposed through a bottom surface of the package substrate body portion 2120, and internal lines 2135, which are disposed in the package substrate body portion 2120 to electrically connect the package upper pads 2130 to the lower pads 2125. The package upper pads 2130 may be electrically connected to the connection structures 2400. The lower pads 2125 may be connected to the interconnection patterns 2005 of the main substrate 2001 of the electronic system 2000 shown in FIG. 1B through conductive connecting portions 2800.

Each of the semiconductor chips 2200 may include a semiconductor substrate 3010 and a first structure 3100 and a second structure 3200, which are sequentially stacked on the semiconductor substrate 3010. The first structure 3100 may include a peripheral circuit region including peripheral lines 3110. The second structure 3200 may include a source structure 3205, a stack 3210 on the source structure 3205, the vertical structures 3220 and separation structures penetrating the stack 3210, bit lines 3240 electrically connected to the vertical structures 3220, and gate connection lines 3250 and cell contact plugs 3235 electrically connected to the word lines WL (e.g., see FIG. 1) of the stack 3210. Each of the first and second structures 3100 and 3200 and the semiconductor chips 2200 may further include separation structures to be described below.

Each of the semiconductor chips 2200 may include a penetration line 3245, which is electrically connected to the peripheral lines 3110 of the first structure 3100 and extends into the second structure 3200. The penetration line 3245 may be disposed outside the stack 3210, and in an embodiment, the penetration line 3245 may be provided to further penetrate the stack 3210. Each of the semiconductor chips 2200 may further include the input/output pad 2210 (e.g., see FIG. 1B), which is electrically connected to the peripheral lines 3110 of the first structure 3100.

Referring to FIG. 1D, in the semiconductor package 2003A, each of the semiconductor chips 2200*b* may include a semiconductor substrate 4010, a first structure 4100 on the semiconductor substrate 4010, and a second structure 4200, which is provided on the first structure 4100 and is bonded to the first structure 4100 in a wafer bonding manner.

The first structure 4100 may include a peripheral circuit region including a peripheral line 4110 and first junction structures 4150. The second structure 4200 may include a source structure 4205, a stack 4210 between the source structure 4205 and the first structure 4100, vertical structures 4220 and a separation structure penetrating the stack 4210, and second junction structures 4250, which are electrically and respectively connected to the vertical structures 4220 and the word lines WL (e.g., see FIG. 1A) of the stack 4210. For example, the second junction structures 4250 may be electrically connected to the vertical structures 4220 and the word lines WL (e.g., see FIG. 1A), respectively, through bit lines 4240 electrically connected to the vertical structures 4220 and cell contact plugs 4235 electrically connected to the word lines WL (e.g., see FIG. 1A). The first junction structures 4150 of the first structure 4100 may be in contact with and bonded to the second junction structures 4250 of the second structure 4200. The bonded portions of the first junction structures 4150 and the second junction structures 4250 may be formed of or include, e.g., copper (Cu).

Each of the first and second structures 4100 and 4200 and the semiconductor chips 2200*b* may further include a source structure according to an embodiment to be described below. Each of the semiconductor chips 2200*b* may further include the input/output pad 2210 (e.g., see FIG. 1B), which is electrically connected to the peripheral lines 4110 of the first structure 4100.

The semiconductor chips 2200 of FIG. 1C and the semiconductor chips 2200*b* of FIG. 1D may be electrically connected to each other by the connection structures 2400, which are provided in the form of bonding wires. However, in an embodiment, semiconductor chips provided in each semiconductor package (e.g., the semiconductor chips 2200 of FIG. 1C and the semiconductor chips 2200*b* of FIG. 1D) may be electrically connected to each other through a connection structure including through-silicon vias (TSV).

The first structure 3100 of FIG. 1C and the first structure 4100 of FIG. 1D may correspond to a peripheral circuit structure in an embodiment to be described below, and the second structure 3200 of FIG. 1C and the second structure 4200 of FIG. 1D may correspond to a cell array structure in an embodiment to be described below.

Figure 1E:
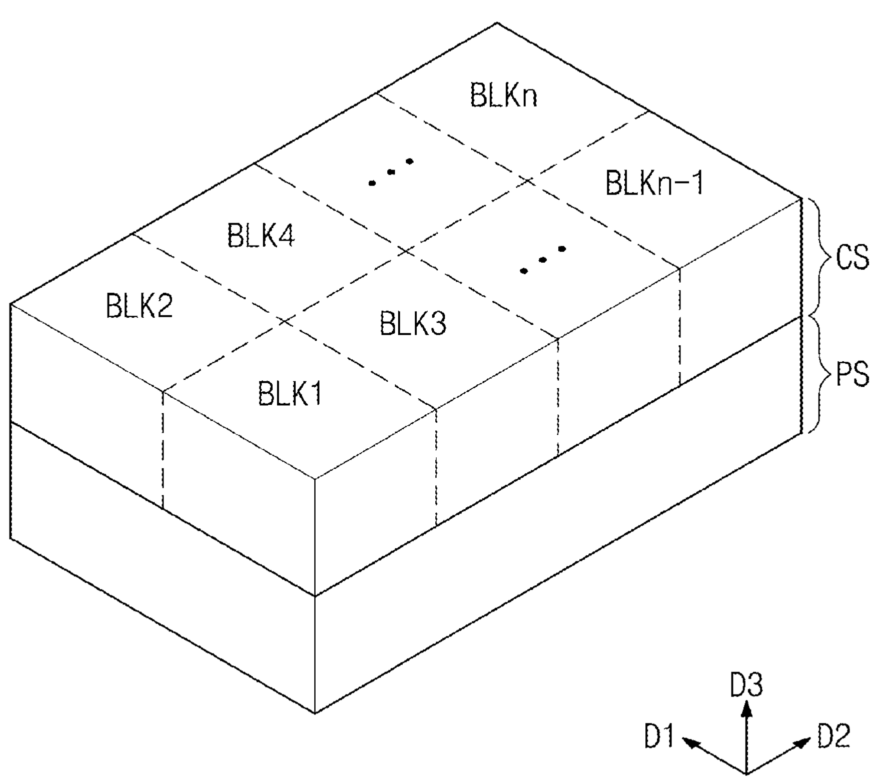
FIG. 1E is a block diagram illustrating a three-dimensional semiconductor memory device according to an embodiment.

FIG. 1E is a block diagram illustrating a three-dimensional semiconductor memory device according to an embodiment.

Referring to FIG. 1E, a three-dimensional semiconductor memory device may include a peripheral logic structure PS, a cell array structure CS on the peripheral logic structure PS, and an interconnection structure connecting the cell array structure CS to the peripheral logic structure PS. The three-dimensional semiconductor memory device of FIG. 1E may correspond to the semiconductor device 1100 of FIG. 1A. The peripheral logic structure PS may correspond to the first structure 1100F of FIG. 1A and may include row and column decoder circuits, a page buffer circuit, and control circuits. The cell array structure CS may correspond to the second structure 1100S of FIG. 1A and may include a plurality of memory blocks BLK1-BLKn, each of which may be configured to independently perform an erase operation. The memory blocks BLK1-BLKn may be two-dimensionally arranged in a first direction D1 and a second direction D2. For example, odd-numbered memory blocks BLK1, BLK3, . . . , and BLKn−1 may be arranged in the second direction D2 to form a first column. Even-numbered memory blocks BLK2, BLK4, . . . , and BLKn may be provided to be spaced apart from the odd-numbered memory blocks BLK1, BLK3, . . . , and BLKn−1, respectively, in the first direction D1. The even-numbered memory blocks BLK2, BLK4, . . . , and BLKn may be arranged in the second direction D2 to form a second column. Each of the memory blocks BLK1-BLKn may include a memory cell array having a three-dimensional or vertical structure. Each of the memory blocks BLK1-BLKn may have half of the existing memory capacity. For example, each of the memory blocks BLK1-BLKn may have a memory capacity of 8 KB. This arrangement may reduce an area, which is occupied by a repair memory block or a spare memory block. Accordingly, it may be possible to reduce a size of a semiconductor memory chip.

Figure 2:
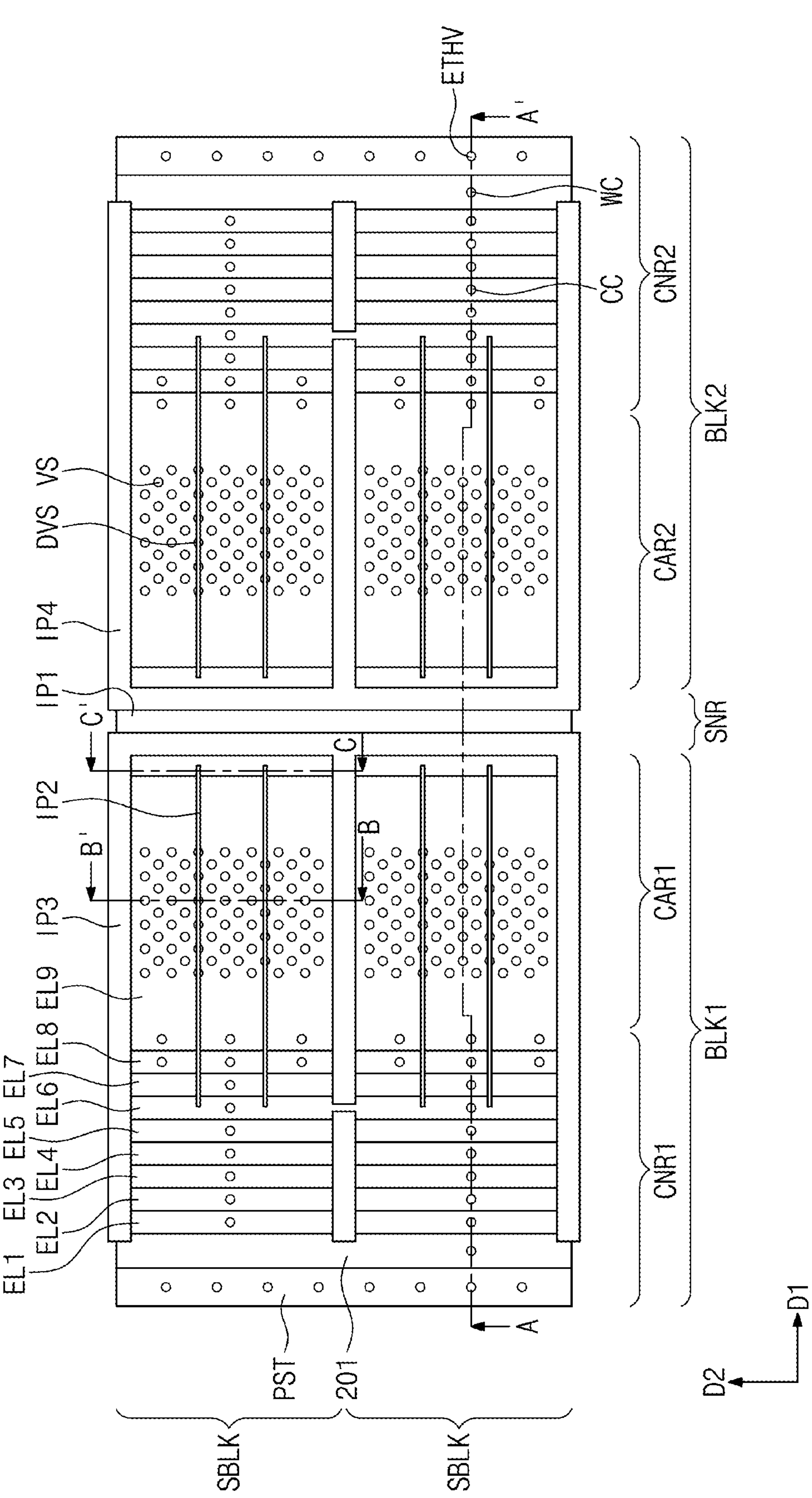
FIG. 2 is a plan view illustrating a three-dimensional semiconductor memory device according to an embodiment.
Figure 3A:
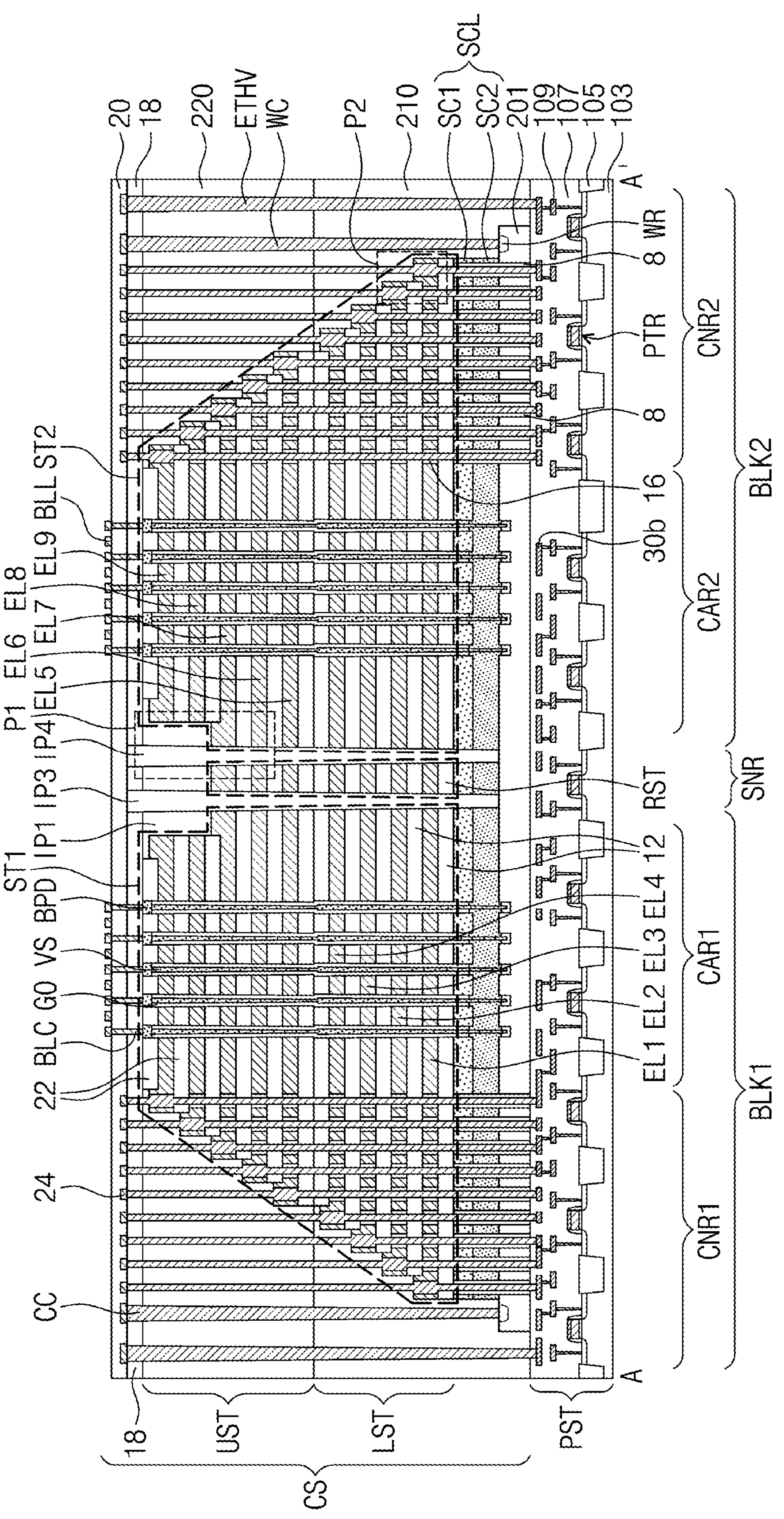
FIG. 3A is a sectional view taken along line A-A' of FIG. 2.
Figure 3B:
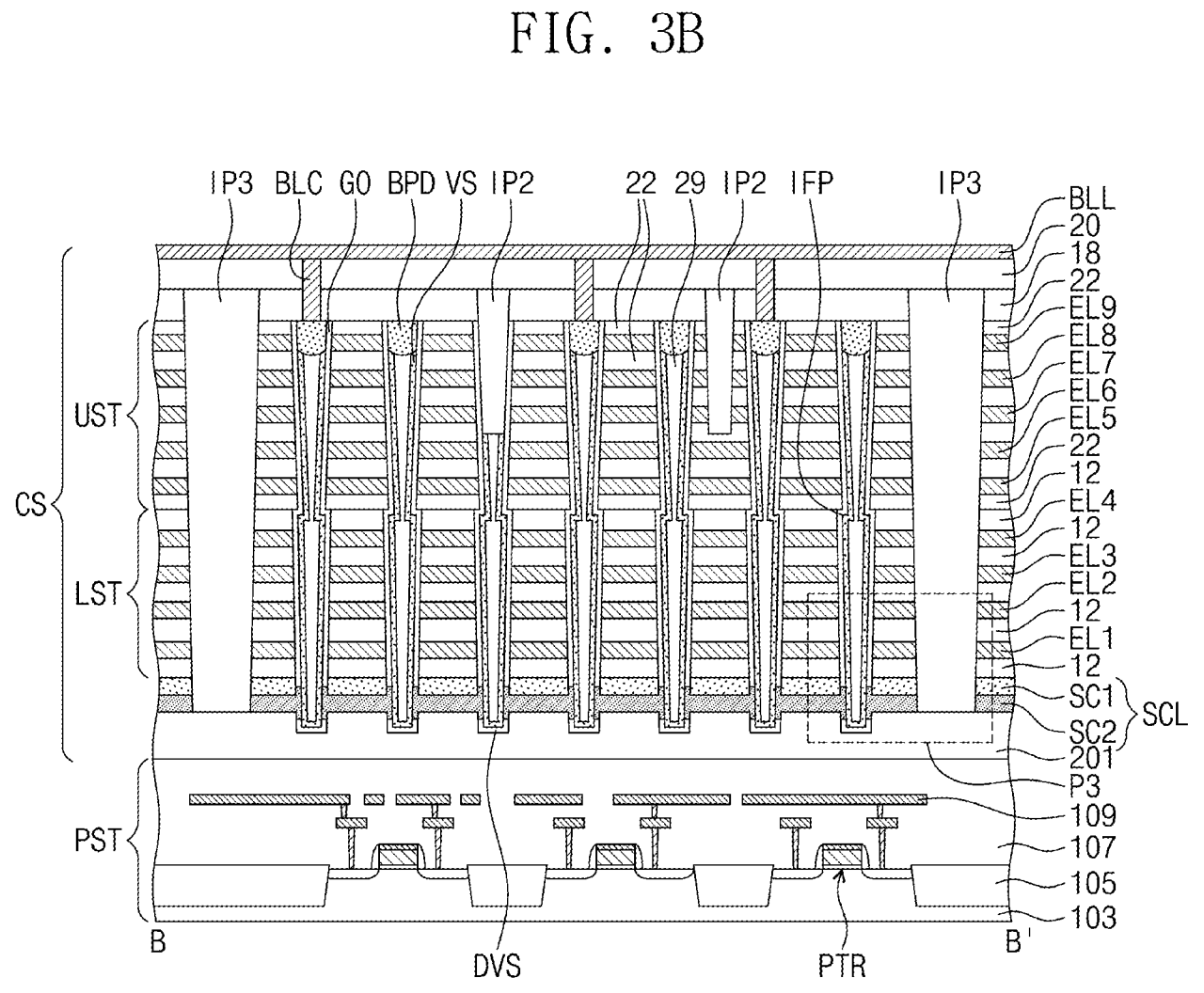
Figure 3C:
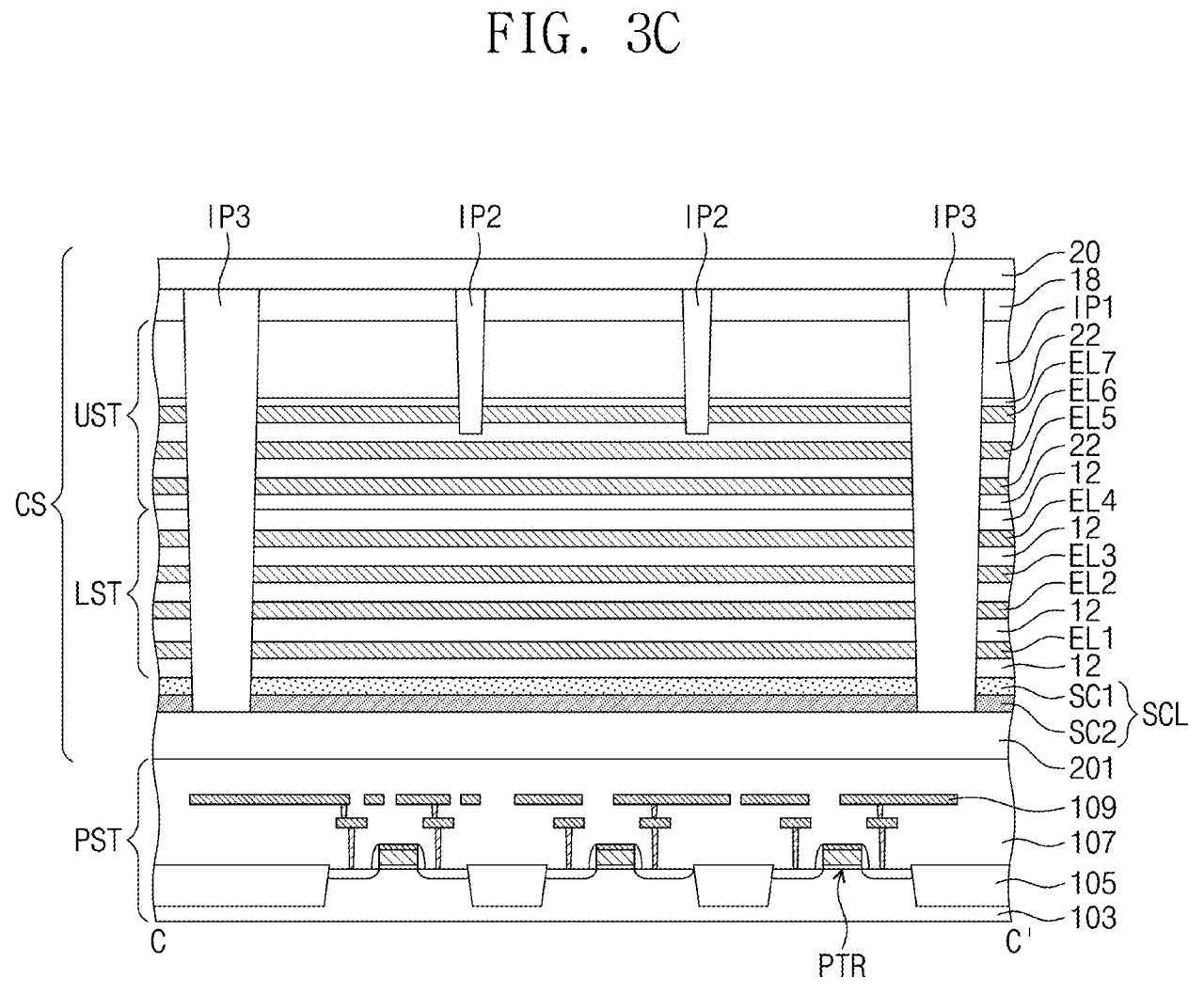
Figure 4A:
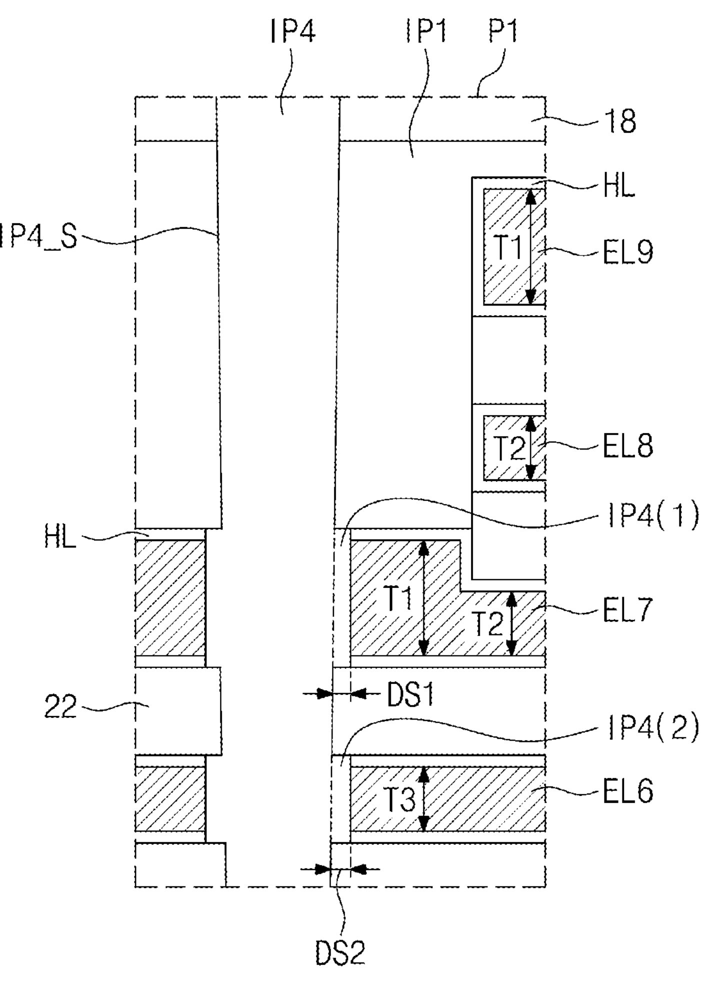
FIG. 4A is an enlarged sectional view illustrating portion 'P1' of FIG. 3A.
Figure 4B:
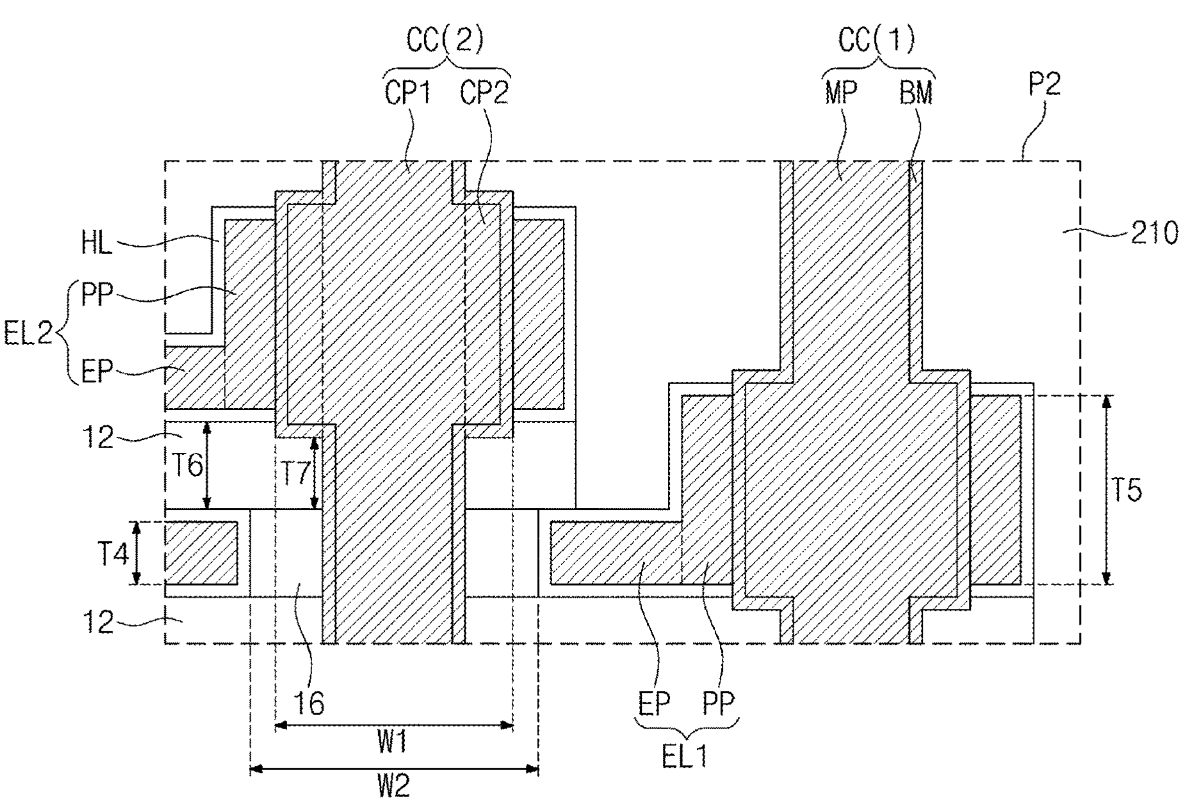
FIG. 4B is an enlarged sectional view illustrating portion 'P2' of FIG. 3A.
Figure 4C:
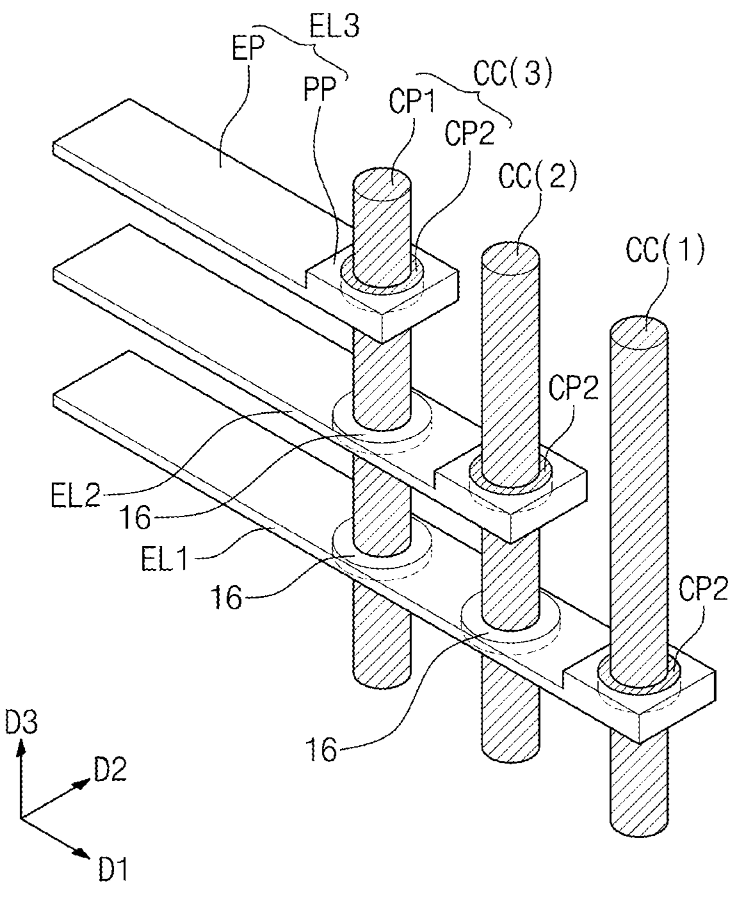
FIG. 4C is a perspective view illustrating a portion of the three-dimensional semiconductor memory device of FIG. 3A.
Figure 4D:
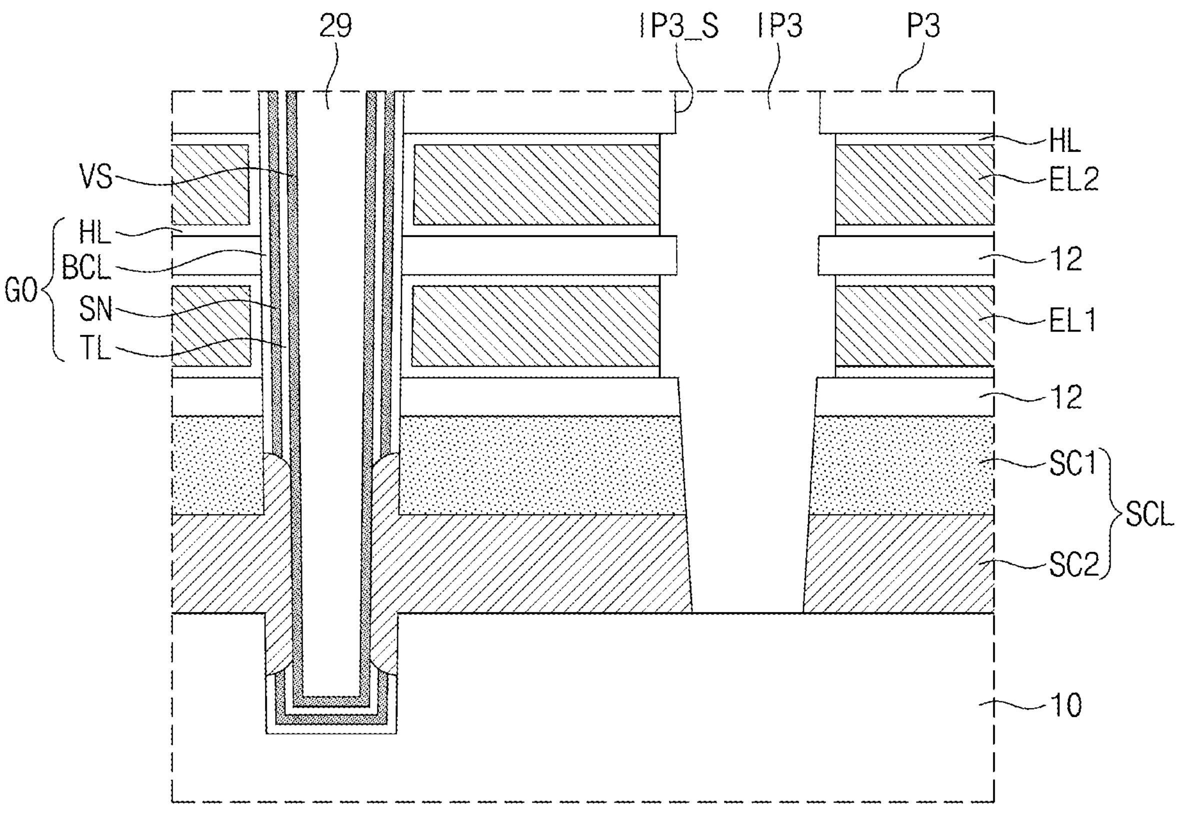
FIG. 4D is an enlarged sectional view illustrating portion 'P3' of FIG. 3B.

FIG. 2 is a plan view illustrating a three-dimensional semiconductor memory device according to an embodiment. FIG. 3A is a cross-sectional view taken along line A-A' of FIG. 2. FIG. 3B is a cross-sectional view taken along line B-B' of FIG. 2. FIG. 3C is a cross-sectional view taken along line C-C' of FIG. 2. FIG. 4A is an enlarged cross-sectional view illustrating portion 'P1' of FIG. 3A. FIG. 4B is an enlarged cross-sectional view illustrating portion 'P2' of FIG. 3A. FIG. 4C is a perspective view illustrating a portion of the three-dimensional semiconductor memory device of FIG. 3A. FIG. 4D is an enlarged cross-sectional view illustrating portion 'P3' of FIG. 3B.

Referring to FIGS. 2, 3A to 3C, and 4A to 4D, the cell array structure CS may be disposed on a peripheral circuit structure PST. The peripheral circuit structure PST may include a first substrate 103. The first substrate 103 may be, e.g., a single crystalline silicon substrate or a silicon-on-insulator (SOI) substrate. A device isolation layer 105 may be disposed in the first substrate 103 to delimit active regions. Peripheral transistors PTR may be disposed on the active regions. Each of the peripheral transistors PTR may include a peripheral gate electrode, a peripheral gate insulating layer, and peripheral source/drain regions, which are formed in the first substrate 103 and at both sides of the peripheral gate electrode. The peripheral transistors PTR may be covered with a peripheral interlayer insulating layer 107. The peripheral interlayer insulating layer 107 may include at least one of, e.g., a silicon oxide layer, a silicon nitride layer, a silicon oxynitride layer, and a porous insulating layer, and may have a single or multi-layered structure. Peripheral lines 109 may be disposed in the peripheral interlayer insulating layer 107. The peripheral lines 109 may be formed of or include at least one of conductive materials.

Some of the peripheral lines 109 may be electrically connected to the peripheral transistors PTR. The peripheral lines 109 and the peripheral transistors PTR may constitute the page buffer circuit 1120 and the decoder circuit 1110 of FIG. 1A. The peripheral circuit structure PST may include peripheral conductive pads 30*b* provided in an upper portion of the peripheral interlayer insulating layer 107.

The cell array structure CS may include a second substrate 201. For example, the second substrate 201 may be, e.g., a single-crystalline silicon layer, a silicon epitaxial layer, or an SOI substrate. In an embodiment, the second substrate 201 may be doped with an impurity of a first conductivity type. For example, the impurity may be boron, and the first conductivity type may be p-type. In another example, the impurity may be arsenic or phosphorus, and the first conductivity type may be n-type.

The second substrate 201 may include a first memory block region BLK1, a separation region SNR, and a second memory block region BLK2, which are sequentially arranged in the first direction D1. The first memory block region BLK1 may include a first connection region CNR1 and a first cell region CAR1, which are sequentially arranged in the first direction D1. The second memory block region BLK2 may include a second cell region CAR2 and a second connection region CNR2, which are sequentially arranged in the first direction D1.

A source structure SCL may be disposed on the second substrate 201. The source structure SCL may include a first source pattern SC1, which is interposed between the lowermost electrode interlayer insulating layer 12 and the second substrate 201, and a second source pattern SC2, which is interposed between the first source pattern SC1 and the second substrate 201. The first source pattern SC1 may include a doped semiconductor pattern (e.g., a doped polysilicon pattern of the first conductivity type). The second source pattern SC2 may include a doped semiconductor pattern (e.g., a doped polysilicon pattern). The second source pattern SC2 may further include a semiconductor material that is different from the first source pattern SC1. The second source pattern SC2 may have the same conductivity type as the first source pattern SC1. A doping concentration of the second source pattern SC2 may be equal to or different from that of the first source pattern SC1. The source structure SCL may correspond to the common source line CSL of FIG. 1A. In addition, the second substrate 201 may serve as the common source line CSL of FIG. 1A.

In the first and second connection regions CNR1 and CNR2, a substrate insulating pattern 8 may be provided to penetrate the source structure SCL and the second substrate 201, and to be in contact with the peripheral interlayer insulating layer 107. The substrate insulating pattern 8 may have a single- or multi-layered structure including at least one of, e.g., silicon oxide, silicon nitride, or silicon oxynitride.

On the first memory block region BLK1, a first stack structure ST1 may be disposed on the source structure SCL. On the second memory block region BLK2, a second stack structure ST2 may be disposed on the source structure SCL. The first stack structure ST1 may be referred to as a 'first sub-stack structure ST1'. The second stack structure ST2 may be referred to as a 'second sub-stack structure ST2'.

Each of the first and second stack structures ST1 and ST2 may include a lower stack structure LST and an upper stack structure UST disposed thereon (the first and second stack structures ST1 and ST2 are indicated with a dashed line in FIG. 3A). The lower stack structure LST may include first to fourth electrode layers EL1-EL4 and first electrode interlayer insulating layers 12, which are alternately stacked. The upper stack structure UST may include fifth to ninth electrode layers EL5-EL9 and second electrode interlayer insulating layers 22, which are alternately stacked.

End portions of the first to ninth electrode layers EL1-EL9 may form a stepwise shape on each of the first and second connection regions CNR1 and CNR2. The first and second stack structures ST1 and ST2 may be provided to have a symmetric shape with each other. A remaining stack structure RST may be disposed between the first and second stack structures ST1 and ST2. The remaining stack structure RST may be placed on the separation region SNR. The remaining stack structure RST may include the first to fourth electrode layers EL1-EL4, the first electrode interlayer insulating layers 12, the fifth to seventh electrode layers EL5-EL7, and the second electrode interlayer insulating layers 22, which are alternately stacked.

A third insulating line pattern IP3 may be interposed between the first stack structure ST1 and the remaining stack structure RST. A fourth insulating line pattern IP4 may be interposed between the second stack structure ST2 and the remaining stack structure RST. For example, the third and fourth insulating line patterns IP3 and IP4 may be provided to extend along the entire height of the cell array structure CS in the vertical direction, to penetrate the source structure SCL, and to be in contact with the second substrate 201. The third and fourth insulating line patterns IP3 and IP4 may extend in the second direction D2, as shown in FIG. 2, to separate the first memory block region BLK1 from the second memory block region BLK2. For example, as illustrated in FIG. 2, each of the third and fourth insulating line patterns IP3 and IP4 may be III-shaped in a top view, such that three parallel portions of each of the third and fourth insulating line patterns IP3 and IP4 extend in the first direction D1, while being spaced apart from each other, and one portion of each of the third and fourth insulating line patterns IP3 and IP4 extends in the second direction D2 to connect the three parallel portions. For example, as illustrated in FIG. 2, one memory block region BLK may be defined between every two of the three parallel portions.

As shown in FIG. 2, the third insulating line pattern IP3 near the first memory block region BLK1 may extend in an opposite direction of the first direction D1 to separate the first memory block region BLK1 from the third memory block BLK3 shown in FIG. 1E. In addition, as show in FIG. 2, the third insulating line pattern IP3 at a center of the first memory block region BLK1 may extend in the opposite direction of the first direction D1 to divide the first memory block region BLK1 into two sub-block regions SBLK. The third insulating line pattern IP3, which is provided between the two sub-block regions SBLK, may be cut in the first connection region CNR1 (e.g., on the sixth electrode layer EL6 of FIG. 2) and may be divided into two portions.

As show in FIG. 2, the fourth insulating line pattern IP4 near the second memory block region BLK2 may extend in the first direction D1 to separate the second memory block region BLK2 from the fourth memory block region BLK4 shown in FIG. 1E. As shown in FIG. 2, at a center of the second memory block region BLK2, the fourth insulating line pattern IP4 may extend in the first direction D1 to divide the second memory block region BLK2 into two sub-block regions SBLK. The fourth insulating line pattern IP4, which is provided between the two sub-block regions SBLK, may be cut in the second connection region CNR2 (e.g., on the sixth electrode layer EL6 of FIG. 2) and may be divided into two portions.

An end portion of the lower stack structure LST may be covered with a first planarization insulating layer 210. An end portion of the upper stack structure UST and the first planarization insulating layer 210 may be covered with a second planarization insulating layer 220. The upper stack structure UST and the second planarization insulating layer 220 may be covered with a first upper interlayer insulating layer 18.

The lowermost electrode layer (i.e., the first electrode layer EL1) may correspond to the first gate lower line LL1 of FIG. 1A (i.e., the gate electrode of the lower erase control transistor LT1). A second electrode layer EL2, which is placed on the first electrode layer EL1, may correspond to the second gate lower line LL2 of FIG. 1A (i.e., the gate electrode of the ground selection transistor LT2). For example, each of the first and second gate lower lines LL1 and LL2 may have a single-layered structure or a plurality of layers.

The uppermost electrode layer (i.e., the ninth electrode layer EL9) may correspond to the second gate upper line UL2 of FIG. 1A (i.e., the gate electrode of the upper erase control transistor UT2). An eighth electrode layer EL8, which is placed below the ninth electrode layer EL9, may correspond to the first gate upper line UL1 of FIG. 1A (i.e., the gate electrode of the string selection transistor UT1). For example, the second and first gate upper lines UL2 and UL1 may have a single-layered structure or a plurality of layers.

The remaining electrode layers EL3-EL7 may correspond to the word lines WL of FIG. 1A. At least one of the remaining electrode layers EL3-EL7 may be a dummy word line, which is not used for actual operations of the semiconductor memory device.

The electrode layers EL1-EL9 may be formed of or include at least one of, e.g., doped semiconductor materials (e.g., doped silicon), metallic materials (e.g., tungsten, copper, or aluminum), conductive metal nitrides (e.g., titanium nitride or tantalum nitride), or transition metals (e.g., titanium or tantalum). The electrode interlayer insulating layers 12 and 22 may have a single- or multi-layered structure including at least one of, e.g., a silicon oxide layer, a silicon nitride layer, a silicon oxynitride layer, or a porous insulating layer.

As shown in the cross-sectional view of FIG. 3A, a first insulating line pattern IP1 may penetrate the ninth electrode layer EL9 and the eighth electrode layer EL8, e.g., the first insulating line pattern IP1 may not penetrate the seventh electrode layer EL7. The first insulating line pattern IP1 may penetrate the second electrode interlayer insulating layer 22 between the ninth electrode layer EL9 and the eighth electrode layer EL8. The first insulating line pattern IP1 may have a line shape extending in the second direction D2, as shown in the plan view of FIG. 2, e.g., the first insulating line pattern IP1 may extend along the entire width of the cell array structure CS in the second direction D2 between upper portions of the first and second stack structures ST1 and ST2. The first insulating line pattern IP1 may be pierced, e.g., vertically penetrated, by the third and fourth insulating line patterns IP3 and IP4.

Referring to FIGS. 2 and 3B, two second insulating line patterns IP2 may be disposed in each of the sub-block regions SBLK. The second insulating line patterns IP2 may extend in the first direction D1. In the sub-block regions SBLK, the second insulating line patterns IP2 may be provided to penetrate the seventh to ninth electrode layers EL7-EL9 and to divide the seventh to ninth electrode layers EL7-EL9 into conductive lines. End portions of the second insulating line patterns IP2 (in the first direction D1) may be inserted into the first insulating line pattern IP1 (FIG. 3C). The second insulating line patterns IP2 may have bottom surfaces, which are located at a level lower than a bottom surface of the first insulating line pattern IP1, as shown in FIG. 3C. Each of the first to fourth insulating line patterns IP1-IP4 may be independently formed of or include at least one of, e.g., silicon oxide, silicon nitride, and silicon oxynitride, and may have a single- or multi-layered structure. The third and fourth insulating line patterns IP3 and IP4 may be formed of or include the same material.

Referring to FIGS. 3A and 4A, portions of the fourth insulating line pattern IP4 may protrude toward the first to seventh electrode layers EL1-EL7, and may be interposed between adjacent ones of the electrode interlayer insulating layers 12 and 22. A side surface of a first portion IP4(1) of the fourth insulating line pattern IP4 may protrude from a side surface of the second electrode interlayer insulating layer 22 toward the seventh electrode layer EL7 by a first distance DS1, e.g., a top surface of the first portion IP4(1) of the fourth insulating line pattern IP4 may contact and vertically overlap a bottom of the first insulating line pattern IP1 and a top of the second electrode interlayer insulating layer 22. A side surface of a second portion IP4(2) of the fourth insulating line pattern IP4 may protrude from the side surface of the second electrode interlayer insulating layer 22 toward the sixth electrode layer EL6 by a second distance DS2, e.g., a top surface of the second portion IP4(2) of the fourth insulating line pattern IP4 may contact and vertically overlap a bottom of the second electrode interlayer insulating layer 22 and a top of the second electrode interlayer insulating layer 22 thereunder. The second distance DS2 may be larger than the first distance DS1.

A side surface IP4_S of the fourth insulating line pattern IP4 may have an uneven or concave-convex structure, e.g., the fourth insulating line pattern IP4 may fill a space where the electrode interlayer insulating layers 22 protrude horizontally beyond the electrode layers EL6-EL7 to have an alternating step profile. A side surface of the third insulating line pattern IP3 may also have an uneven or concave-convex structure, e.g., repeating and alternating concave-convex step structure. The seventh electrode layer EL7 may have a first thickness T1 in the vertical direction, below the first insulating line pattern IP1. The seventh electrode layer EL7 may have a second thickness T2 in the vertical direction between vertically adjacent second electrode interlayer insulating layers 22. The first thickness T1 may be larger than the second thickness T2. The sixth electrode layer EL6 below the seventh electrode layer EL7 may have a third thickness T3, below the first insulating line pattern IP1. The first thickness T1 may be larger than the third thickness T3. The third thickness T3 may equal the second thickness T2.

The uppermost electrode layer (i.e., the ninth electrode layer EL9) may have the first thickness T1 near the first insulating line pattern IP1. A portion of the first insulating line pattern IP1 may extend to a region on the ninth electrode layer EL9. The eighth electrode layer EL8 may have the second thickness T2 near the first insulating line pattern IP1. Near the separation region SNR, a side surface of the ninth electrode layer EL9 may be aligned with a side surface of the eighth electrode layer EL8.

In the cell regions CAR1 and CAR2 of each sub-block region SBLK, the electrode interlayer insulating layers 12 and 22 and the electrode layers EL1-EL9 may be pierced, e.g., penetrated, by vertical semiconductor patterns VS and dummy vertical semiconductor patterns DVS. The dummy vertical semiconductor patterns DVS may be located between the vertical semiconductor patterns VS. In a center portion of each sub-block region SBLK, the dummy vertical semiconductor patterns DVS may be arranged in the first direction D1 to form a column, as shown in FIG. 2.

Referring to FIGS. 3A and 4D, a gate insulating layer GO may be interposed between the electrode layers EL1-EL9 and the vertical semiconductor patterns VS and between the electrode layers EL1-EL9 and the dummy vertical semiconductor patterns DVS. Each of the vertical semiconductor patterns VS and the dummy vertical semiconductor patterns DVS may have a hollow cup shape. In an embodiment, the vertical semiconductor patterns VS and the dummy vertical semiconductor patterns DVS may include doped or undoped single-crystalline silicon layer or a poly-silicon layer. Referring to FIG. 3A, a side surface of the vertical semiconductor pattern VS may have an inflection point IFP near an interface between the lower and upper stack structures LST and UST.

An insulating gapfill pattern 29 may be provided to fill an inner space of each of the vertical semiconductor patterns VS and the dummy vertical semiconductor patterns DVS. The insulating gapfill pattern 29 may have a single- or multi-layered structure including at least one of, e.g., a silicon oxide layer, a silicon nitride layer, or a silicon oxynitride layer. Bit line pads BPD may be disposed on the vertical semiconductor patterns VS and the dummy vertical semiconductor patterns DVS, respectively. The bit line pad BPD may be formed of or include at least one of doped polysilicon or metallic materials (e.g., tungsten, aluminum, and copper).

Referring to FIG. 4D, the gate insulating layer GO may include a tunnel insulating layer TL, a charge storing layer SN, and a blocking insulating layer BCL. The charge storing layer SN may be a trap insulating layer, a floating gate electrode, or an insulating layer including conductive nanodots. In detail, the charge storing layer SN may include at least one of a silicon nitride layer, a silicon oxynitride layer, a silicon-rich nitride layer, a nanocrystalline silicon layer, or a laminated trap layer. The tunnel insulating layer TL may be formed of or include one of materials having a band gap larger than the charge storing layer SN, and the blocking insulating layer BCL may be a high-k dielectric layer (e.g., an aluminum oxide layer and a hafnium oxide layer).

The gate insulating layer GO may further include a high-k dielectric layer HL. The high-k dielectric layer HL may be interposed between the blocking insulating layer BCL and the electrode layers EL1-EL9. The high-k dielectric layer HL may be interposed between the electrode layers EL1-EL9 and the electrode interlayer insulating layers 12 and 22. The high-k dielectric layer HL may be interposed between a side surface of the first insulating line pattern IP1 and the eighth and ninth electrode layers EL8 and EL9, as shown in FIG. 4A. The high-k dielectric layer HL may be interposed between a bottom surface of the first insulating line pattern IP1 and the seventh electrode layer EL7, as shown in FIG. 4A. The high-k dielectric layer HL may have a dielectric constant higher than the silicon oxide layer and may include a metal oxide layer (e.g., a hafnium oxide layer and an aluminum oxide layer). The gate insulating layer GO may be divided into two portions by the second source pattern SC2. A portion of the third insulating line pattern IP3 may protrude toward the electrode layers EL1-EL9 and may be interposed between adjacent ones of the electrode interlayer insulating layers 12 and 22. A side surface IP3_S of the third insulating line pattern IP3 may have an uneven structure, e.g., the third insulating line pattern IP3 may fill a space where the electrode interlayer insulating layers 12 protrude horizontally beyond the electrode layers EL1-EL4 to have an alternating step profile.

Referring to FIGS. 3A, 4B, and 4C, each of the electrode layers EL1-EL9 may have an electrode portion EP and a pad portion PP. The electrode portion EP may overlap the first and second cell regions CAR1 and CAR2 and may extend in the first direction D1. The electrode portion EP may have a fourth thickness T4. The pad portion PP may correspond to each of the end portions of the electrode layers EL1-EL9. The pad portion PP may have a fifth thickness T5 larger than the fourth thickness T4. The pad portions PP of the electrode layers EL1-EL9 may be provided to form a stepwise shape. The fourth thickness T4 of FIG. 4B may be equal to the second thickness T2 of FIG. 4A. The fifth thickness T5 of FIG. 4B may be equal to the first thickness T1 of FIG. 4A.

Each of the pad portions PP of the electrode layers EL1-EL9 may be connected to cell contacts CC. Each of the pad portions PP of the electrode layers EL1-EL9 may be pierced by the cell contacts CC. When viewed in a cross-sectional view, the cell contacts CC may include a main contact portion MP and a diffusion barrier layer BM covering the same. The main contact portion MP may be formed of or include at least one of metallic materials (e.g., tungsten, copper, and aluminum). The diffusion barrier layer BM may be formed of or include at least one of, e.g., titanium, titanium nitride, tantalum, or tantalum nitride. In terms of their shape, each of the cell contacts CC may have a pillar portion CP1, which extends from a top surface of the second substrate 201 in a vertical direction (e.g., a third direction D3), and a connecting portion CP2, which protrudes laterally from a side surface of the pillar portion CP1. The pillar portion CP1 may be circular, when viewed in a plan view. The connecting portion CP2 may have a doughnut shape, when viewed in a plan view. Each of the connecting portions CP2 of the cell contacts CC may have a first width W1.

The connecting portions CP2 of the cell contacts CC may be in contact with the pad portions PP of the electrode layers EL1-EL9, respectively. The pillar portions CP1 of the cell contacts CC may be provided to penetrate the electrode portion EP of other electrode layers EL1-EL9, which are placed below the pad portions PP. In detail, referring to FIG. 4B, the connecting portion CP2 of a second cell contact CC(2) may be in contact with the pad portion PP of the second electrode layer EL2. The connecting portion CP2 of a first cell contact CC(1) may be in contact with the pad portion PP of the first electrode layer ELL The pillar portion CP1 of the second cell contact CC(2) may be provided to penetrate the electrode portion EP of the first electrode layer EL1 below the second electrode layer EL2. A contact insulating pattern 16 may be interposed between the pillar portion CP1 of the second cell contact CC(2) and the electrode portion EP of the first electrode layer EL1.

The pillar portions CP1 of the cell contacts CC may be provided to penetrate the electrode interlayer insulating layers 12, the substrate insulating pattern 8, and a portion of the peripheral interlayer insulating layer 107 and may be connected to the peripheral conductive pads 30*b*. The contact insulating patterns 16 may be respectively interposed between the pillar portions CP1 of the cell contacts CC and the electrode portions EP of the electrode layers EL1-EL9. In an embodiment, the contact insulating patterns 16 may be formed of or include, e.g., silicon oxide. When viewed in a plan view, each of the contact insulating patterns 16 may have a doughnut shape. Each of the contact insulating patterns 16 may have a second width W2 larger than the first width W1.

The connecting portions CP2 of the cell contacts CC may not overlap the electrode portions EP of the electrode layers EL1-EL9. The connecting portions CP2 of the cell contacts CC may vertically overlap the contact insulating patterns 16. The high-k dielectric layer HL may cover side surfaces of the contact insulating patterns 16. The high-k dielectric layer HL may be in contact with the diffusion barrier layer BM at a position of the connecting portions CP2 of the cell contacts CC. The diffusion barrier layer BM of the cell contact CC may be interposed between the main contact portion MP, which corresponds to the connecting portion CP2 of the cell contact CC, and the pad portion PP of an electrode layer EL. A topmost surface of the connecting portion CP2 of the cell contact CC may be higher than a topmost surface of the high-k dielectric layer HL adjacent thereto, e.g., relative to the bottom of the second substrate 201. A bottommost surface of the connecting portion CP2 of the cell contact CC may be lower than a bottommost surface of the high-k dielectric layer HL adjacent thereto, e.g., relative to the bottom of the second substrate 201. The electrode interlayer insulating layers 12 and 22 may have a sixth thickness T6 between the electrode layers EL1-EL9. The electrode interlayer insulating layers 12 and 22 may have a seventh thickness T7, which is smaller than the sixth thickness T6, between the connecting portion CP2 of the cell contact CC and the contact insulating pattern 16.

In the three-dimensional semiconductor memory device according to an embodiment, the thicknesses of the electrode interlayer insulating layers 12 and 22 may be maintained to the sixth thickness T6, between the electrode layers EL1-EL9. In addition, a distance from the connecting portions CP2 of the cell contacts CC to the electrode layers EL1-EL9 adjacent thereto may be maintained to a value that is equal to or larger than the sixth thickness T6. Thus, during the operation of the three-dimensional semiconductor memory device, it may be possible to reduce an interference issue between the electrode layers EL1-EL9 and to prevent a breakdown voltage drop problem from occurring. Accordingly, it may be possible to prevent an operational error of a three-dimensional semiconductor memory device and to improve reliability of the three-dimensional semiconductor memory device.

Referring back to FIGS. 3A to 3C, the third and fourth insulating line patterns IP3 and IP4 may be provided to penetrate the first upper interlayer insulating layer 18. The cell contacts CC may also be provided to penetrate the first upper interlayer insulating layer 18. A second upper interlayer insulating layer 20 may be disposed on the first upper interlayer insulating layer 18. First conductive lines BLL, which extend in the second direction D2 and are parallel to each other, may be disposed on the second upper interlayer insulating layer 20. The first conductive lines BLL may correspond to the bit lines BL of FIG. 1A. First contacts BLC may be provided on the cell regions CAR1 and CAR2 to penetrate the first and second upper interlayer insulating layers 18 and 20 and to connect the bit line pads BPD, which are disposed on the vertical semiconductor patterns VS, to one of the first conductive lines BLL.

Referring to FIG. 3A, edge penetration vias ETHV may be provided on the connection regions CNR1 and CNR2 to penetrate the first upper interlayer insulating layer 18, the planarization insulating layers 210 and 220, the second substrate 201, and a portion of the peripheral interlayer insulating layer 107, and to be in contact with respective ones of the peripheral conductive pads 30*b*. The edge penetration vias ETHV may be formed of or include at least one of metallic materials (e.g., tungsten, aluminum, copper, titanium, and tantalum).

Referring to FIG. 3A, a substrate ground region WR may be disposed in a portion of the second substrate 201 spaced apart from the edge penetration vias ETHV. The substrate ground region WR may be doped to have the same conductivity type (i.e., the first conductivity type) as the second substrate 201 and to have a higher doping concentration than that in the second substrate 201. In the connection regions CNR1 and CNR2, a substrate connection contact WC may be provided to penetrate the first upper interlayer insulating layer 18 and the planarization insulating layers 210 and 220, and to be in contact with the substrate ground region WR. Second conductive lines 24 may be disposed on the first upper interlayer insulating layer 18. The second conductive lines 24 may be in contact with the cell contacts CC, the edge penetration vias ETHV, and the substrate connection contact WC.

In the three-dimensional semiconductor memory device according to an embodiment, the first, third, and fourth insulating line patterns IP1, IP3, and IP4 may be used to divide the cell array structure CS into the first and second memory block regions (or into the first and second sub-stack structures ST1 and ST2), and it may be possible to reduce an area of a spare memory block region. In addition, each of the memory block regions may be provided to include just one connection region, and thus, it may be possible to reduce an area occupied by the connection region. As a result, it may be possible to reduce a size of a semiconductor chip.

FIGS. 5A to 5I are plan views of stages in a process of fabricating a three-dimensional semiconductor memory device having the plan view of FIG. 2. FIGS. 6A to 6Q are cross-sectional views of stages in a process of fabricating a three-dimensional semiconductor memory device having the cross-section of FIG. 3A. FIG. 7 is a cross-sectional view of a process of fabricating a three-dimensional semiconductor memory device having the cross-section of FIG. 3B.

Figure 5A:
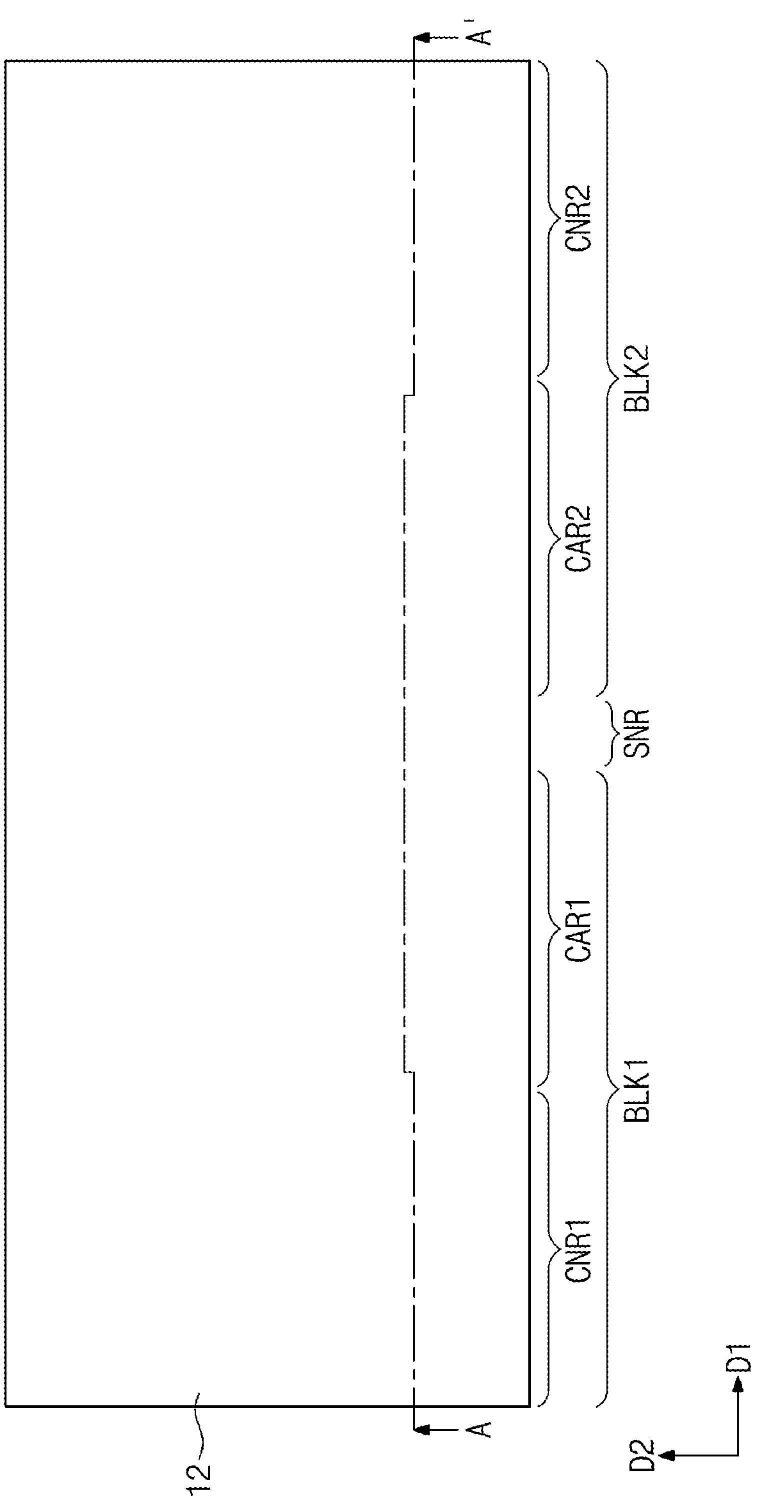
FIGS. 5A to 5I are plan views illustrating stages in a process of fabricating a three-dimensional semiconductor memory device having the plan view of FIG. 2.
Figure 6A:
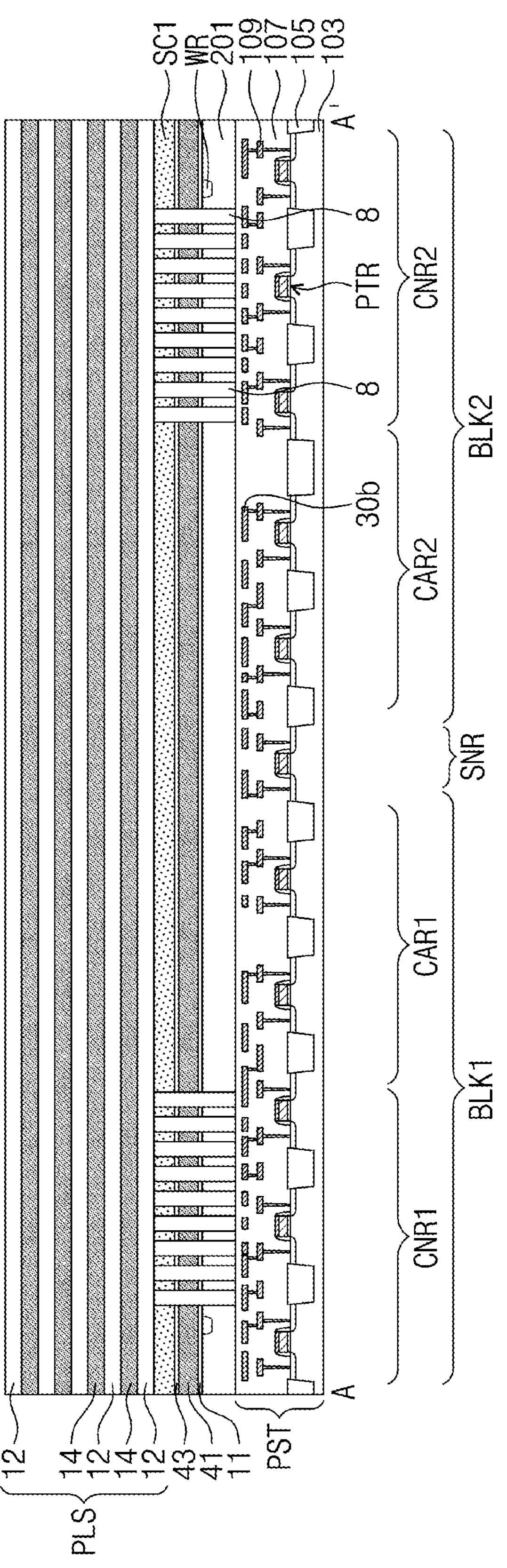
FIGS. 6A to 6Q are sectional views illustrating stages in a process of fabricating a three-dimensional semiconductor memory device having the section of FIG. 3A.
Figure 7:
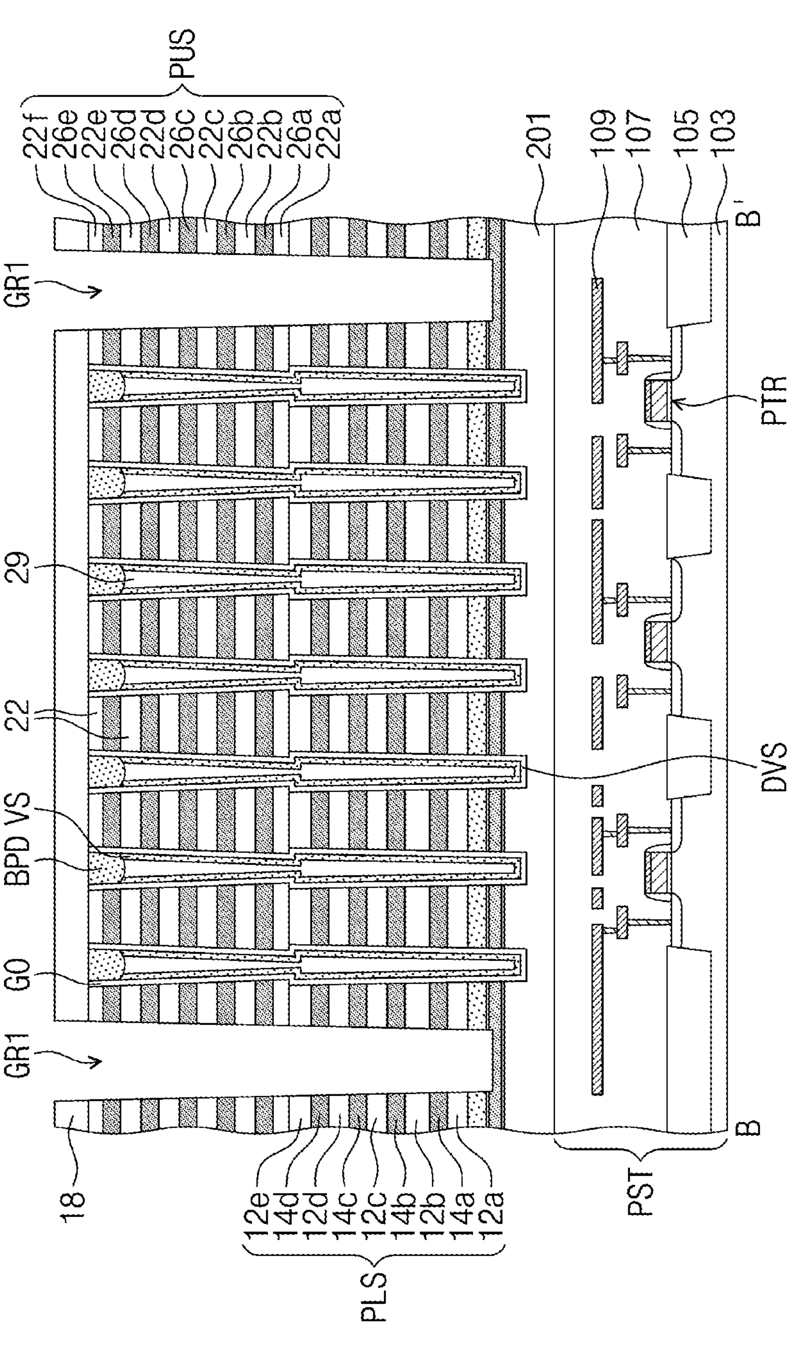
FIG. 7 is a sectional view illustrating a process of fabricating a three-dimensional semiconductor memory device having the section of FIG. 3B.

FIG. 6A is a cross-sectional view along line A-A' of FIG. 5A. Referring to FIGS. 5A and 6A, the peripheral circuit structure PST may be fabricated. In detail, the device isolation layer 105 may be formed in the first substrate 103 to delimit active regions. The peripheral transistors PTR may be formed on the active regions. The peripheral interlayer insulating layers 107 may be formed to cover the peripheral transistors PTR, and the peripheral lines 109 may be formed in the peripheral interlayer insulating layer 107. The peripheral conductive pads 30*b* may be formed in an upper portion of the peripheral interlayer insulating layer 107.

Next, the second substrate 201 may be formed on the peripheral interlayer insulating layer 107. The second substrate 201 may be formed by forming a semiconductor epitaxial layer or by attaching a single-crystalline semiconductor substrate to the peripheral interlayer insulating layer 107. The second substrate 201 may be referred to as a semiconductor layer. The second substrate 201 may be doped to have, e.g., the first conductivity type. The substrate ground region WR may be formed in the second substrate 201. The substrate ground region WR may be formed by doping the second substrate 201 with impurities of the first conductivity type and may have an impurity concentration that is higher than that of the second substrate 201. The second substrate 201 may include the cell regions CAR1 and CAR2, the connection regions CNR1 and CNR2, and the separation region SNR.

A first buffer layer 11, a first sacrificial layer 41, a second buffer layer 43, and the first source pattern SC1 may be sequentially stacked on the second substrate 201. The substrate insulating pattern 8 may penetrate the first source pattern SC1, the second buffer layer 43, the first sacrificial layer 41, the first buffer layer 11, and the second substrate 201. A preliminary lower stack structure PLS may be formed by alternately and repeatedly stacking the first electrode interlayer insulating layers 12 and second sacrificial layers 14 on the first source pattern SC1. The first source pattern SC1 may be a doped poly-silicon layer. In an embodiment, the first and second buffer layers 11 and 43 and the electrode interlayer insulating layers 12 may include, e.g., a silicon oxide layer. The first sacrificial layer 41 may be formed of or include a material having an etch selectivity with respect to all of the first and second buffer layers 16 and 18, the first electrode interlayer insulating layers 12, the first source pattern SC1, and the second sacrificial layers 14. For example, the second sacrificial layers 14 may include a silicon nitride layer. The first sacrificial layer 41 may include a silicon germanium layer or a silicon oxynitride layer. Alternatively, the first sacrificial layer 41 may be a doped poly-silicon with a doping concentration different from the first source pattern SC1.

Figure 5B:
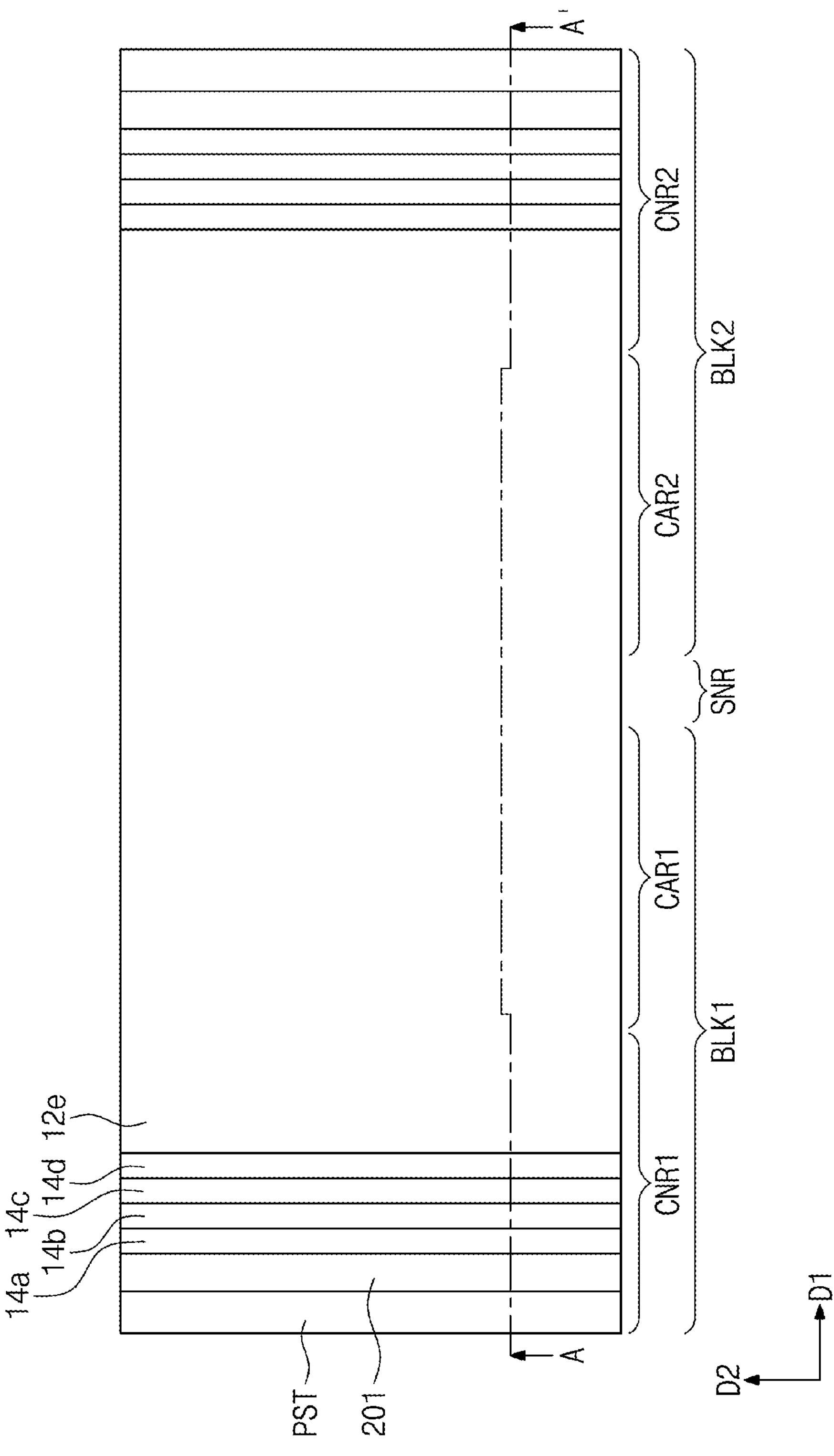
Figure 6B:
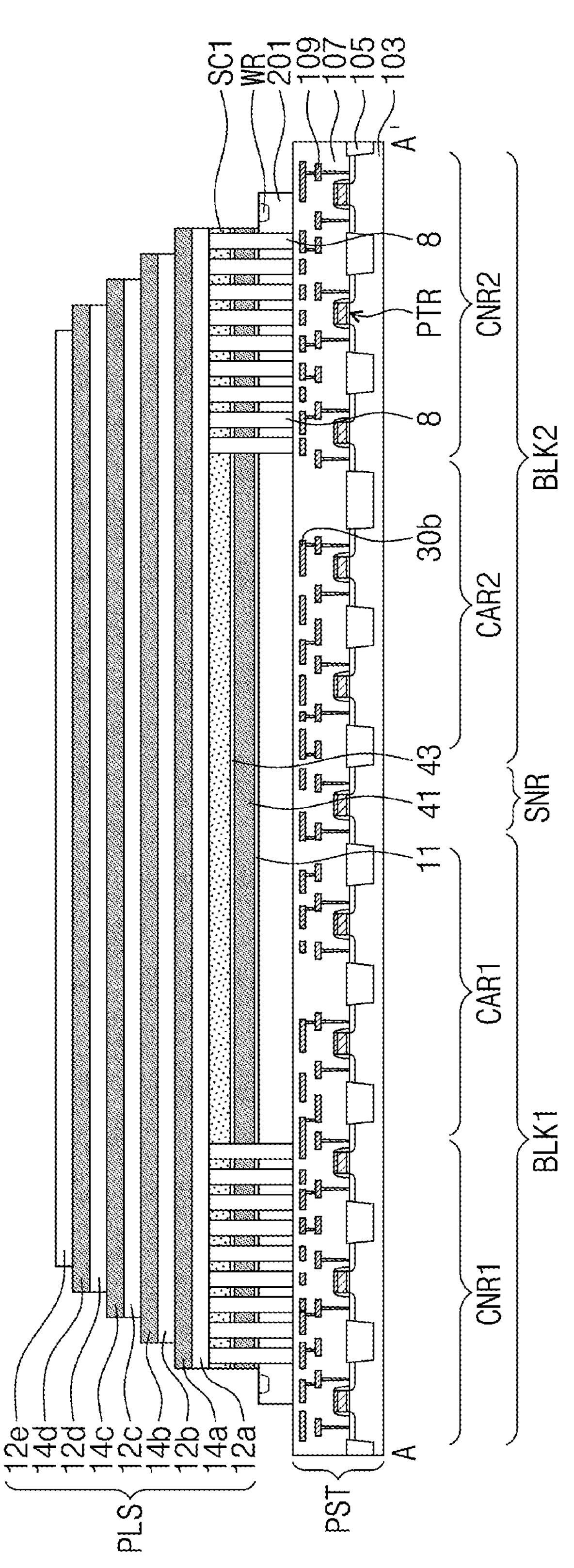

FIG. 6B is a cross-sectional view taken along line A-A' of FIG. 5B. Referring to FIGS. 5B and 6B, a trimming process and an anisotropic etching process may be repeated to form end portions of the first electrode interlayer insulating layers 12*a*-12*e* and the second sacrificial layers 14*a*-14*d*, which are located on the connection regions CNR1 and CNR2, in a stepwise shape. Here, the first buffer layer 11, the first sacrificial layer 41, the second buffer layer 43, and the first source pattern SC1 may be partially etched, and thus, a top surface of the second substrate 201 may be exposed. In addition, the second substrate 201 may also be partially etched to expose a portion of a top surface of the peripheral circuit structure PST. The end portions of the second sacrificial layers 14*a*-14*d* in the preliminary lower stack structure PLS may be exposed near the first electrode interlayer insulating layers 12*a*-12*e*.

Figure 6C:
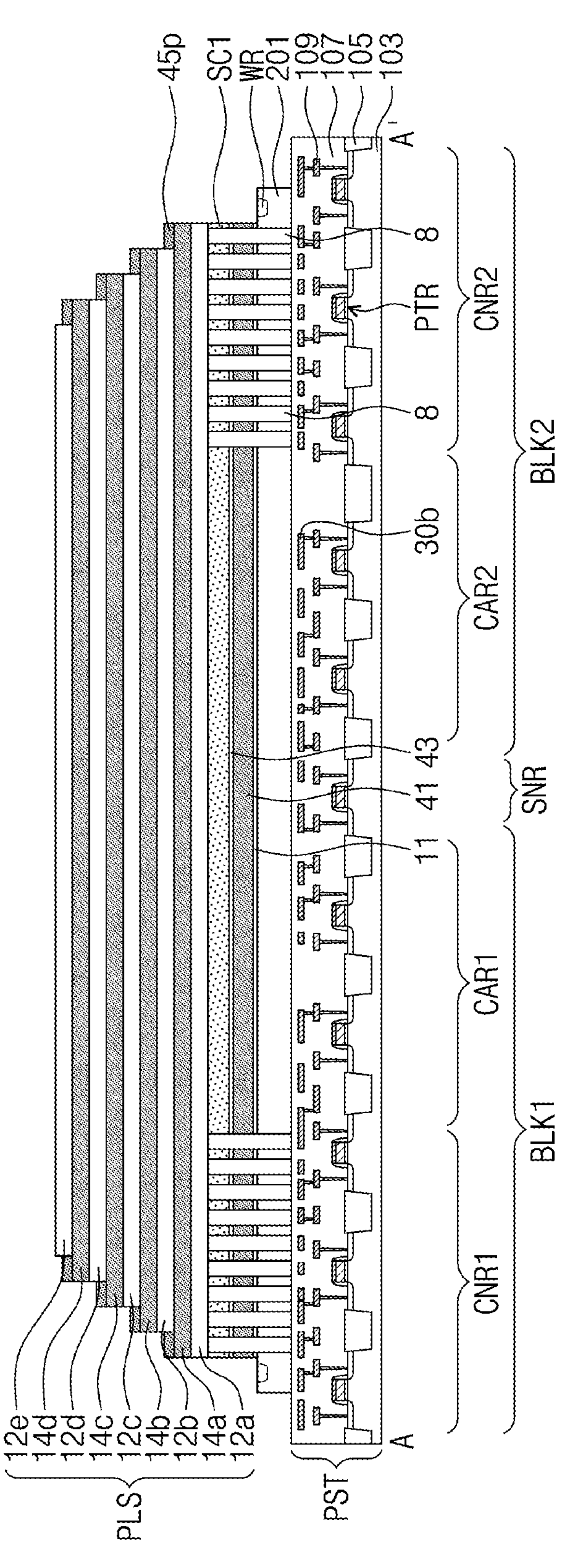

Referring to FIG. 6C, although not shown, a first preliminary pad layer may be formed on the preliminary lower stack structure PLS. The first preliminary pad layer may be formed by a deposition process (e.g., a physical vapor deposition (PVD), a low pressure chemical vapor deposition (LPCVD), or a sputtering process) having a poor step coverage property. The first preliminary pad layer may be formed of or include the same material (e.g., silicon nitride) as the second sacrificial layers 14*a*-14*d*. A selective plasma treatment process may be performed using a mask pattern, which is formed to cover the cell regions CAR1 and CAR2 and to expose the connection regions CNR1 and CNR2, and in this case, the first preliminary pad layer on the connection regions CNR1 and CNR2 may be solidified to have a hard surface. An anisotropic etching process may be performed on the first preliminary pad layer to form first preliminary pad patterns 45*p*. The first preliminary pad layer, which is placed on the cell regions CAR1 and CAR2 and is not exposed to the plasma treatment process, may be fully removed during the anisotropic etching process. The first preliminary pad patterns 45*p* may be formed of or include the same material (e.g., silicon nitride) as the second sacrificial layers 14*a*-14*d*.

Figure 5C:
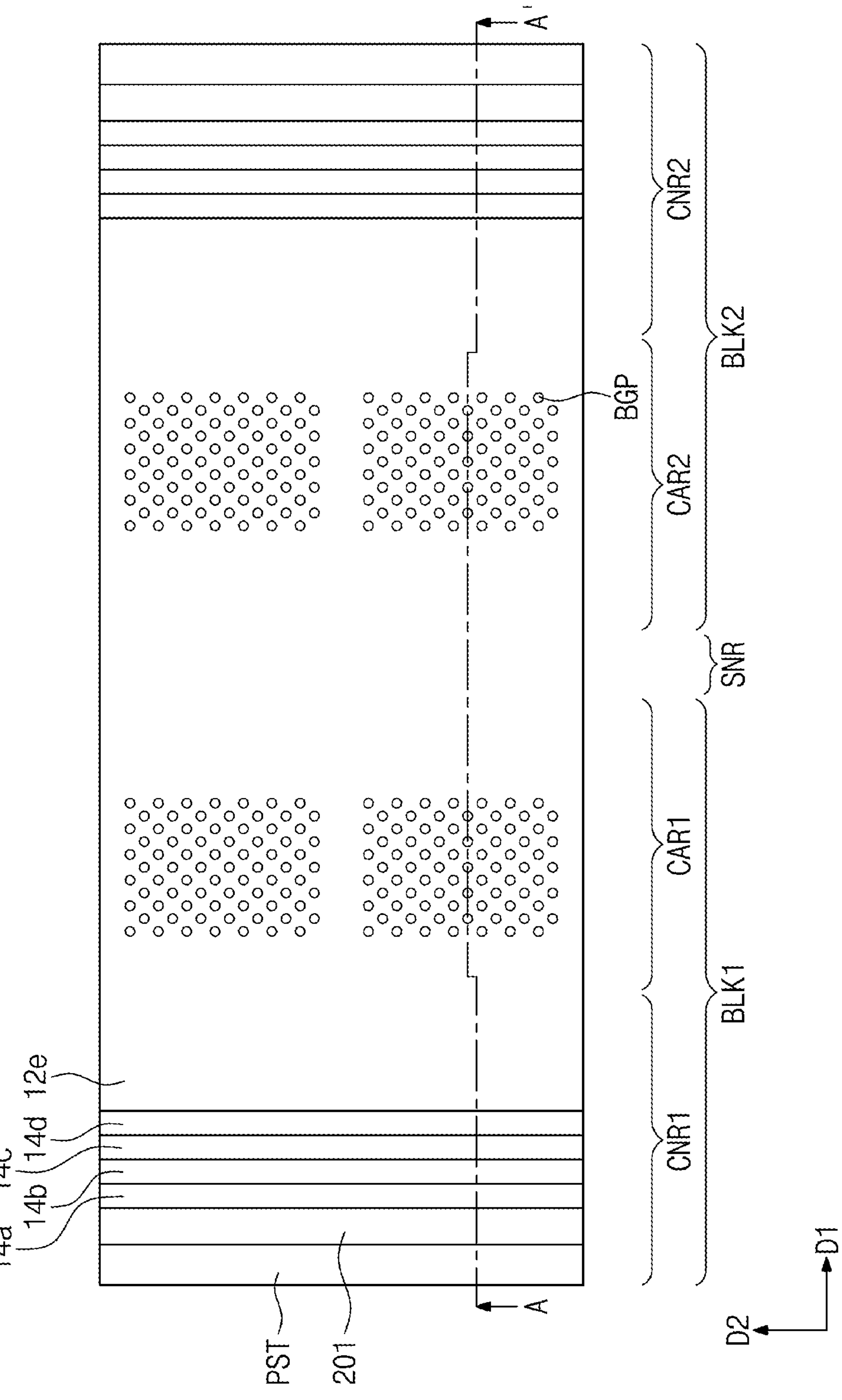
Figure 6D:
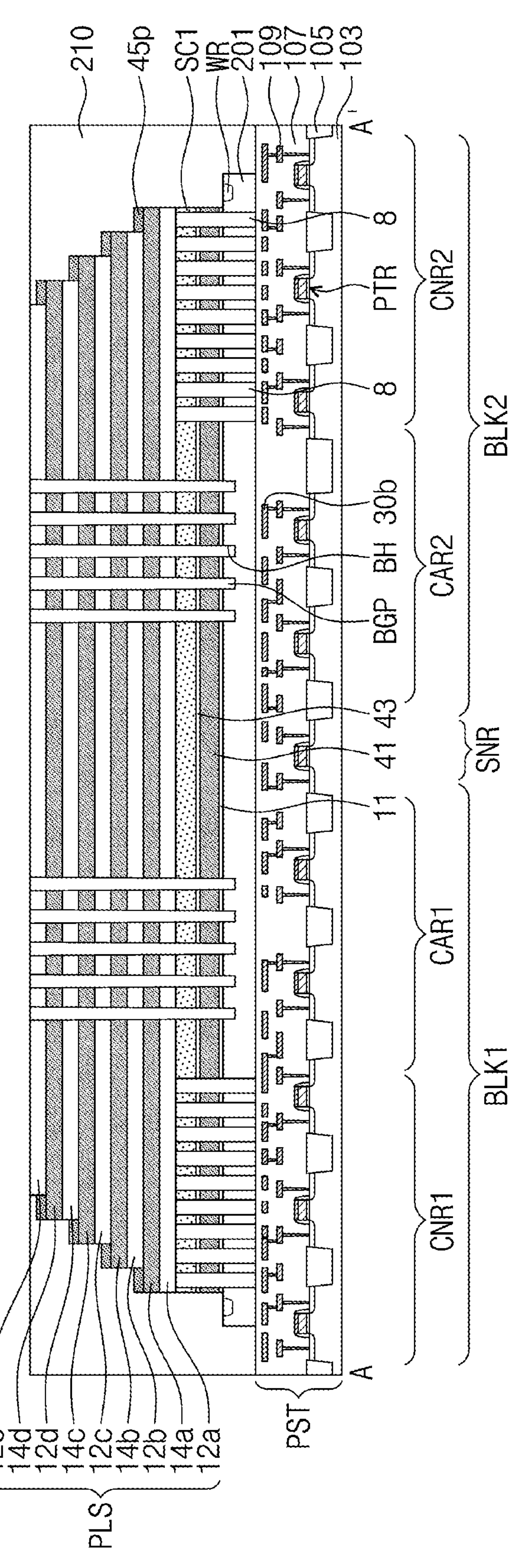

FIG. 6D is a cross-sectional view taken along line A-A' of FIG. 5C. Referring to FIGS. 5C and 6D, the first planarization insulating layer 210 may be formed on the preliminary lower stack structure PLS, and then, a chemical mechanical polishing (CMP) process may be performed to expose a top surface of the preliminary lower stack structure PLS. In the cell regions CAR1 and CAR2, the preliminary lower stack structure PLS, the first source pattern SC1, the second buffer layer 43, the first sacrificial layer 41, the first buffer layer 11, and a portion of the second substrate 201 may be etched to form a plurality of bottom holes BH. Bottom sacrificial gapfill patterns BGP may be formed to fill the bottom holes BH, respectively. The sacrificial gapfill pattern BGP may be formed of or include a material which is chosen to have an etch selectivity with respect to all of the first electrode interlayer insulating layers 12*a*-12*e*, the second sacrificial layers 14*a*-14*d*, the first source pattern SC1, the second buffer layer 43, the first sacrificial layer 41, the first buffer layer 11, and the second substrate 201. For example, the bottom sacrificial gapfill pattern BGP may be formed of or include spin-on-hardmask (SOH) materials, amorphous carbon layer (ACL) materials, or SiGe.

Figure 5D:
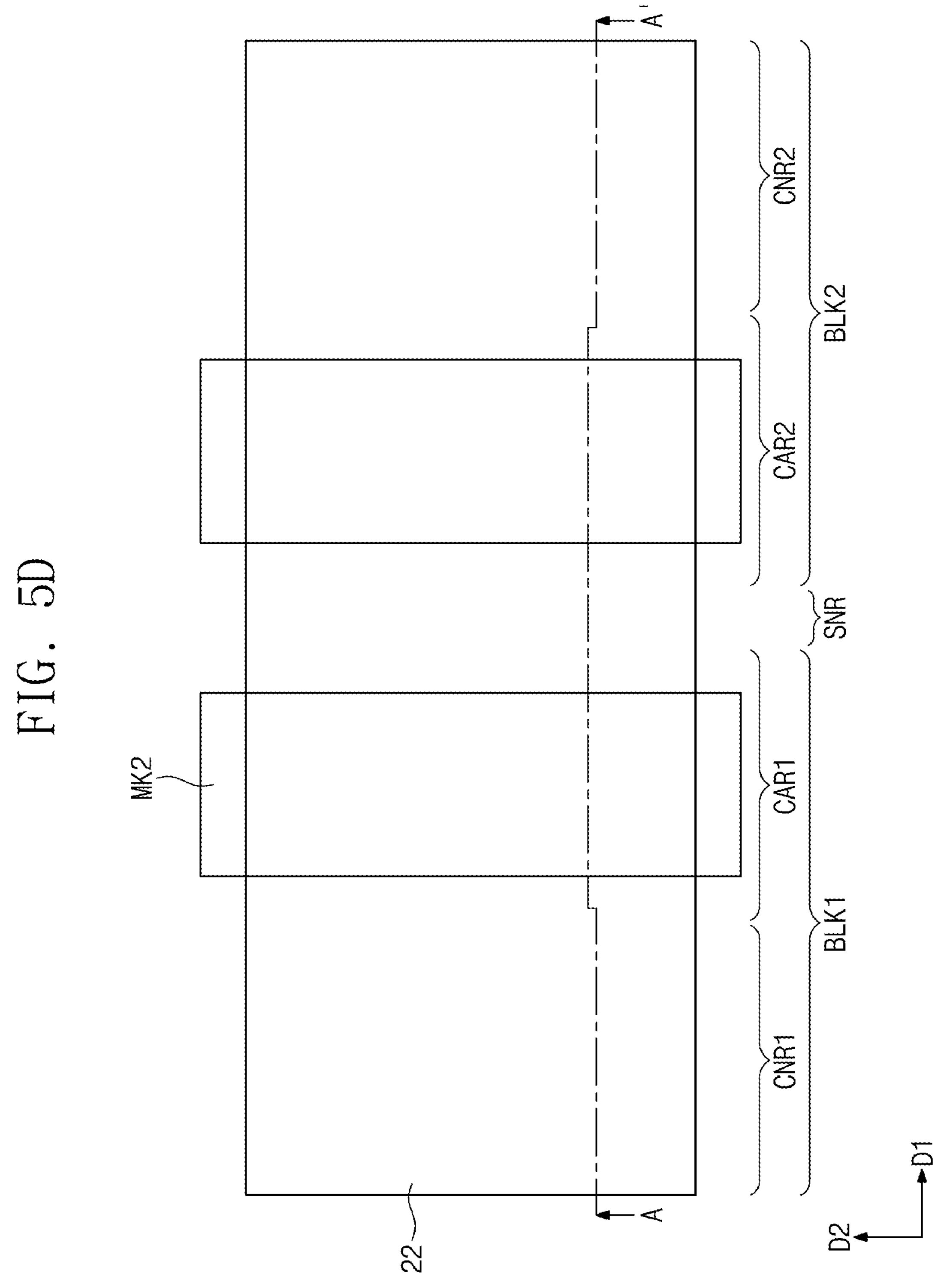
Figure 6E:
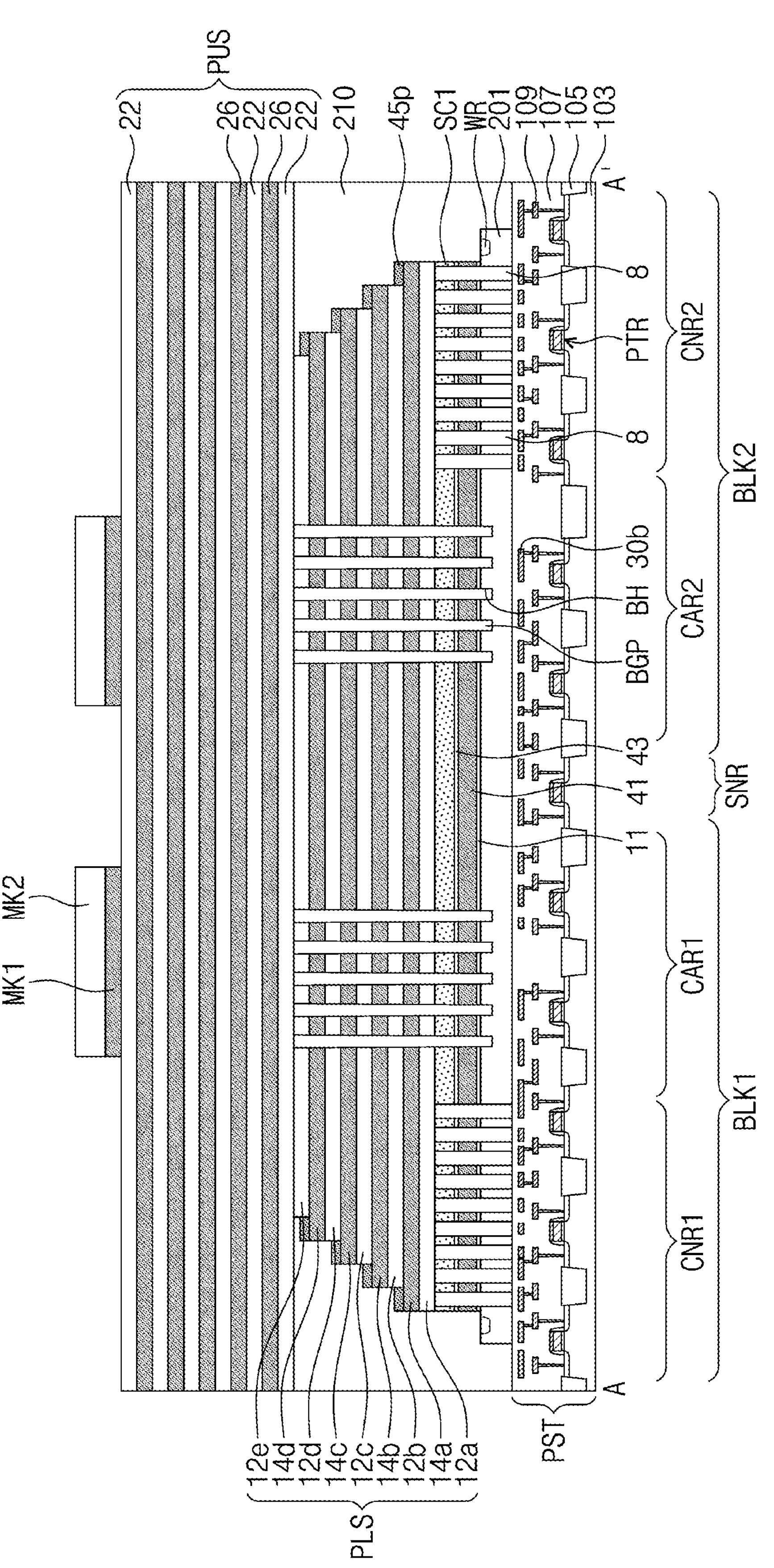

FIG. 6E is a cross-sectional view taken along line A-A' of FIG. 5D. Referring to FIGS. 5D and 6E, a preliminary upper stack structure PUS may be formed by alternately and repeatedly stacking the second electrode interlayer insulating layers 22 and third sacrificial layers 26 on the preliminary lower stack structure PLS and the first planarization insulating layer 210. The second electrode interlayer insulating layers 22 may be formed of or include the same material as the first electrode interlayer insulating layers 12. The third sacrificial layers 26 may be formed of or include the same material as the second sacrificial layers 14. First mask patterns MK1 and second mask patterns MK2 may be sequentially formed on the preliminary upper stack structure PUS. The first and second mask patterns MK1 and MK2 may be formed of or include materials having an etch selectivity with respect to each other. The first and second mask patterns MK1 and MK2 may be formed to have side surfaces that are aligned with each other. Each of the first and second mask patterns MK1 and MK2 may be a line-shaped pattern extending in the second direction D2. The first mask pattern MK1 may be formed of or include the same material as the third sacrificial layers 26. The second mask pattern MK2 may be formed of or include the same material as the second electrode interlayer insulating layers 22 but may be thicker than the second electrode interlayer insulating layers 22. The first and second mask patterns MK1 and MK2 may be disposed on each of the cell regions CAR1 and CAR2, which are spaced apart from each other, e.g., in the first direction D1, with the separation region SNR interposed therebetween.

Figure 5E:
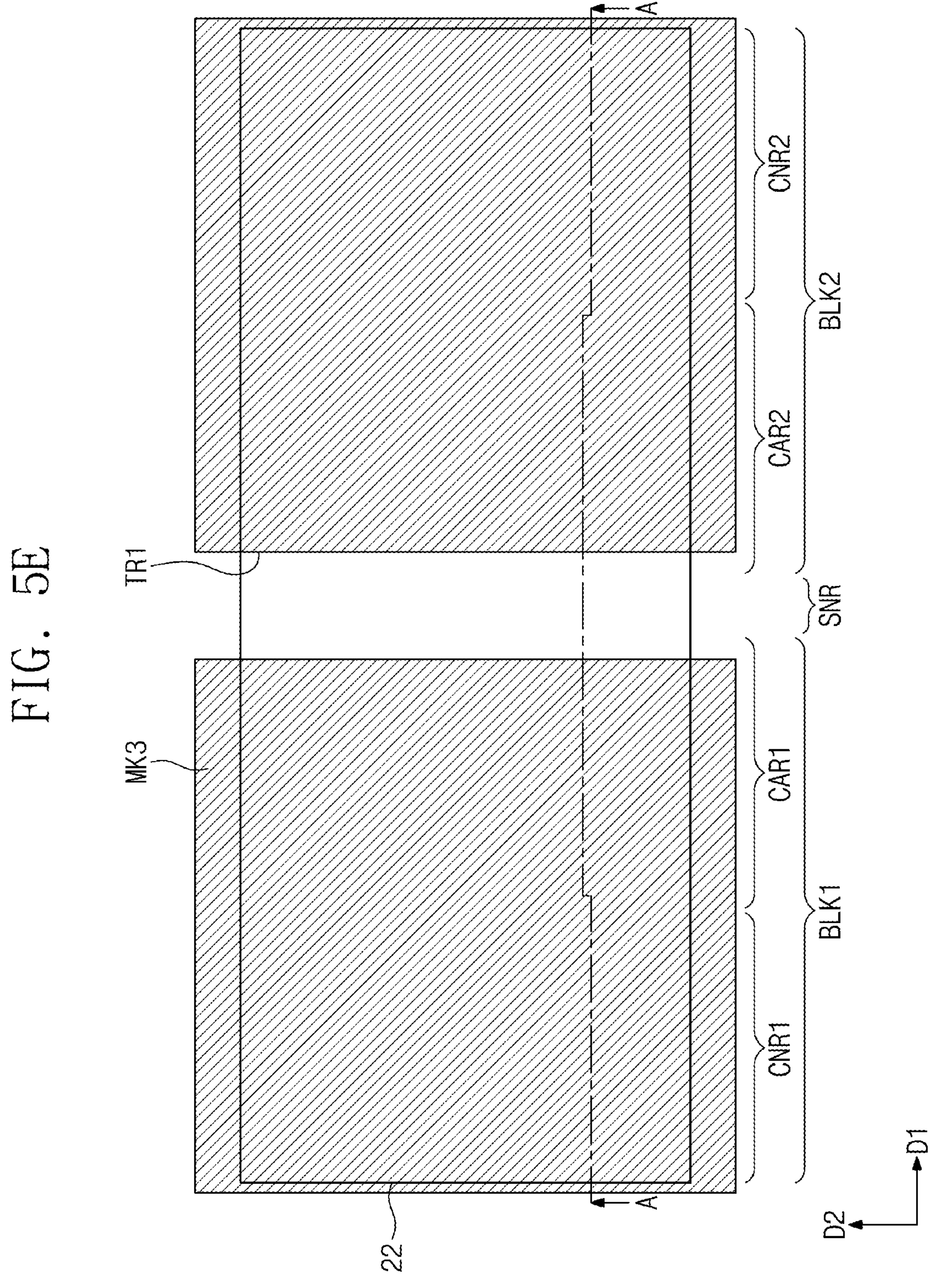
Figure 6F:
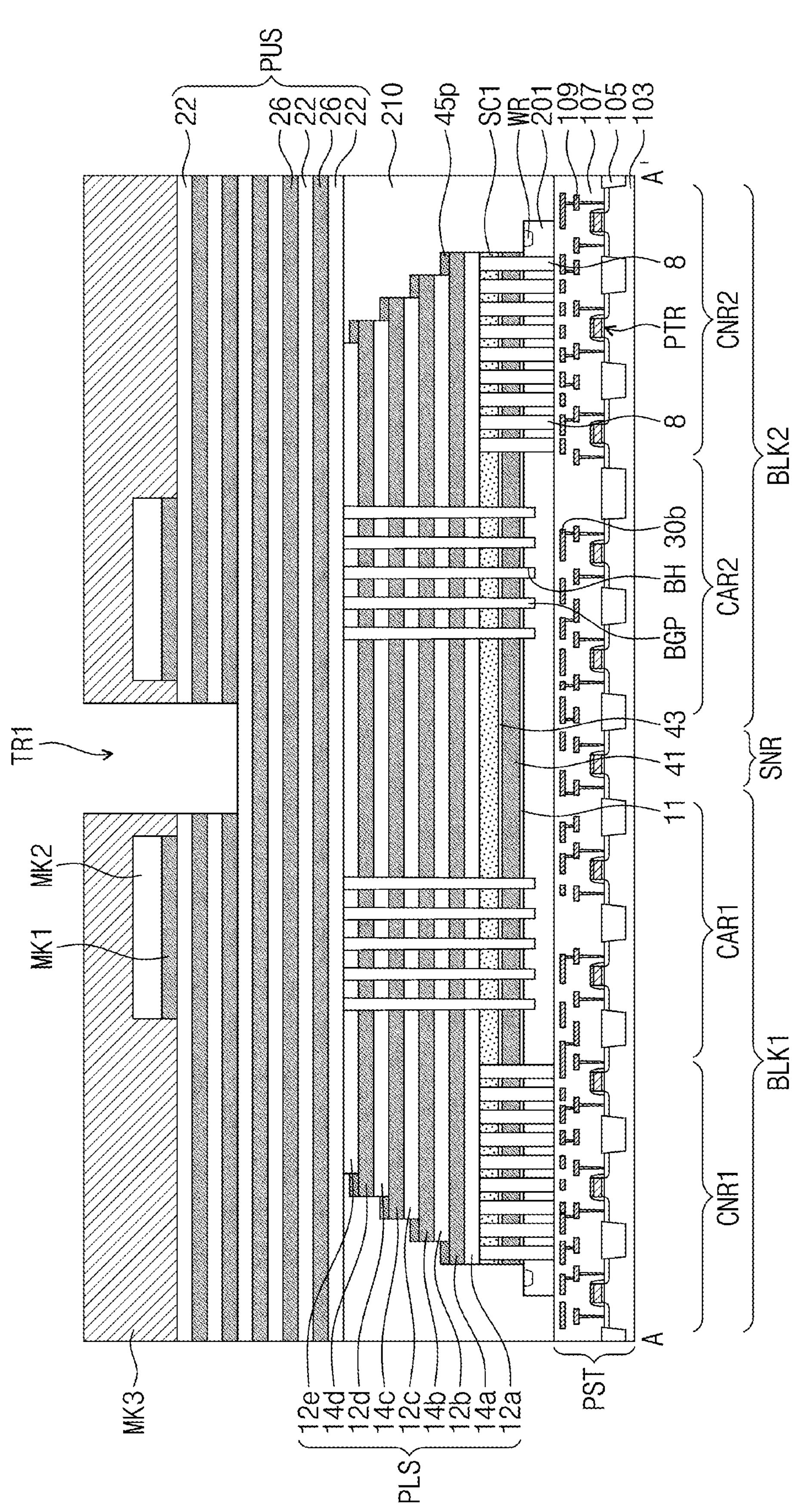

FIG. 6F is a cross-sectional view taken along line A-A' of FIG. 5E. Referring to FIGS. 5E and 6F, a third mask pattern MK3 may be formed on the preliminary upper stack structure PUS. The third mask pattern MK3 may cover the first and second mask patterns MK1 and MK2. The third mask pattern MK3 may be formed to cover the cell regions CAR1 and CAR2 and the connection regions CNR1 and CNR2, and to expose the separation region SNR. The third mask pattern MK3 may be formed of or include a material having an etch selectivity with respect to the first and second mask patterns MK1 and MK2. In an embodiment, the third mask pattern MK3 may have a single- or multi-layered structure including at least one of, e.g., a photoresist pattern, a polysilicon pattern, an SOH pattern, or an ACL pattern. A first trench TR1 may be formed by etching a portion of the preliminary upper stack structure PUS using the third mask pattern MK3 as an etch mask. The uppermost and second uppermost layers of the third sacrificial layers 26 of the preliminary upper stack structure PUS may be etched by the step of forming the first trench TR1.

Figure 5F:
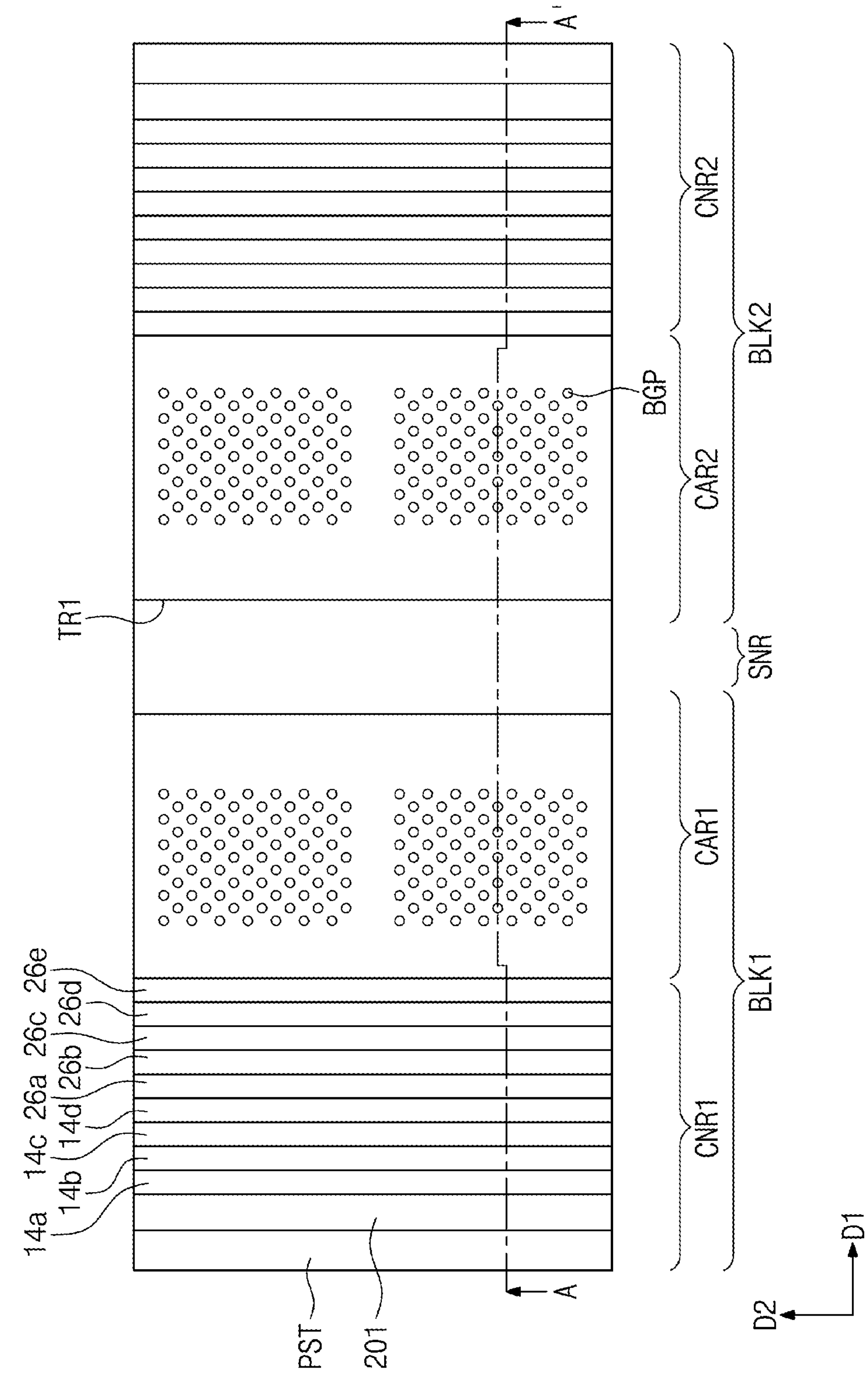
Figure 6G:
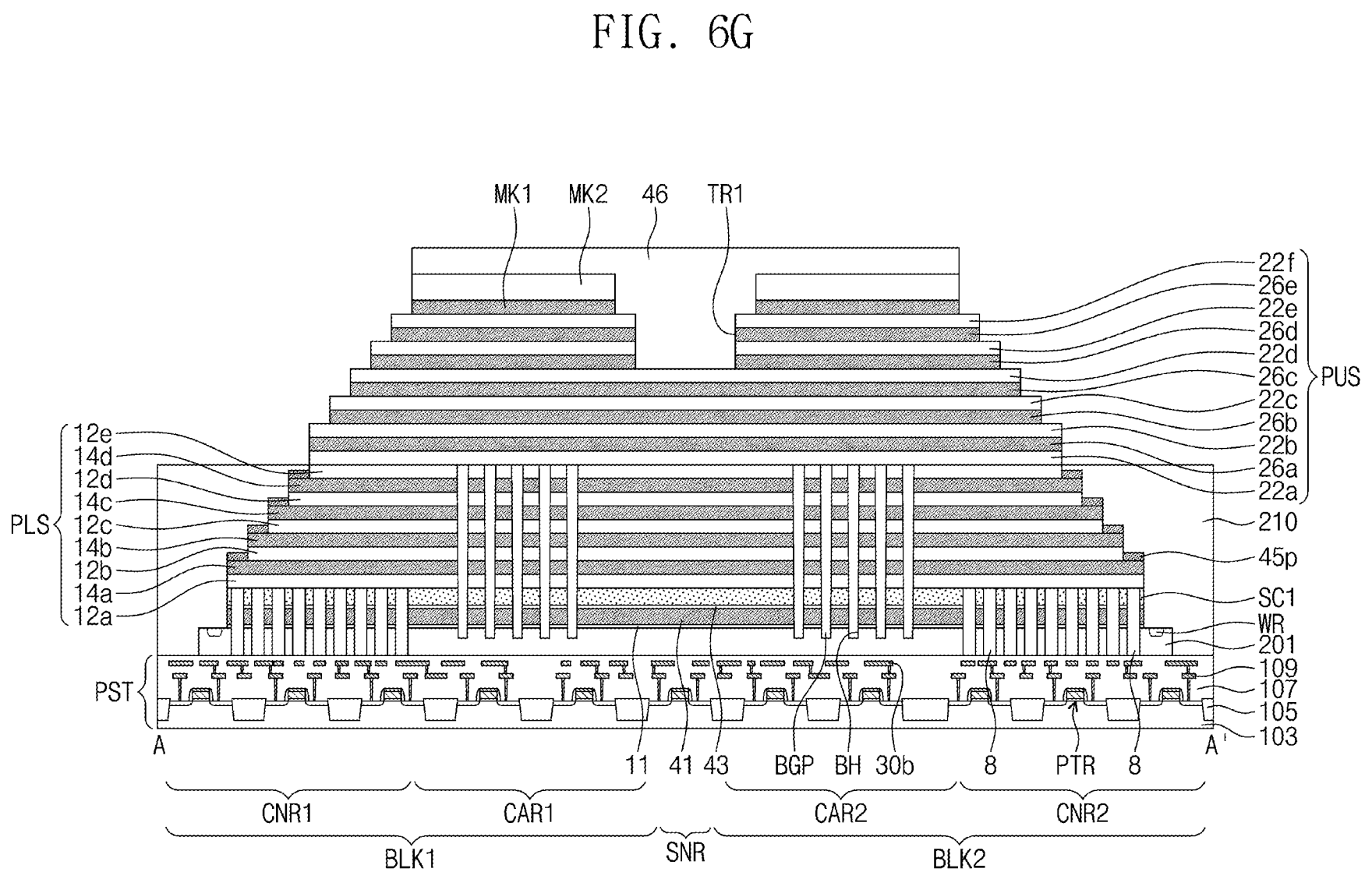

FIG. 6G is a cross-sectional view taken along line A-A' of FIG. 5F. Referring to FIGS. 5F and 6G, the third mask pattern MK3 may be removed to expose the preliminary upper stack structure PUS and the second mask patterns MK2. A photoresist pattern 46 may be formed on the second mask pattern MK2. The photoresist pattern 46 may fill the first trench TR1.

A trimming process and an anisotropic etching process using the photoresist pattern 46 may be repeated to form second electrode interlayer insulating layers 22*a*-22*f* and third sacrificial layers 26*a*-26*e*, which include end portions formed in a stepwise shape, on the connection regions CNR1 and CNR2. Here, a top surface of the first planarization insulating layer 210 may be exposed. Also, the end portions of the second electrode interlayer insulating layers 22*a*-22*e* of the preliminary upper stack structure PUS may be exposed to the outside, near the end portions of the third sacrificial layers 26*a*-26*e*. Thereafter, the photoresist pattern 46 may be removed to expose the first trench TR1.

Figure 6H:
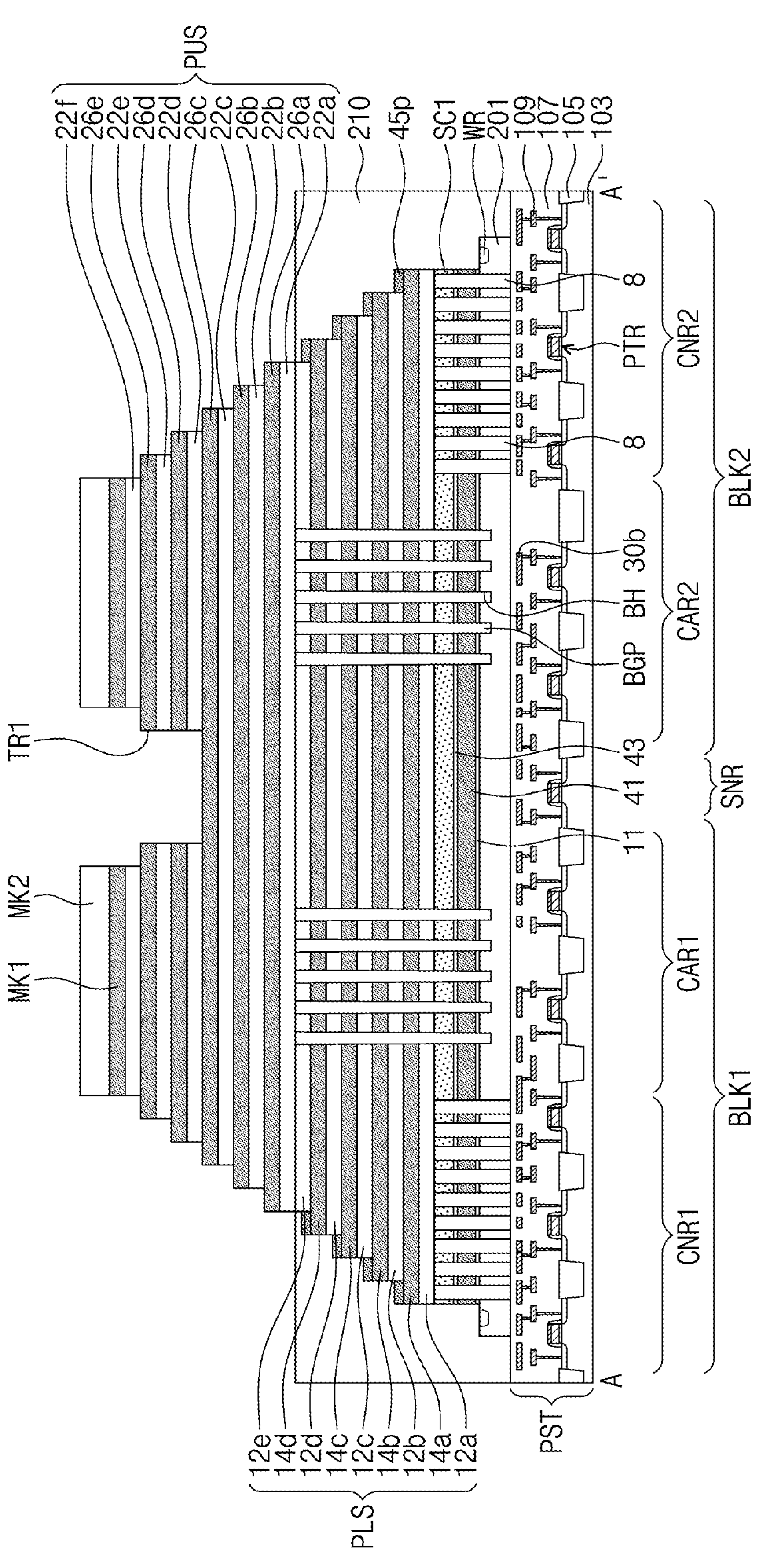

Referring to FIG. 6H, an etching process may be performed to remove the exposed end portions of the second electrode interlayer insulating layers 22*a*-22*e*, which are located near the end portions of the third sacrificial layers 26*a*-26*e*, and as a result, the end portions of the third sacrificial layers 26*a*-26*e* may be exposed to the outside. A top surface of the third sacrificial layer 26*e*, which is placed at the uppermost level on an upper side surface of the first trench TR1, may be exposed. A top surface of one (e.g., 26*c*) of the third sacrificial layers 26*a*-26*e* may be exposed through a bottom of the first trench TR1.

Figure 6I:
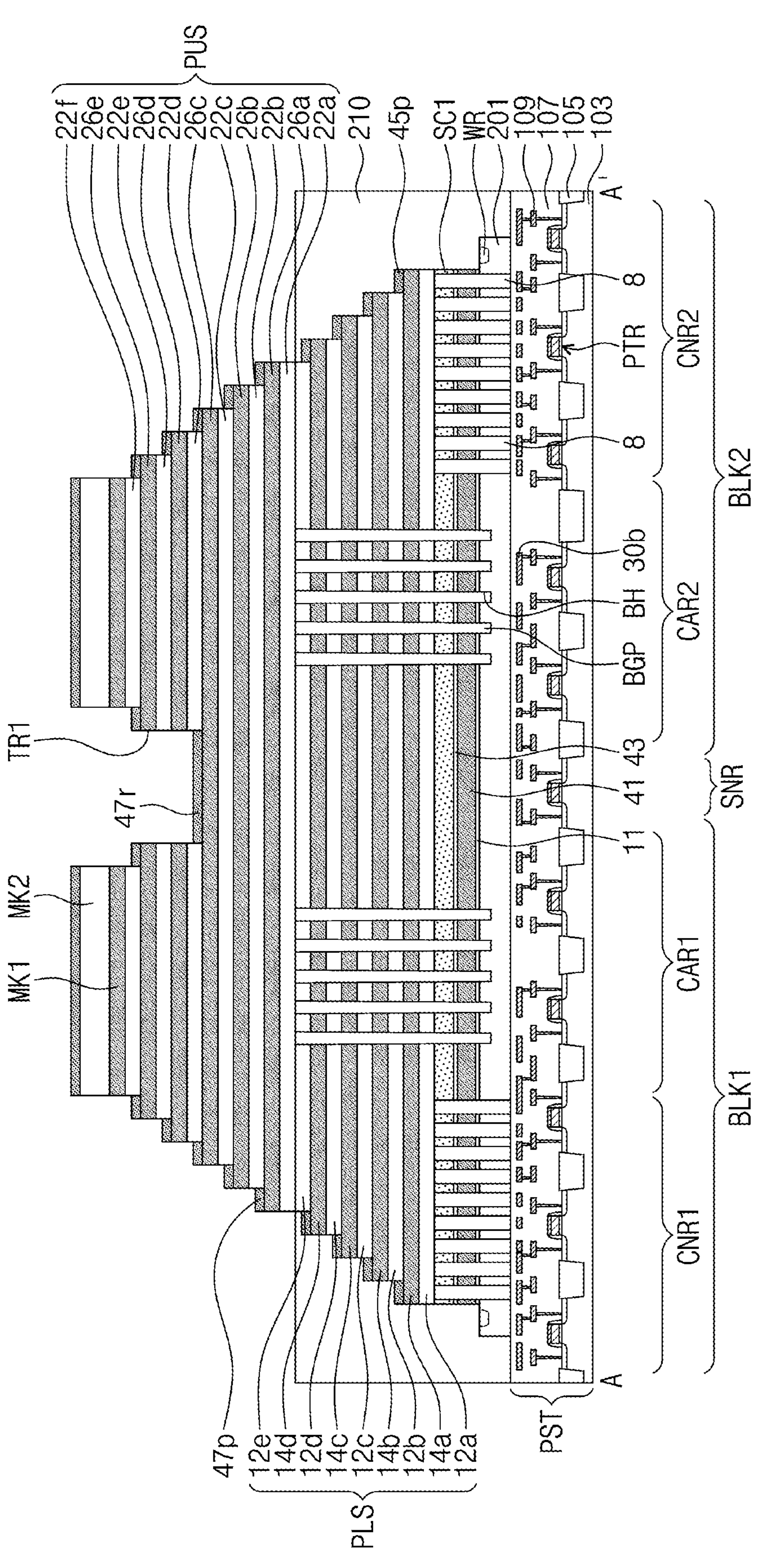

Referring to FIG. 6I, a second preliminary pad layer may be formed on the preliminary upper stack structure PUS. The second preliminary pad layer may be formed by a deposition process (e.g., a PVD, LPCVD, or sputtering process) having a poor step coverage property. The second preliminary pad layer may be formed of or include the same material (e.g., silicon nitride) as the third sacrificial layers 26*a*-26*e*. An anisotropic etching process may be performed on the second preliminary pad layer to form second preliminary pad patterns 47*p*. Here, a second preliminary remaining pad pattern 47*r* may be formed on the bottom of the first trench TR1. The second preliminary remaining pad pattern 47*r* may be in contact with a top surface of one (e.g., 26*c*) of the third sacrificial layers 26*a*-26*e*. The second preliminary pad patterns 47*p* and the second preliminary remaining pad pattern 47*r* may be formed of or include the same material (e.g., silicon nitride) as the third sacrificial layers 26*a*-26*e*. The second preliminary pad pattern 47*p* may also be formed on the third sacrificial layer 26*e*, which is located at the uppermost level on the side surface of the first trench TR1.

Figure 6J:
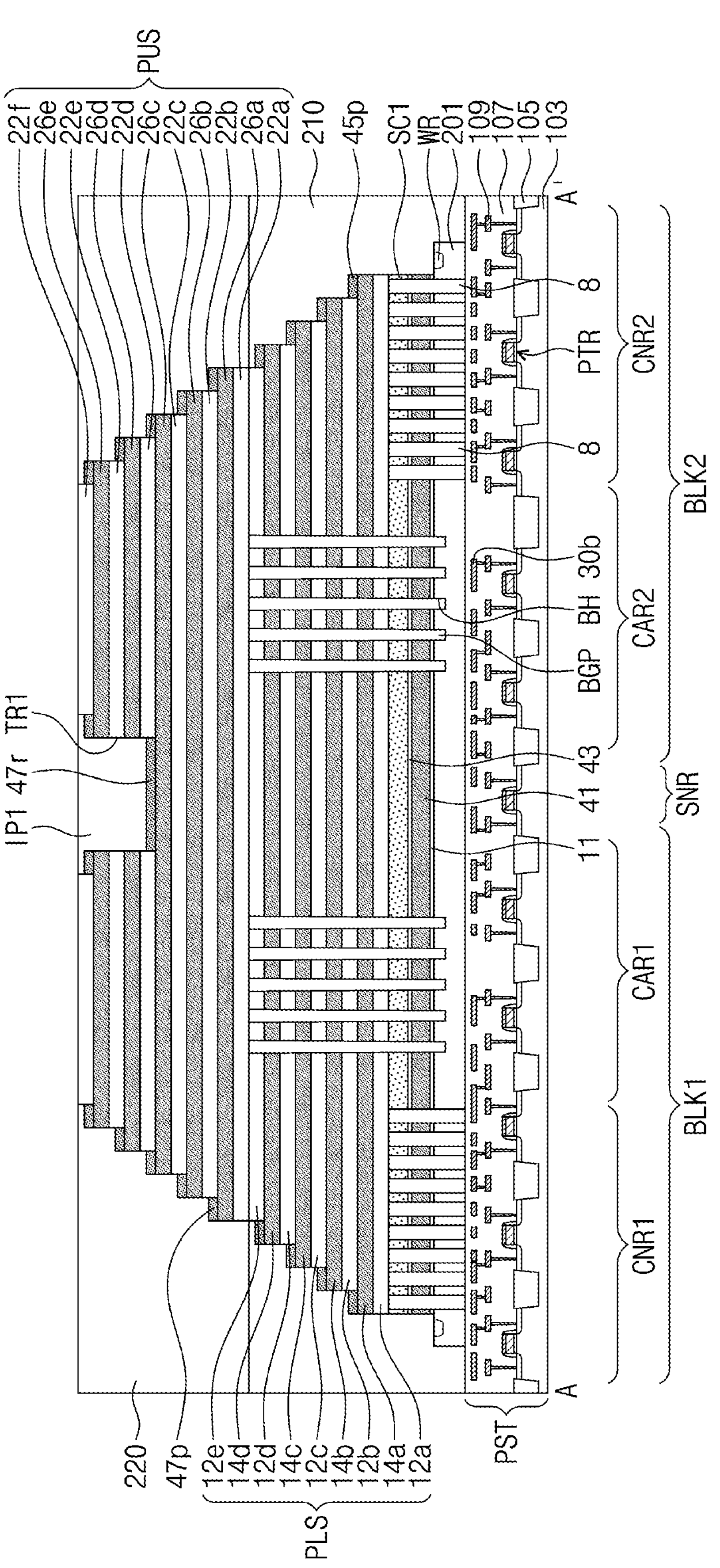

Referring to FIGS. 6I and 6J, the second planarization insulating layer 220 may be formed on the preliminary upper stack structure PUS and the second mask patterns MK2, and then, a CMP process may be performed to remove the first and second mask patterns MK1 and MK2 and to expose a top surface of the preliminary upper stack structure PUS. Here, a portion of the second planarization insulating layer 220 may be formed to fill the first trench TR1 and may be used as the first insulating line pattern IP1. The first insulating line pattern IP1 may have a top surface that is coplanar with the top surface of the preliminary upper stack structure PUS.

Figure 6K:
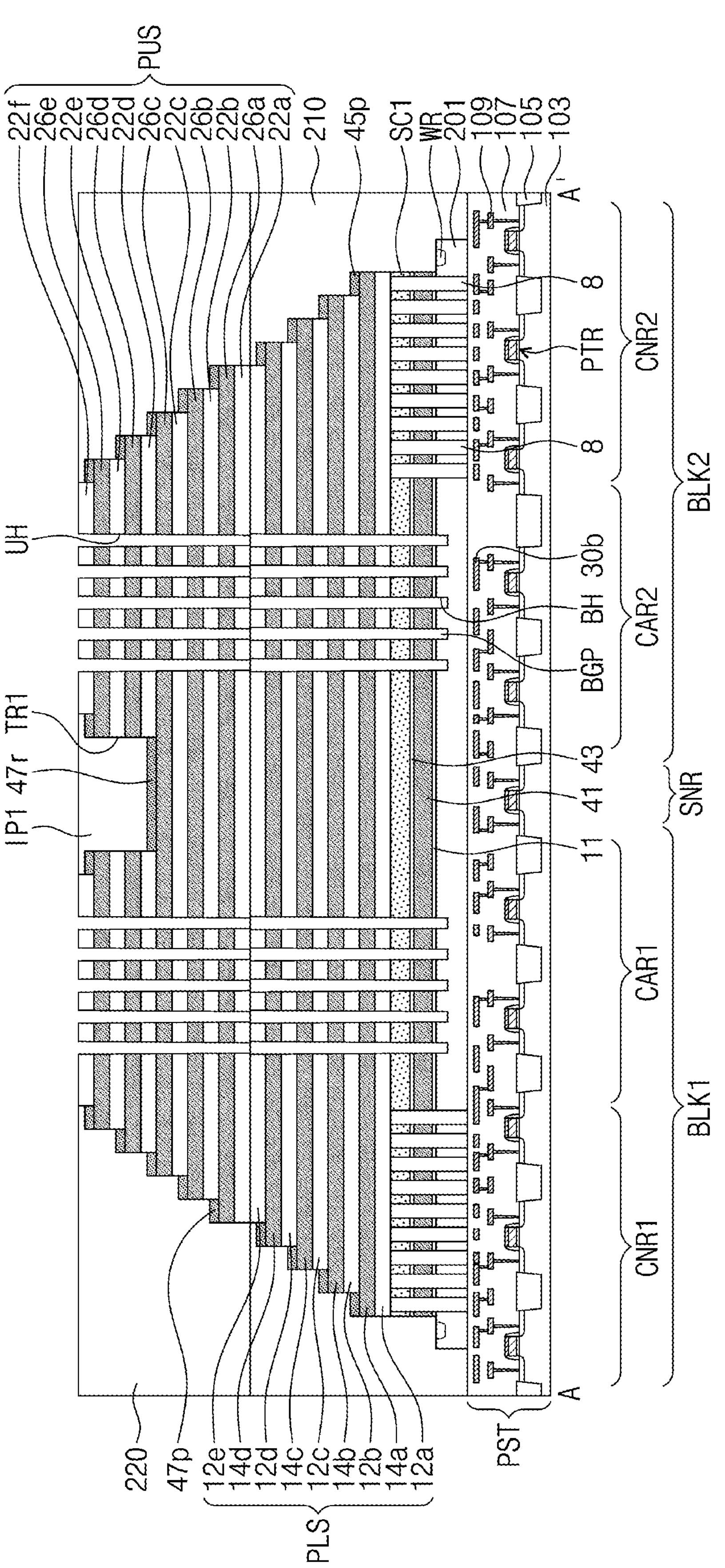

Referring to FIG. 6K, the preliminary upper stack structure PUS may be etched to form upper holes UH exposing the sacrificial gapfill patterns BGP, respectively.

Figure 5G:
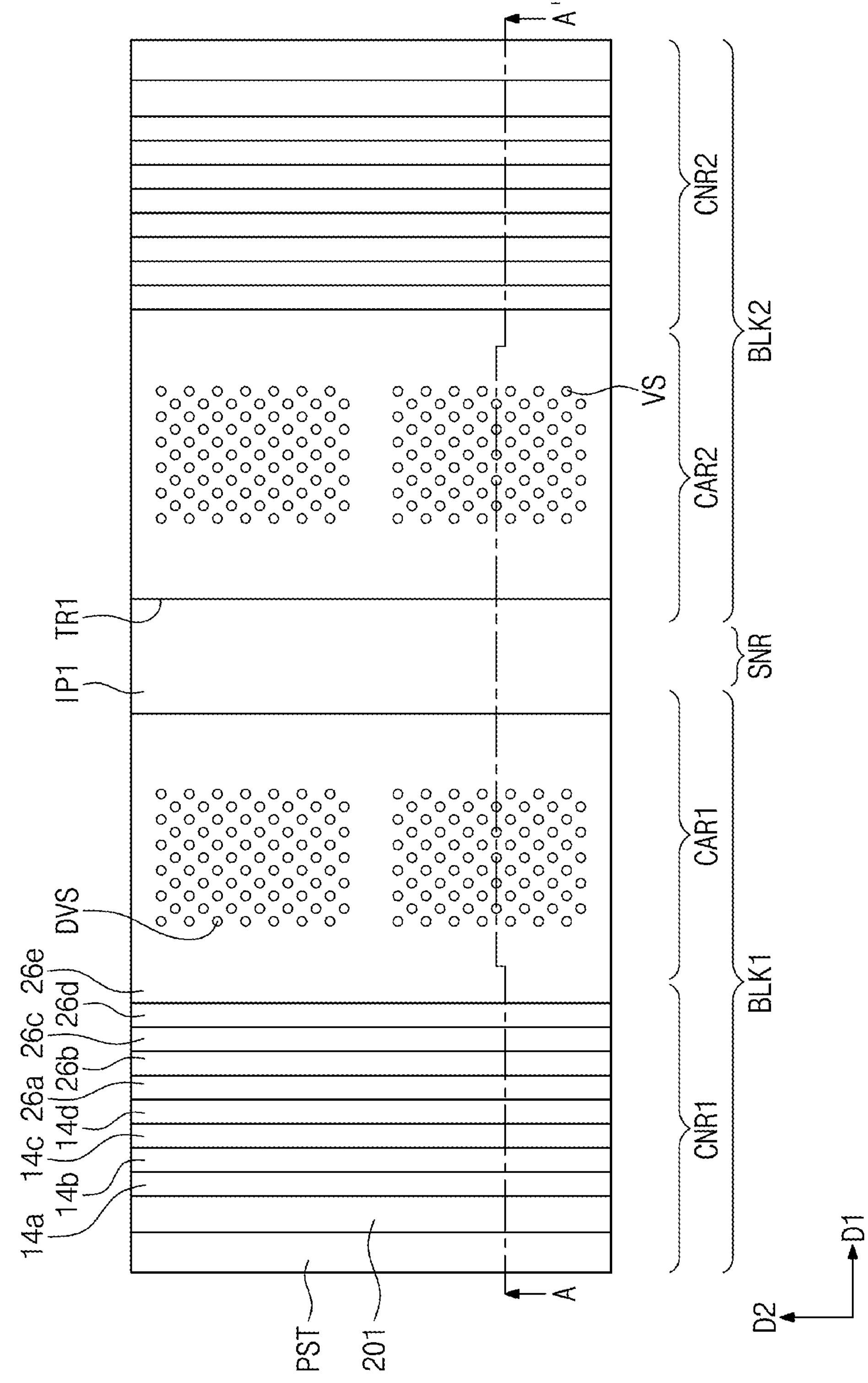
Figure 6L:
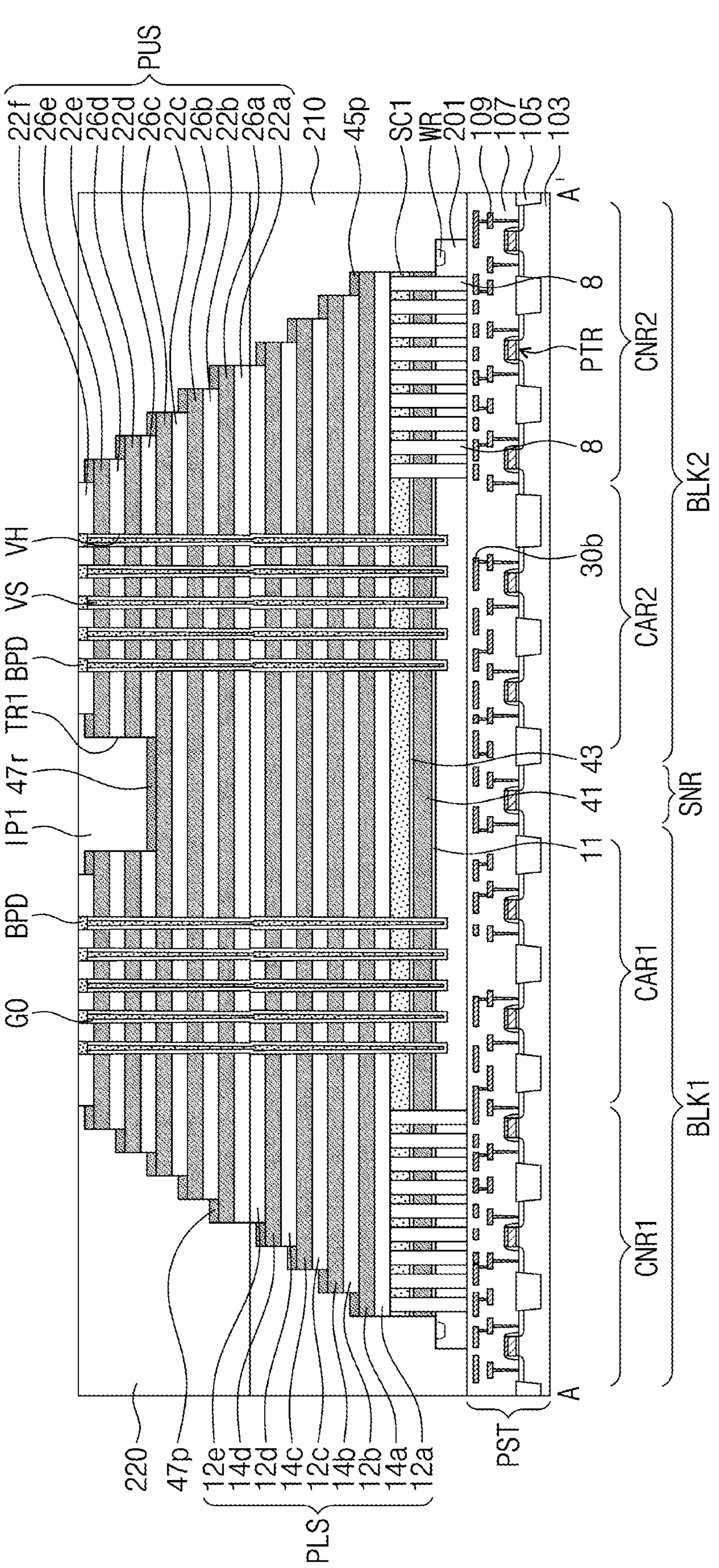

FIG. 6L is a cross-sectional view taken along line A-A' of FIG. 5G. Referring to FIGS. 5G, 6K, and 6L, the upper holes UH and the bottom holes BH, which overlap each other, may constitute vertical holes VH for the vertical semiconductor patterns VS and dummy vertical holes for the dummy vertical semiconductor patterns DVS. As shown in FIG. 2, the dummy vertical holes for the dummy vertical semiconductor patterns DVS may be disposed between the vertical holes VH and may be arrange in the first direction D1. The gate insulating layer GO may be formed in the vertical holes VH. The vertical semiconductor pattern VS and the dummy vertical semiconductor pattern DVS may be formed on the gate insulating layer GO, and then, the insulating gapfill pattern 29 may be formed to fill inner spaces of the vertical holes VH. The bit line pads BPD may be formed by partially removing upper portions of the vertical semiconductor pattern VS and the dummy vertical semiconductor pattern DVS and filling the removed portions with a doped silicon layer.

Figure 5H:
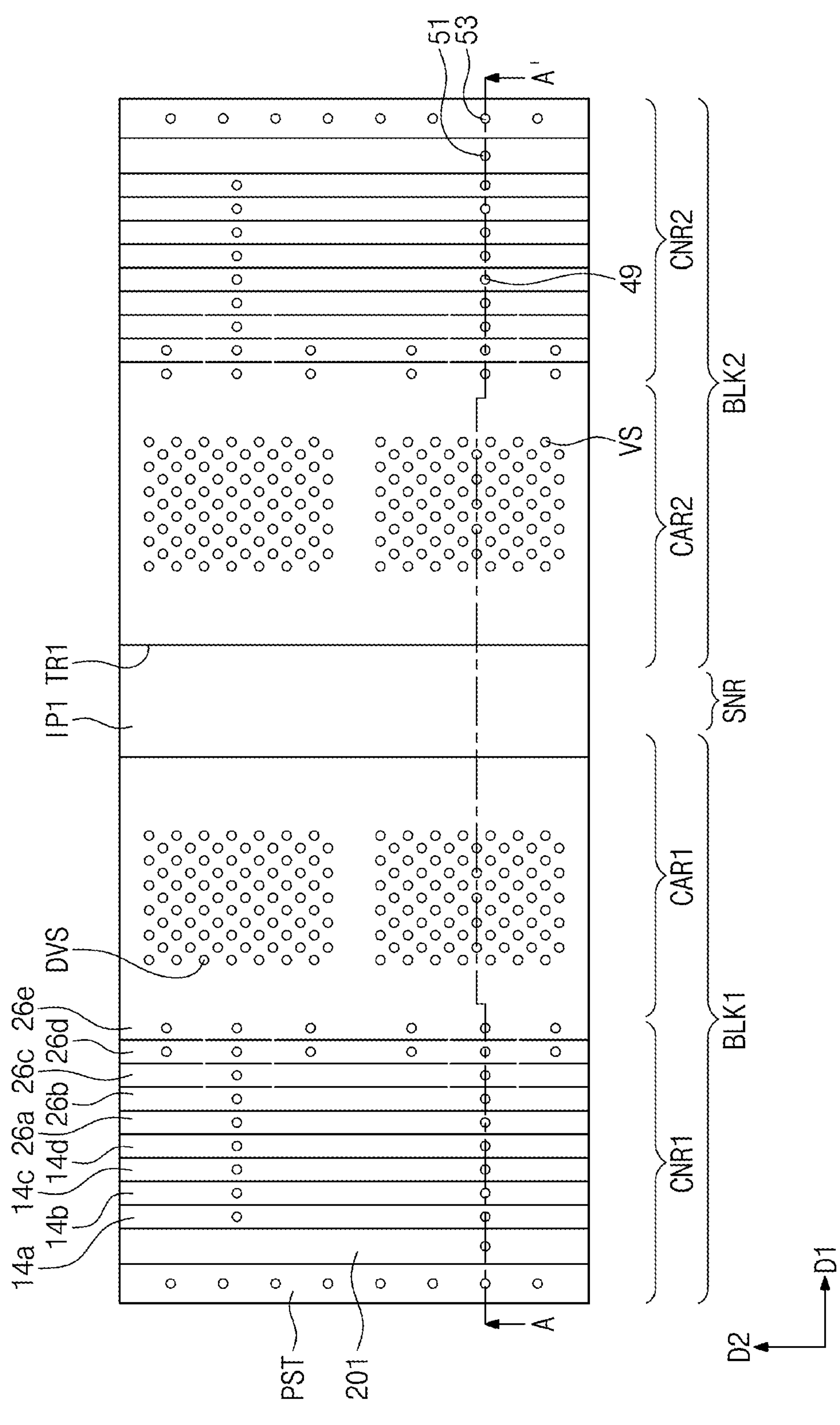
Figure 6M:
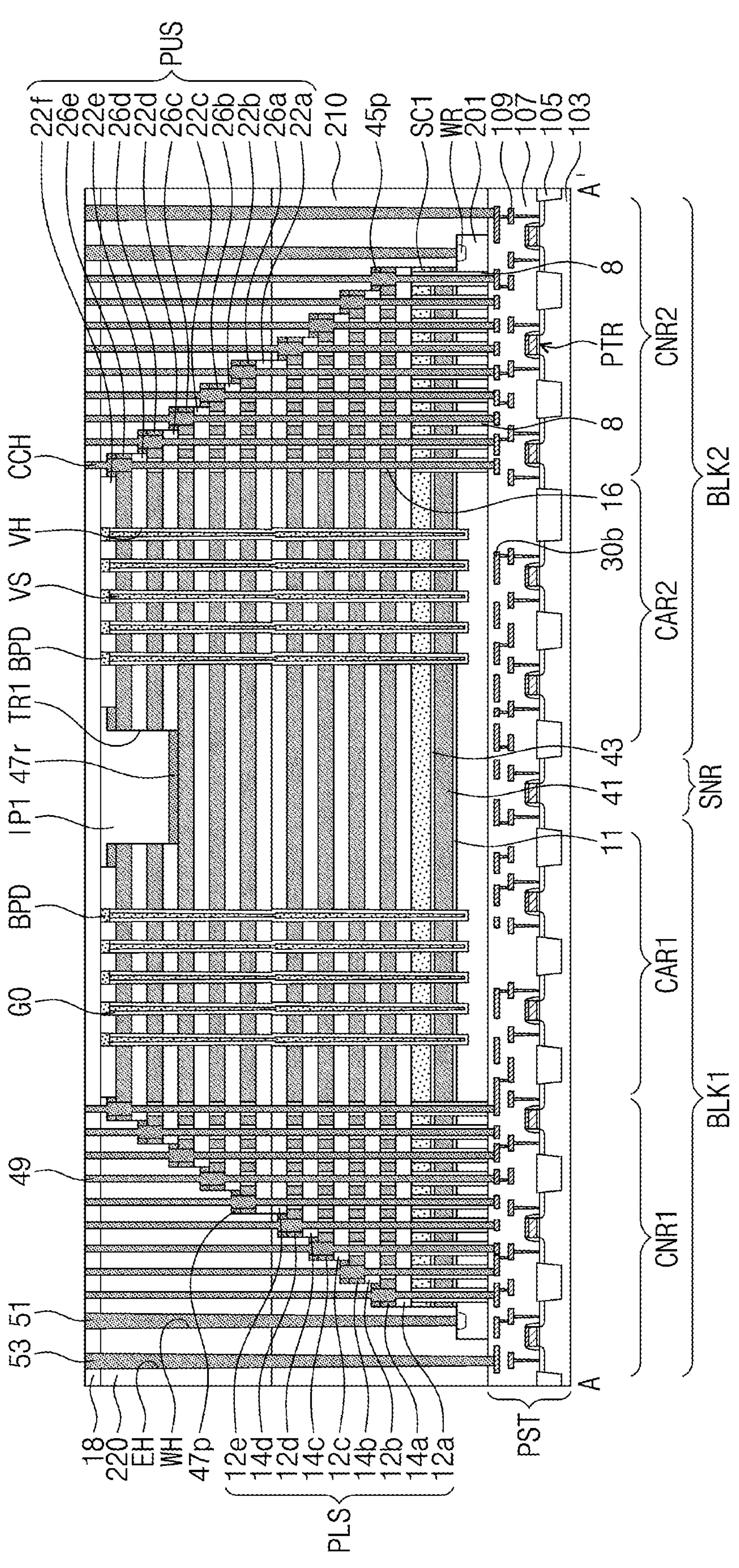

FIG. 6M is a cross-sectional view taken along line A-A' of FIG. 5H. Referring to FIGS. 5H and 6M, the first upper interlayer insulating layer 18 may be formed on the preliminary upper stack structure PUS, the second planarization insulating layer 220, and the first insulating line pattern IP1. Cell contact holes CCH, which expose the peripheral conductive pads 30*b*, may be formed on the connection regions CNR1 and CNR2 by removing the first upper interlayer insulating layer 18, the planarization insulating layers 220 and 210, the preliminary upper and lower stack structures PUS and PLS, the preliminary pad patterns 47*p* and 45*p*, the substrate insulating pattern 8, and a portion of the peripheral interlayer insulating layer 107. An isotropic etching process may be performed through the cell contact holes CCH to partially remove the preliminary pad patterns 47*p* and 45*p* and the second and third sacrificial layers 14*a*-14*d* and 26*a*-26*e*, and thus, inner side surfaces of the cell contact holes CCH may be formed to have an uneven structure. An insulating layer may be formed in the cell contact holes CCH, and then, an isotropic etching process may be performed to form the contact insulating patterns 16 in the cell contact holes CCH, respectively. Second sacrificial gapfill patterns 49 may be formed to fill the cell contact holes CCH, respectively. In the connection regions CNR1 and CNR2, the first upper interlayer insulating layer 18 and the planarization insulating layers 220 and 210 may be etched to form an edge penetration hole EH and a substrate contact hole WH. A third sacrificial gapfill pattern 51 may be formed in the substrate contact hole WH, and a fourth sacrificial gapfill pattern 53 may be formed in the edge penetration hole EH.

Figure 5I:
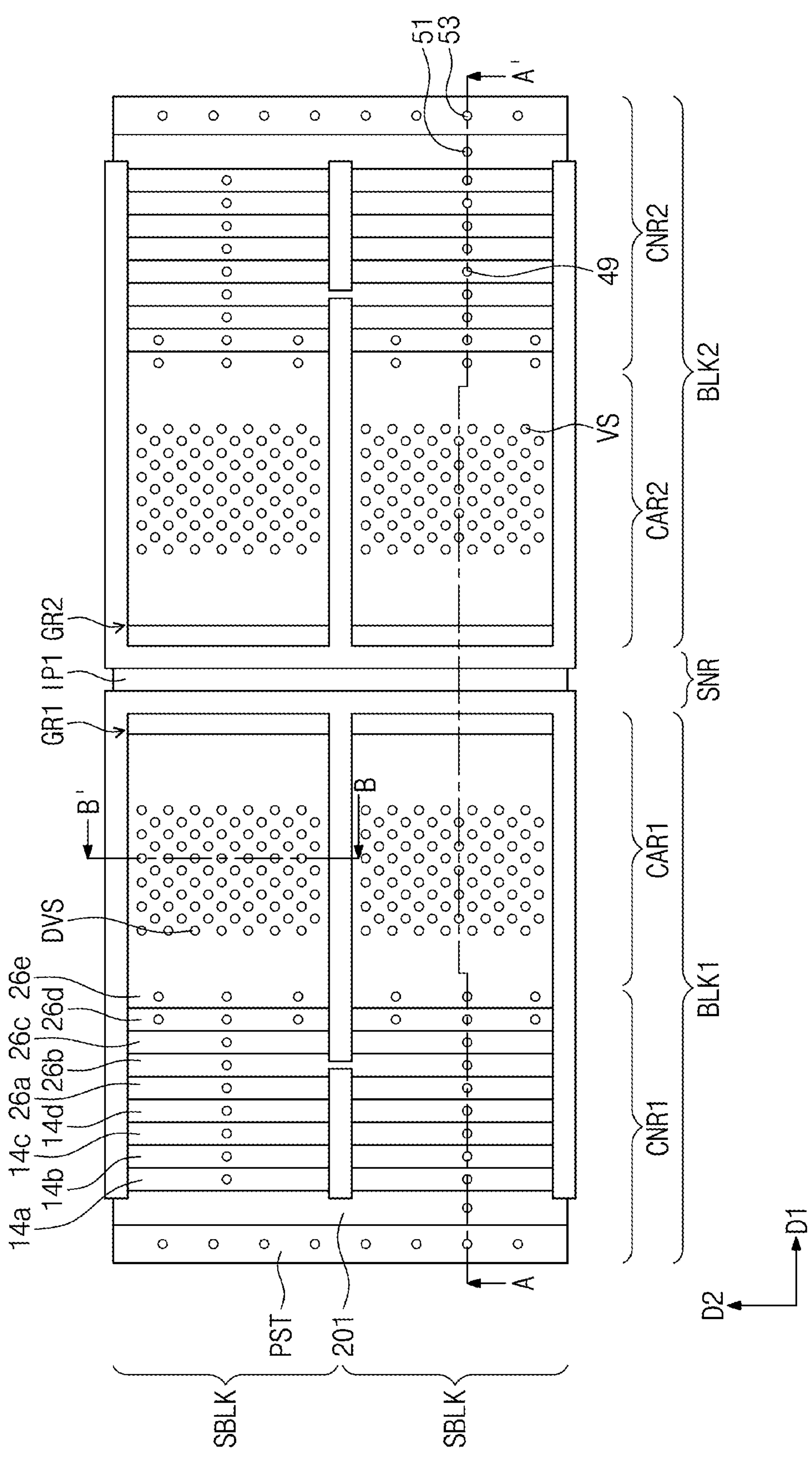
Figure 6N:
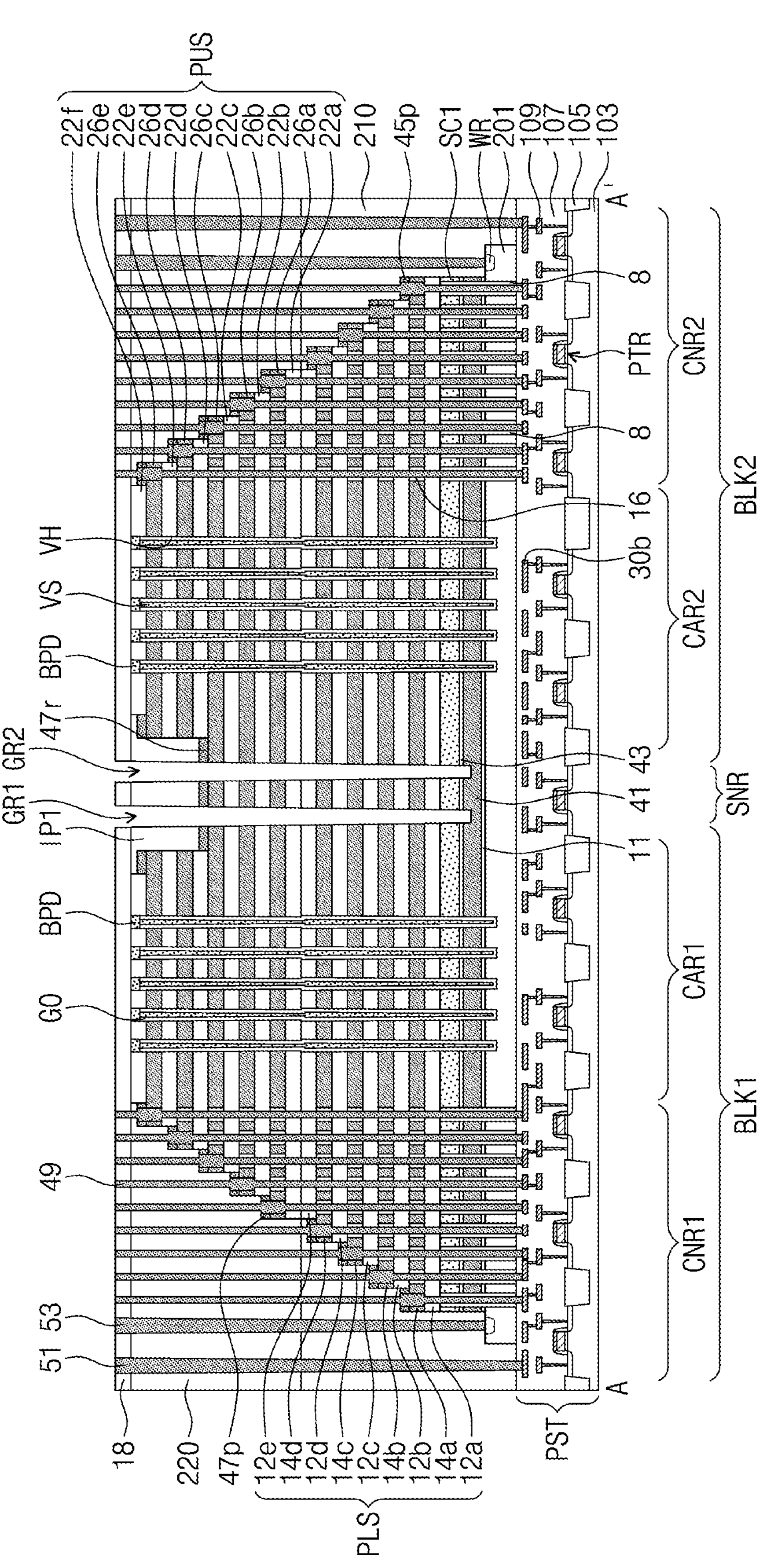
Figure 60:
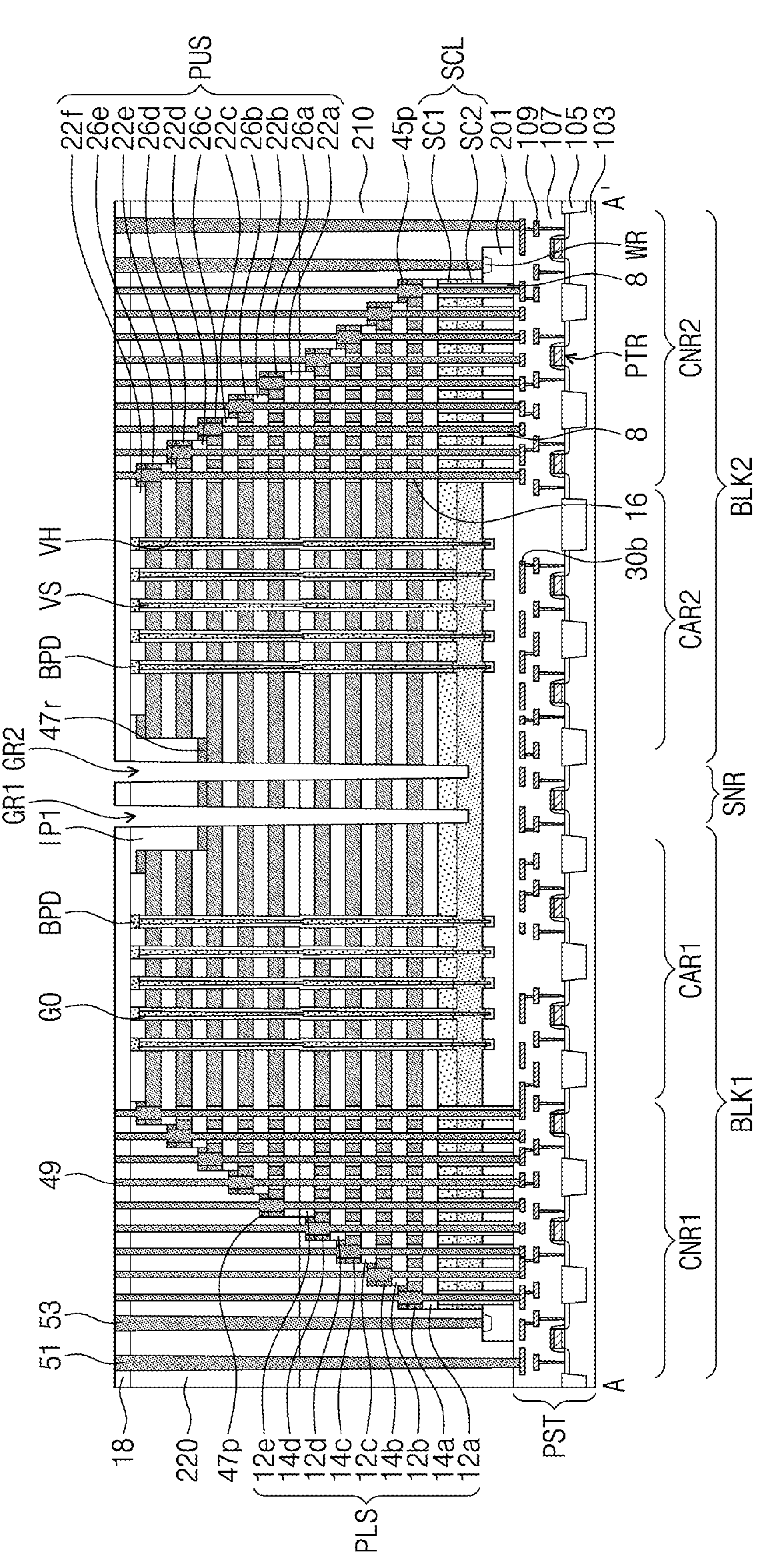

FIG. 6N is a cross-sectional view taken along line A-A' of FIG. 5I. FIG. 7 is a cross-sectional view taken along line B-B' of FIG. 5I. Referring to FIGS. 5I, 6N, and 7, the first upper interlayer insulating layer 18, the preliminary upper and lower stack structures PUS and PLS, the first source pattern SC1, and the second buffer layer 43 may be sequentially etched to form first and second grooves GR1 and GR2 exposing the first sacrificial layer 41. A protection spacer may be formed on inner side surfaces of the first and second grooves GR1 and GR2. The protection spacer may cover side surfaces of the preliminary upper and lower stack structures PUS and PLS.

Referring to FIG. 6O, a first empty space may be formed below the first source pattern SC1 by removing the second buffer layer 43, the first sacrificial layer 41, and the first buffer layer 11 through the first and second grooves GR1 and GR2. Here, a portion of the gate insulating layer GO may be removed to expose a side surface of the vertical semiconductor pattern VS. A second source layer may be conformally formed to fill the first empty space through the first and second grooves GR1 and GR2, and then, the second source pattern SC2 may be formed by performing an anisotropic etching process to remove the second source layer from the first and second grooves GR1 and GR2 and to leave the second source layer in the first empty space. In this case, the first source pattern SC1 and the second source pattern SC2 may constitute the source structure SCL. In an embodiment, during this step, the protection spacer may be removed. The second source pattern SC2 may be formed to be in contact with the side surface of the vertical semiconductor pattern VS.

Referring to FIGS. 2, 3B, 6O, and 6P, second empty spaces may be formed between the electrode interlayer insulating layers 12*a*-12*e* and 22*a*-22*f* by removing the second sacrificial layers 14*a*-14*d*, the third sacrificial layers 26*a*-26*e*, and the preliminary pad patterns 47*p* and 45*p* through the first and second grooves GR1 and GR2. A first conductive layer may be conformally formed to fill the second empty spaces through the first and second grooves GR1 and GR2. Thereafter, an anisotropic etching process may be performed to remove the first conductive layer from the first and second grooves GR1 and GR2 and to form the electrode layers EL1-EL9 in the second empty spaces. Before the formation of the first conductive layer, the high-k dielectric layer HL of FIG. 4D may be conformally formed. An insulating layer may be conformally formed and then may be anisotropically etched to form the third and fourth insulating line patterns IP3 and IP4 filling the first and second grooves GR1 and GR2.

Referring to FIGS. 2, 3B, 6O, and 6P, a recess line, which extends in the first direction D1, may be formed by etching the first upper interlayer insulating layer 18, the seventh to ninth electrode layers EL7-EL9 between the dummy vertical semiconductor patterns DVS, and the second electrode interlayer insulating layers 22 therebetween, and then, the second insulating line patterns IP2 may be formed by filling the recess line with an insulating material.

In an embodiment, the second insulating line patterns IP2 may be formed after the formation of the electrode layers EL1-EL9. For a structure, in which two or more second insulating line patterns IP2 are provided in the sub-block region SBLK, if the second sacrificial layers 14*a*-14*d* and the third sacrificial layers 26*a*-26*e* are removed after the formation of the second insulating line pattern IP2, it may be hard to remove some (e.g., 26*c*, 26*d*, and 26*e*) of the third sacrificial layers 26*a*-26*e* between the second insulating line patterns IP2. Thus, it may be impossible to realize a structure with two or more second insulating line patterns IP2, and in this case, it may be difficult to realize a highly-integrated semiconductor memory device. By contrast, according to an embodiment, since the second insulating line patterns IP2 are formed after the formation of the electrode layers EL1-EL9, it may be possible to dispose more memory cells in each sub-block region SBLK and thereby to realize a three-dimensional semiconductor memory device with a high integration density and a large memory capacity.

Figure 6P:
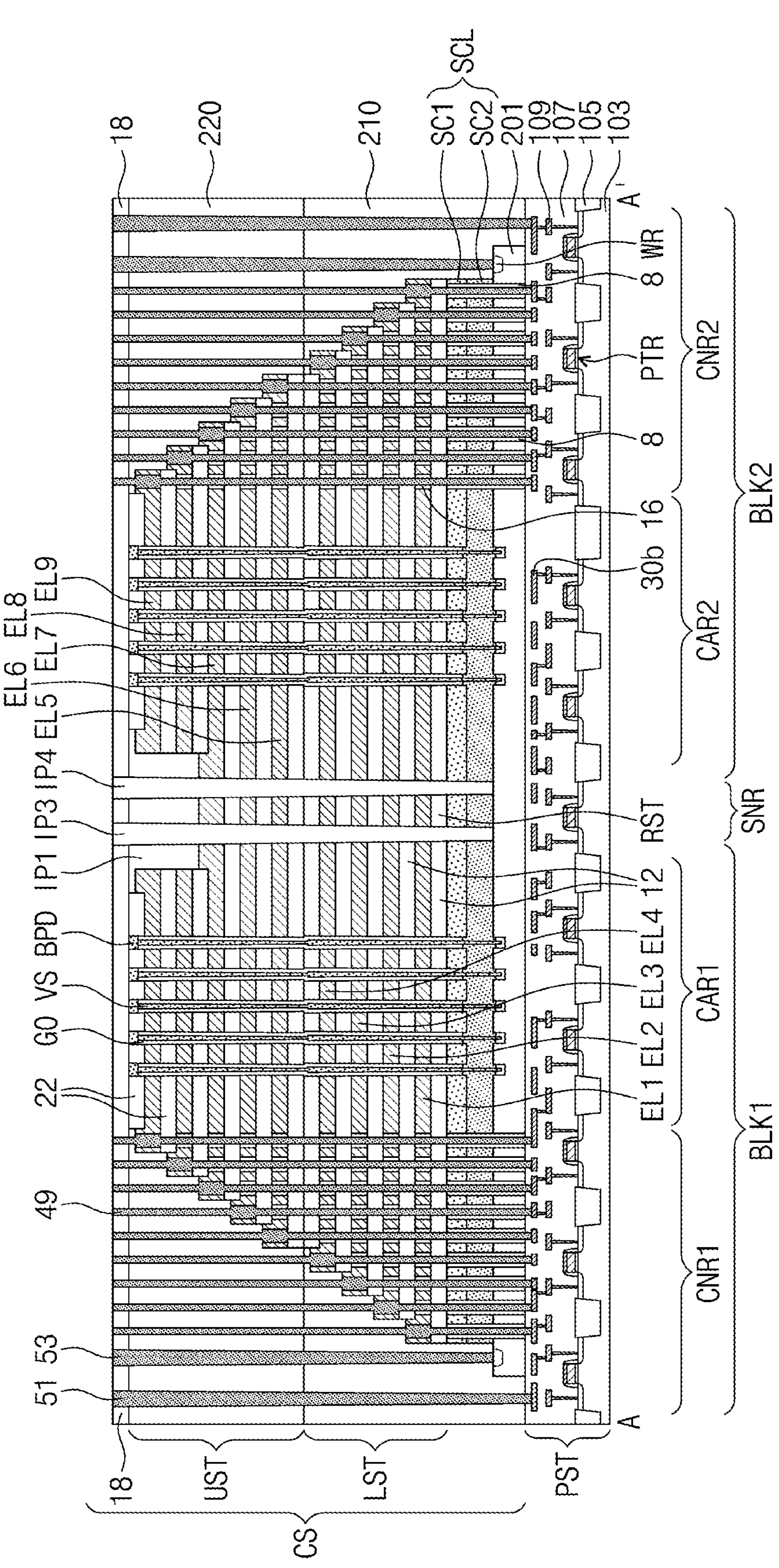
Figure 6Q:
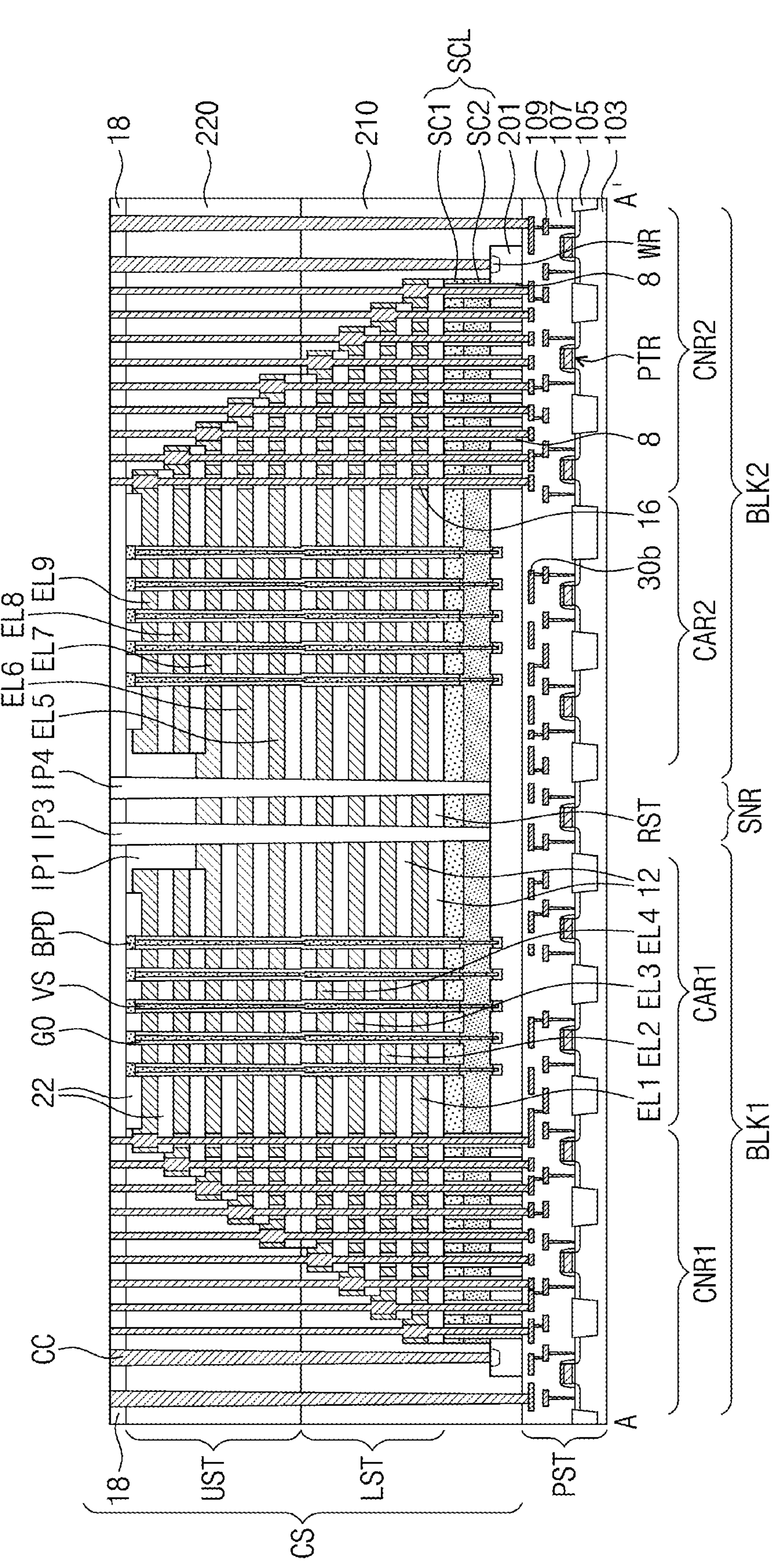

Referring to FIGS. 6P and 6Q, the cell contacts CC, the substrate connection contact WC, and the edge penetration vias ETHV may be formed by replacing the second to fourth sacrificial gapfill patterns 49, 51, and 53 with a conductive material. Thereafter, some steps may be further performed to fabricate the three-dimensional semiconductor memory device described with reference to FIGS. 2 to 4D.

Figure 8:
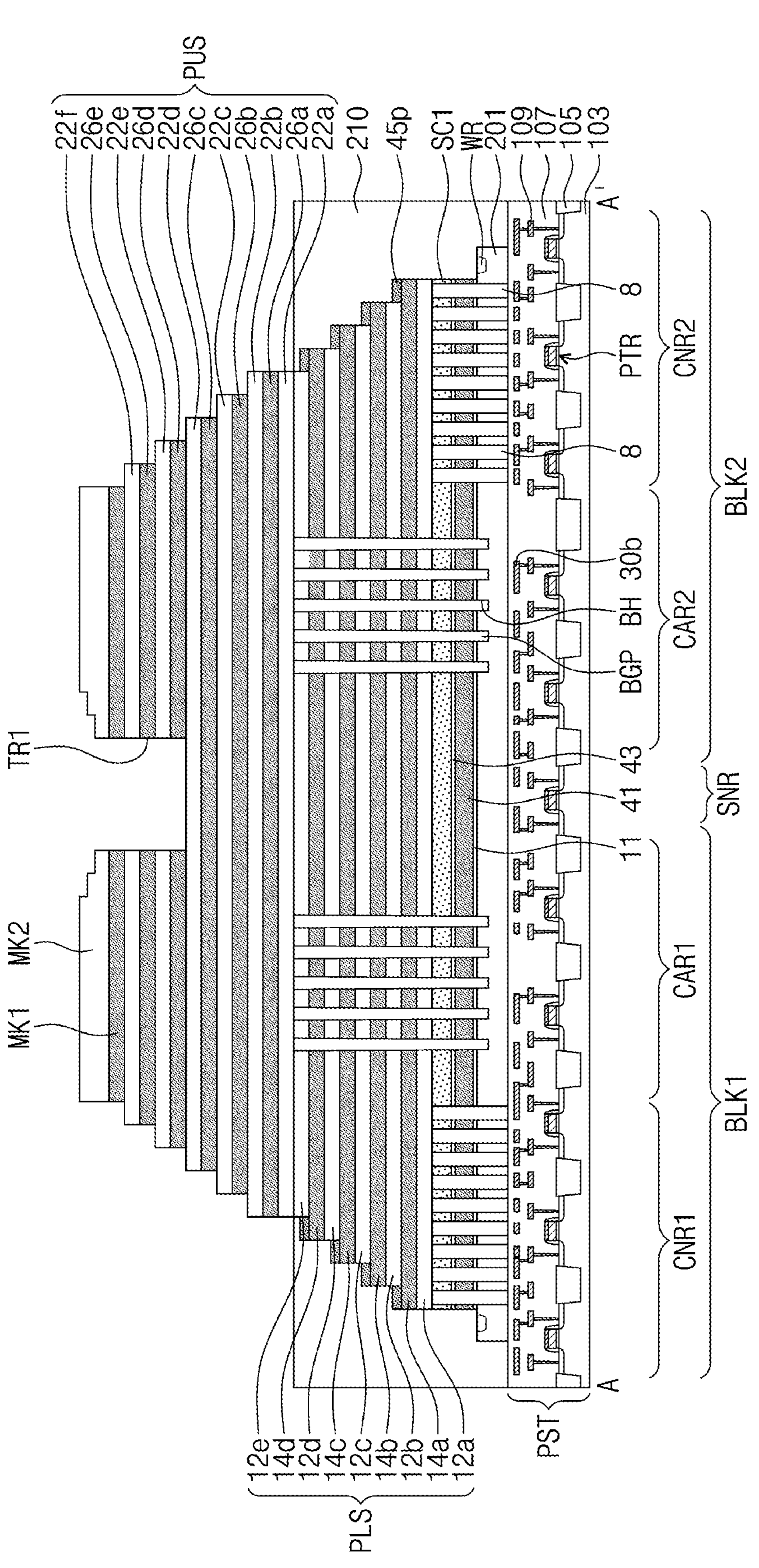
FIG. 8 is a sectional view illustrating a process of fabricating a three-dimensional semiconductor memory device having the section of FIG. 3A.

FIG. 8 is a cross-sectional view illustrating a process of fabricating a three-dimensional semiconductor memory device having the cross-section of FIG. 3A.

Referring to FIG. 8, in the fabrication method according to the present embodiment, first trimming processes and first etching processes may be alternately and repeatedly performed on a portion of the preliminary upper stack structure PUS, after the step of FIG. 6E, so a portion of the preliminary upper stack structure PUS on the separation region SNR may be removed to form the first trench TR1. Then, second trimming processes and second etching processes may be alternately and repeatedly performed on a remaining portion of the preliminary upper stack structure PUS. When the second trimming processes and the second etching processes are performed, the first trench TR1 may be filled with the photoresist pattern 46, as shown in FIG. 6G. As a result of the first trimming/etching processes or the second trimming/etching processes, the second mask pattern MK2 may be formed to have a stepwise section. The second mask pattern MK2 and the first mask pattern MK1 may be removed by the CMP process of FIGS. 6I and 6J. The remaining processes may be performed in substantially the same or similar manner as described above.

Figure 9:
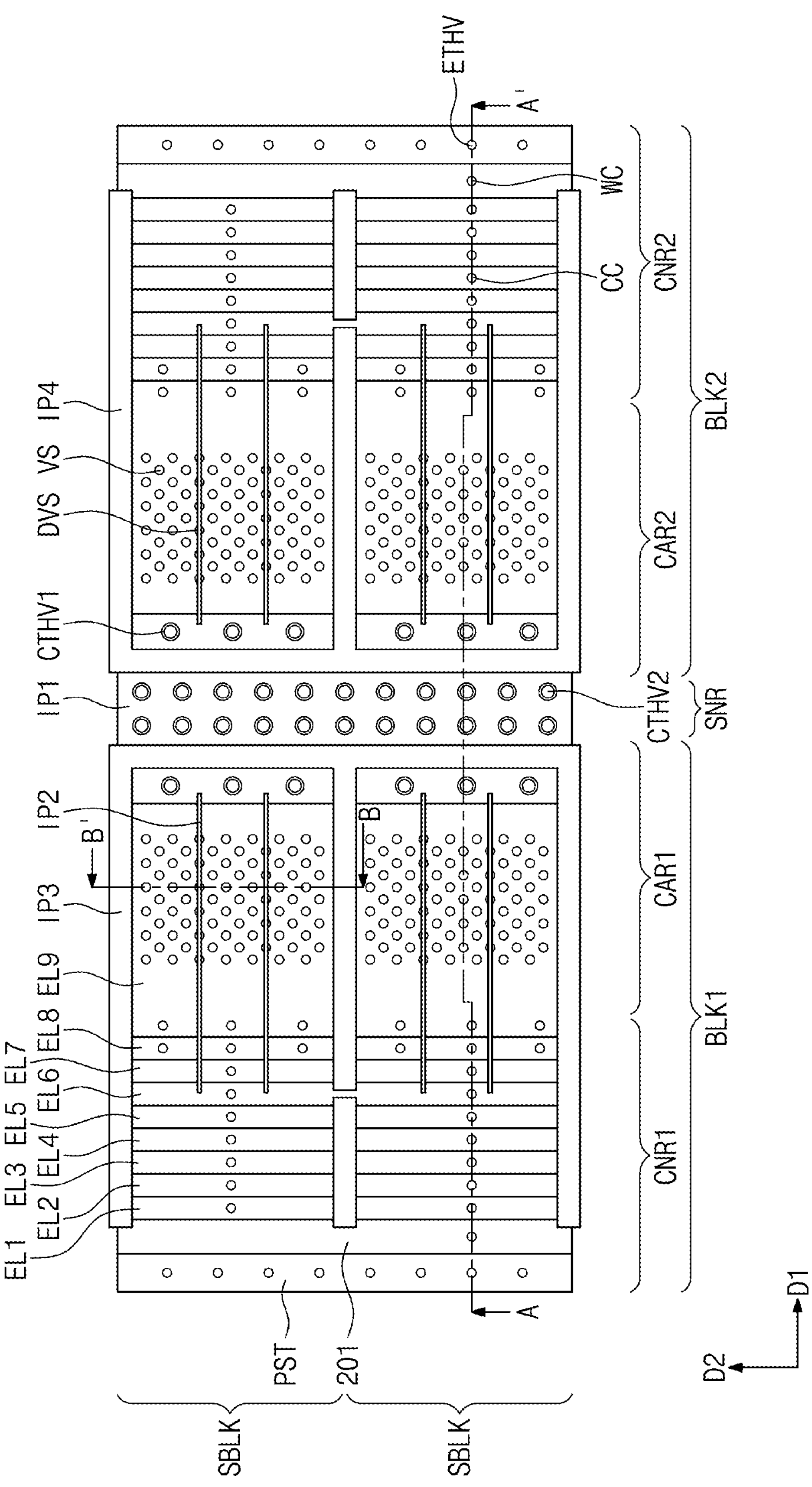
FIG. 9 is a plan view illustrating a three-dimensional semiconductor memory device according to an embodiment.
Figure 10:
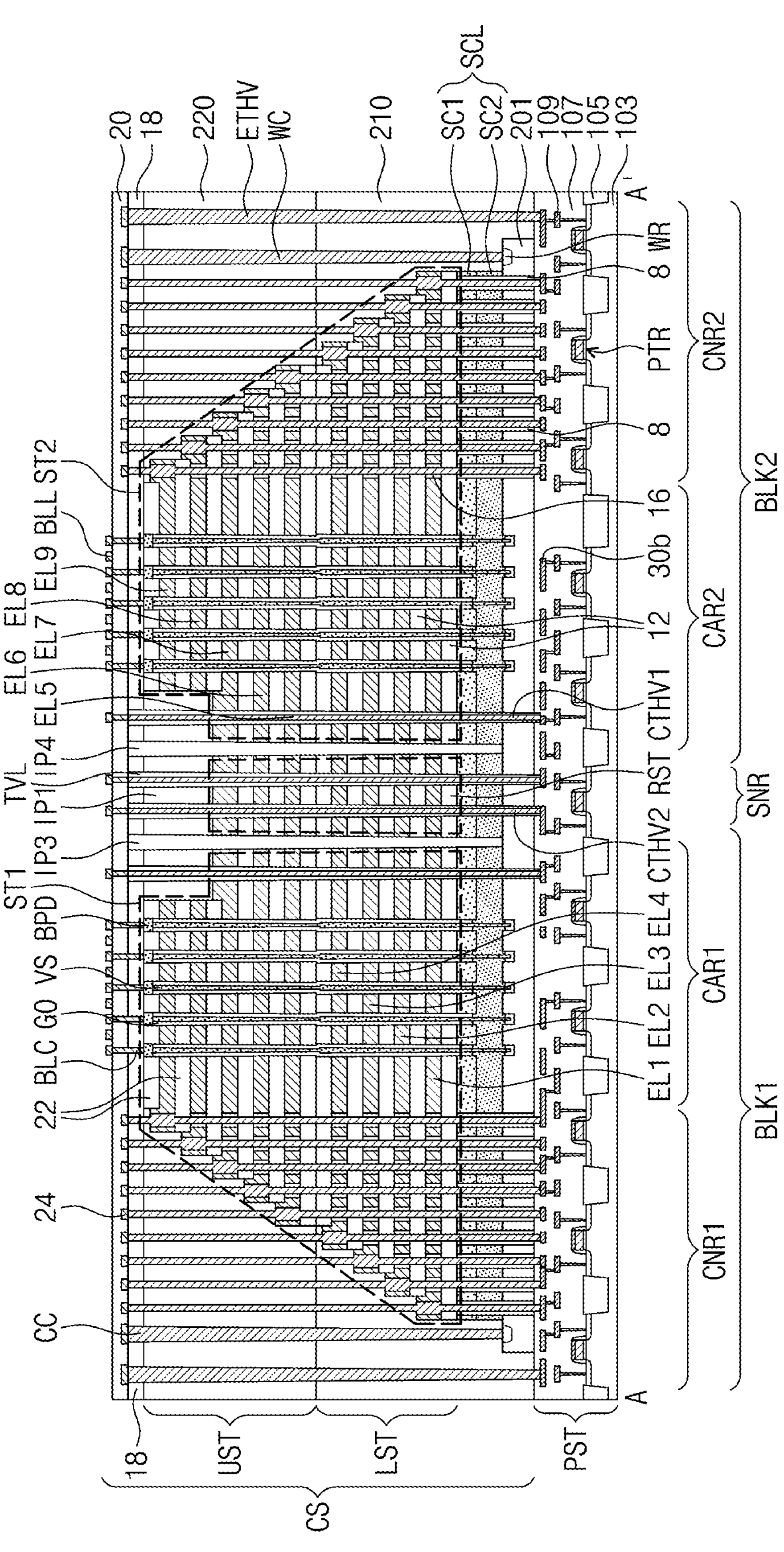
FIG. 10 is a sectional view taken along line A-A' of FIG. 9.

FIG. 9 is a plan view illustrating a three-dimensional semiconductor memory device according to an embodiment. FIG. 10 is a cross-sectional view taken along line A-A' of FIG. 9. The cross-section along line B-B' of FIG. 9 may be the same as that shown in FIG. 3B.

Referring to FIGS. 9 and 10, the three-dimensional semiconductor memory device may further include first stack penetration vias CTHV1 and second stack penetration vias CTHV2. In the cell regions CAR1 and CAR2 adjacent to the separation region SNR, the first stack penetration vias CTHV1 may penetrate the first upper interlayer insulating layer 18, the first insulating line pattern IP1, the first and second stack structures ST1 and ST2, the source structure SCL, the second substrate 201, and a portion of the peripheral interlayer insulating layer 107, and may be in contact with the peripheral conductive pads 30*b*. In the separation region SNR, the second stack penetration vias CTHV2 may penetrate the first upper interlayer insulating layer 18, the first insulating line pattern IP1, the remaining stack structure RST, the source structure SCL, the second substrate 201, and a portion of the peripheral interlayer insulating layer 107 and may be in contact with the peripheral conductive pads 30*b*. The first stack penetration vias CTHV1 and the second stack penetration vias CTHV2 may be enclosed by a via insulating layer TVL. The first stack penetration vias CTHV1 and the second stack penetration vias CTHV2 may be connected to the third conductive lines 25. Except for the afore-described features, the semiconductor memory device of FIG. 9 may have substantially the same or similar features as that described with reference to FIGS. 2 to 4D.

Figure 11:
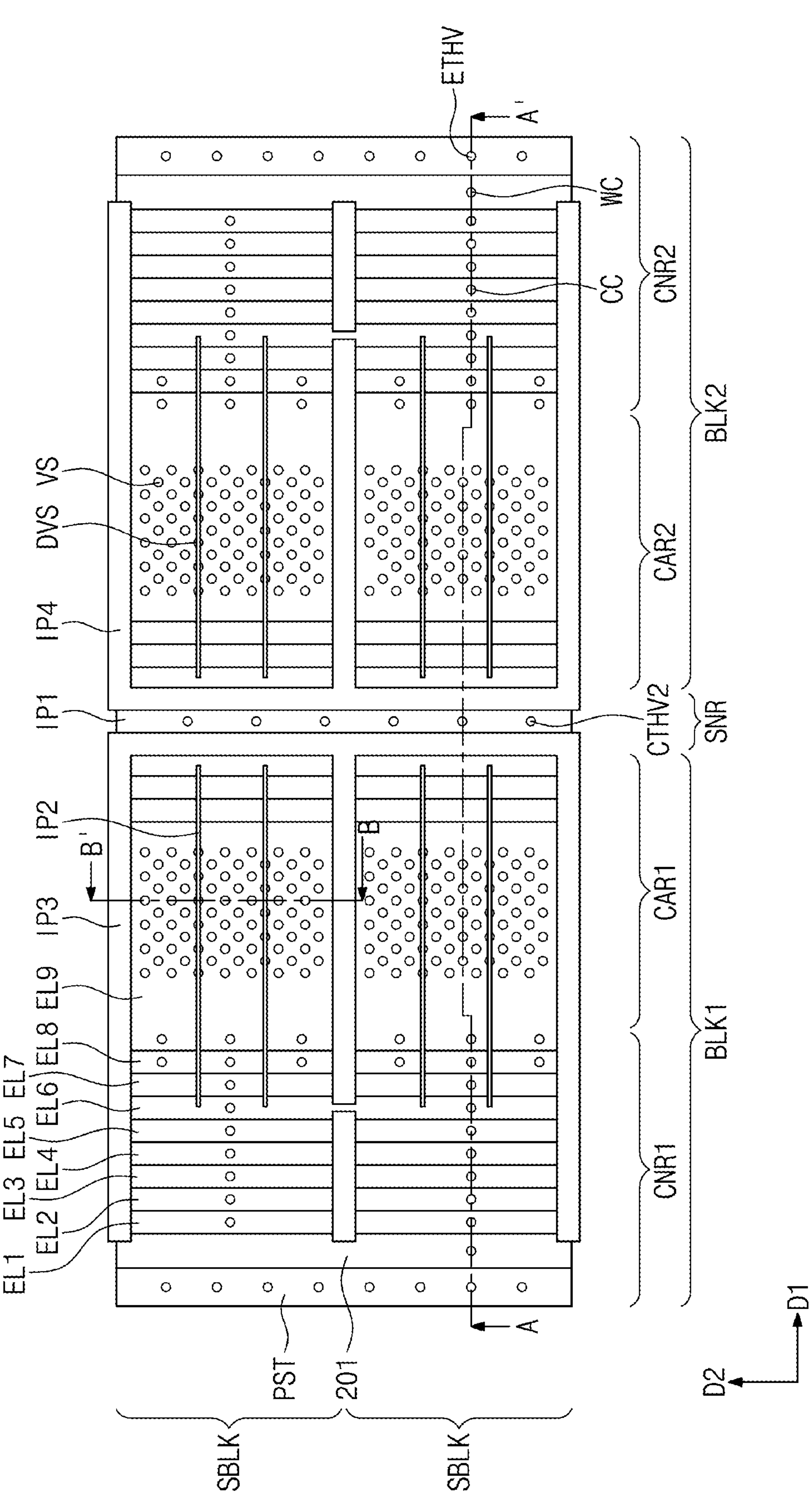
FIG. 11 is a plan view illustrating a three-dimensional semiconductor memory device according to an embodiment.
Figure 12A:
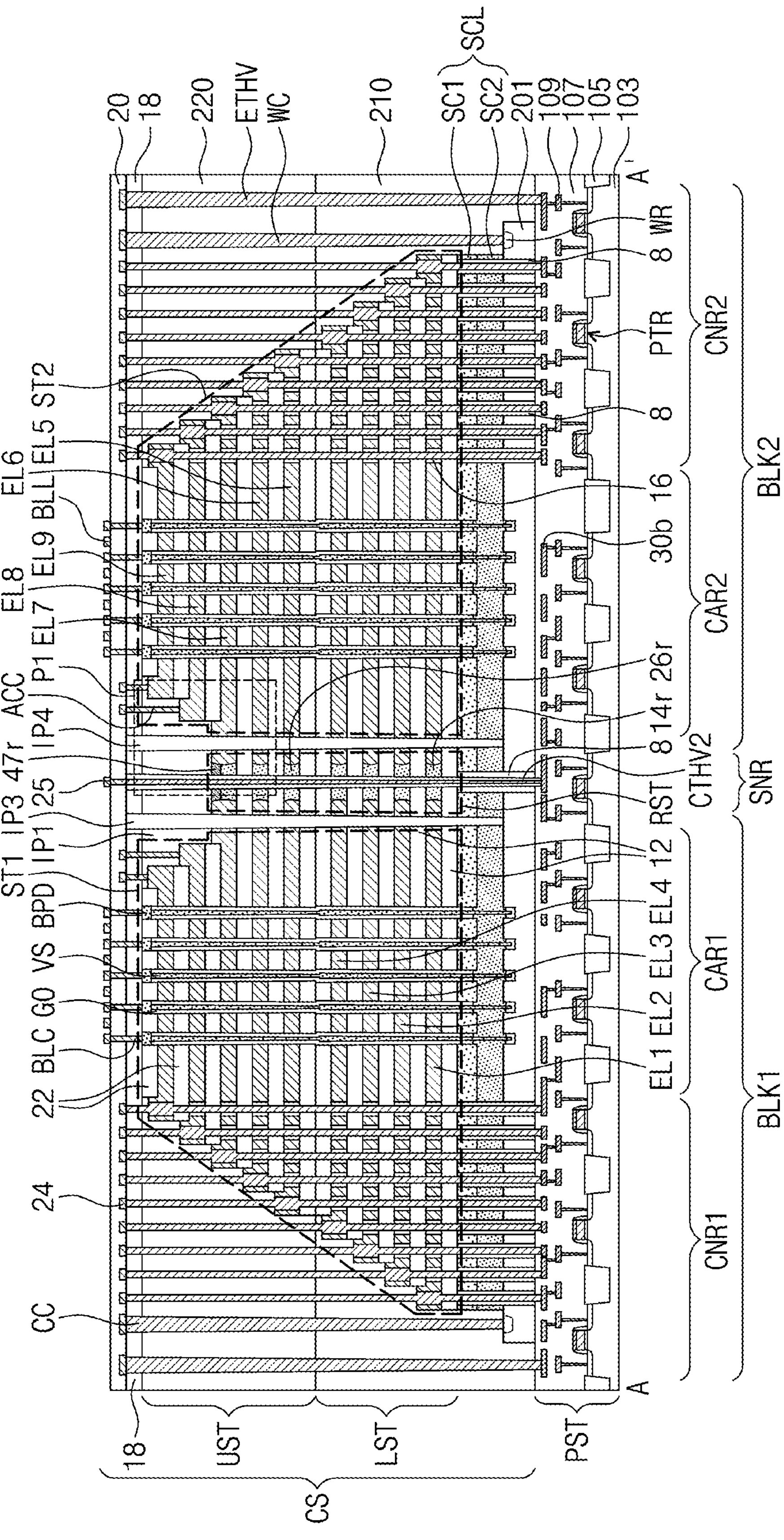
FIG. 12A is a sectional view taken along line A-A' of FIG. 11.
Figure 12B:
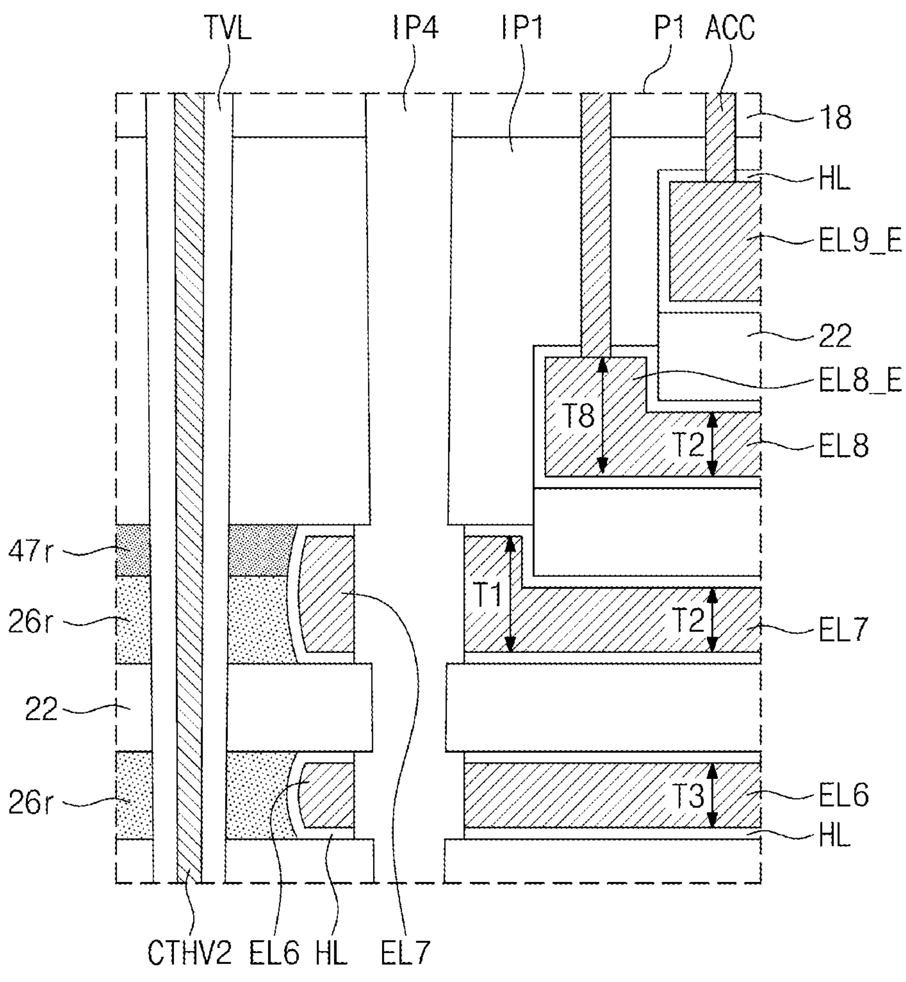
FIG. 12B is an enlarged sectional view illustrating portion 'P1' of FIG. 12A.

FIG. 11 is a plan view illustrating a three-dimensional semiconductor memory device according to an embodiment. FIG. 12A is a cross-sectional view taken along line A-A' of FIG. 11. The cross-section along line B-B' of FIG. 11 may be the same as that in FIG. 3B. FIG. 12B is an enlarged cross-sectional view of portion 'P1' of FIG. 12A.

Referring to FIGS. 11, 12A, and 12B, the first insulating line pattern IP1 may have an uneven side surface and may have a decreasing width in a downward direction. The eighth and ninth electrode layers EL8-EL9 may have end portions EL8_E and EL9_E adjacent to the separation region SNR. The end portions EL8_E and EL9_E of the eighth and ninth electrode layers EL8-EL9 may form a stepwise shape. The end portions EL8_E and EL9_E of the eighth and ninth electrode layers EL8-EL9 may have an eighth thickness T8, below the first insulating line pattern IP1. The eighth and ninth electrode layers EL8-EL9 may have the second thickness T2, between the second electrode interlayer insulating layers 22. The eighth thickness T8 may be larger than the second thickness T2. The eighth thickness T8 may be equal to the first thickness T1 of the seventh electrode layer EL7, below the first insulating line pattern IP1.

On the separation region SNR, the electrode layers EL1-EL9 may be separated from each other. First and second remaining sacrificial patterns 14*r* and 26*r* and the second preliminary remaining pad pattern 47*r* may be left on the separation region SNR. The first remaining sacrificial patterns 14*r* may be portions of the first sacrificial layers 14*a*-14*d* of FIG. 6O, and the second remaining sacrificial patterns 26*r* may be portions of the second sacrificial layers 26*a*-26*e* of FIG. 6O. The first and second remaining sacrificial patterns 14*r* and 26*r* may have concave side surfaces. The side surfaces of the first and second remaining sacrificial patterns 14*r* and 26*r* and the second preliminary remaining pad pattern 47*r* may be in contact with the high-k dielectric layer HL.

The end portions EL8_E and EL9_E of the eighth and ninth electrode layers EL8-EL9 near the separation region SNR may be in contact with auxiliary cell contacts ACC. The auxiliary cell contacts ACC may not penetrate the end portions EL8_E and EL9_E of the eighth and ninth electrode layers EL8-EL9 near the separation region SNR. The auxiliary cell contacts ACC may be provided to penetrate the high-k dielectric layer HL and to be in contact with top surfaces of the end portions EL8_E and EL9_E of the eighth and ninth electrode layers EL8-EL9.

On the separation region SNR, the substrate insulating pattern 8 may be provided to penetrate the source structure SCL and the second substrate 201 and to be in contact with the peripheral interlayer insulating layer 107. The substrate insulating pattern 8 may have a single- or multi-layered structure including at least one of, e.g., silicon oxide, silicon nitride, or silicon oxynitride. The second stack penetration vias CTHV2 may penetrate the first insulating line pattern IP1, the electrode interlayer insulating layers 12 and 22, the first and second remaining sacrificial patterns 14*r* and 26*r*, the second preliminary remaining pad pattern 47*r*, the substrate insulating pattern 8, and a portion of the peripheral interlayer insulating layer 107 and may be in contact with the peripheral conductive pads 30*b*. The second stack penetration vias CTHV2 may be enclosed by the via insulating layer TVL. The first stack penetration vias CTHV1 and the second stack penetration vias CTHV2 may be connected to the third conductive lines 25. Except for the afore-described features, the semiconductor memory device may have substantially the same or similar features as that described with reference to FIGS. 2 to 4D.

Figure 13:
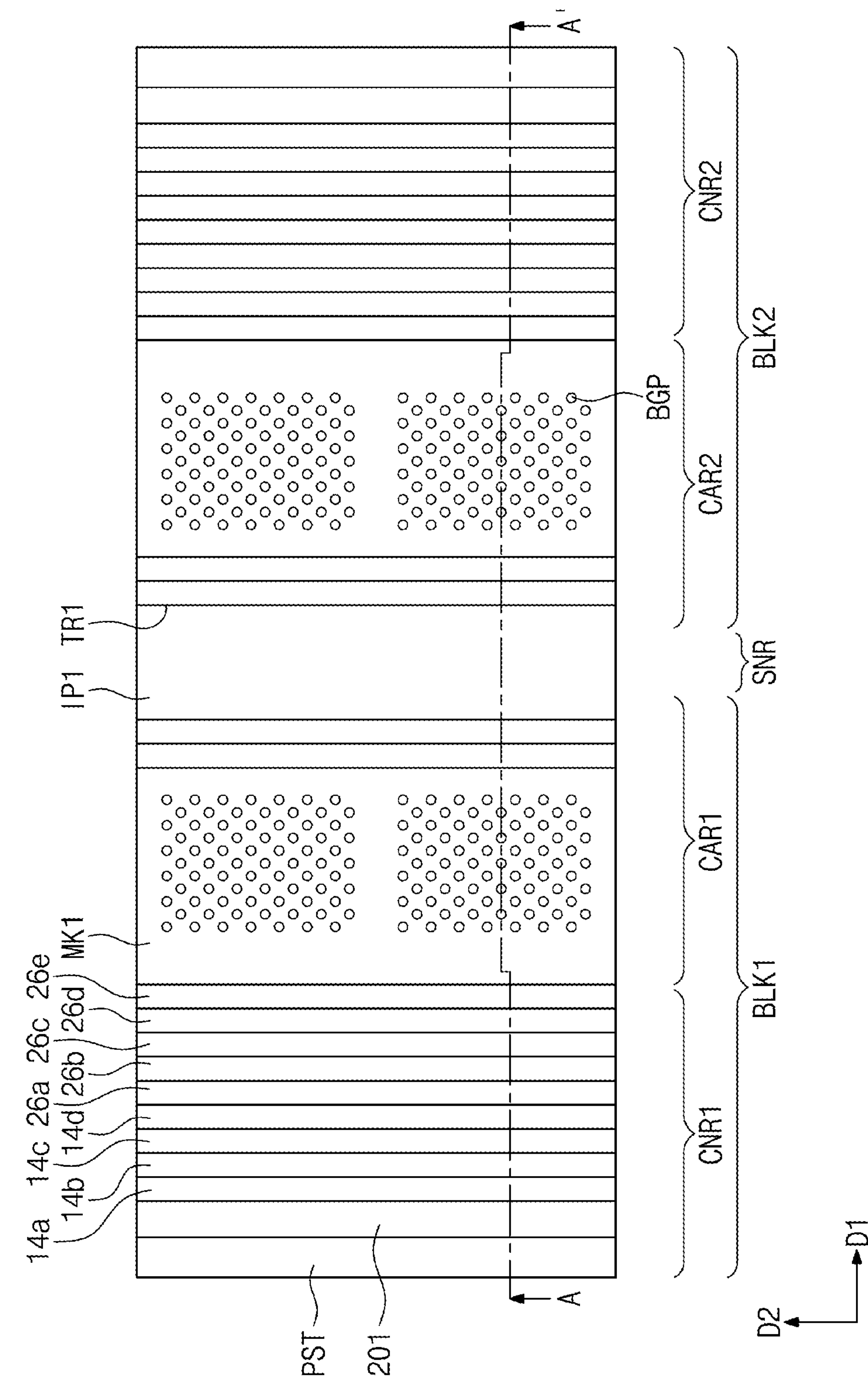
FIG. 13 is a plan view illustrating a process of fabricating a three-dimensional semiconductor memory device having the plan view of FIG. 11.
Figure 14A:
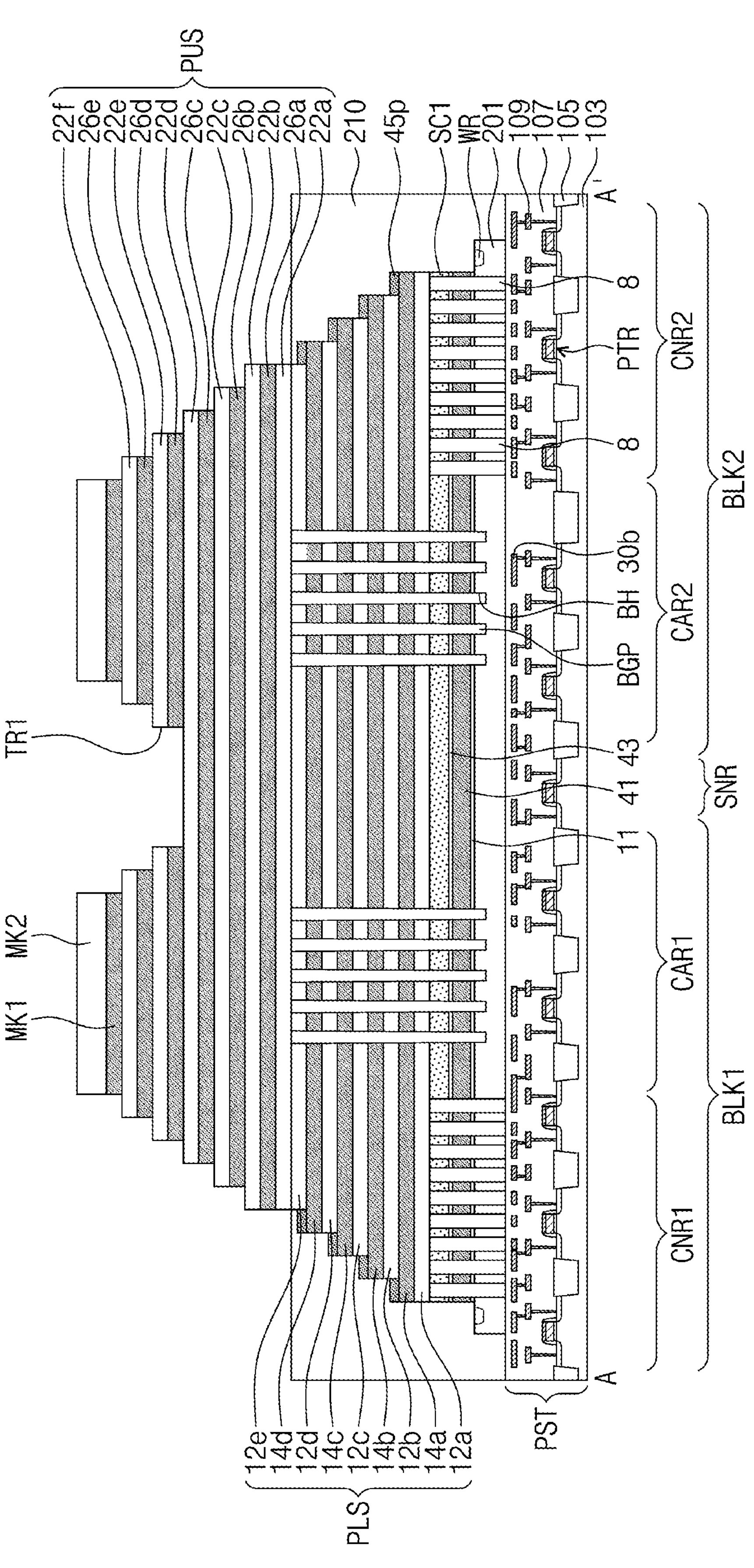
FIGS. 14A to 14C are sectional views illustrating stages in a process of fabricating the three-dimensional semiconductor memory device of FIG. 12A.
Figure 14B:
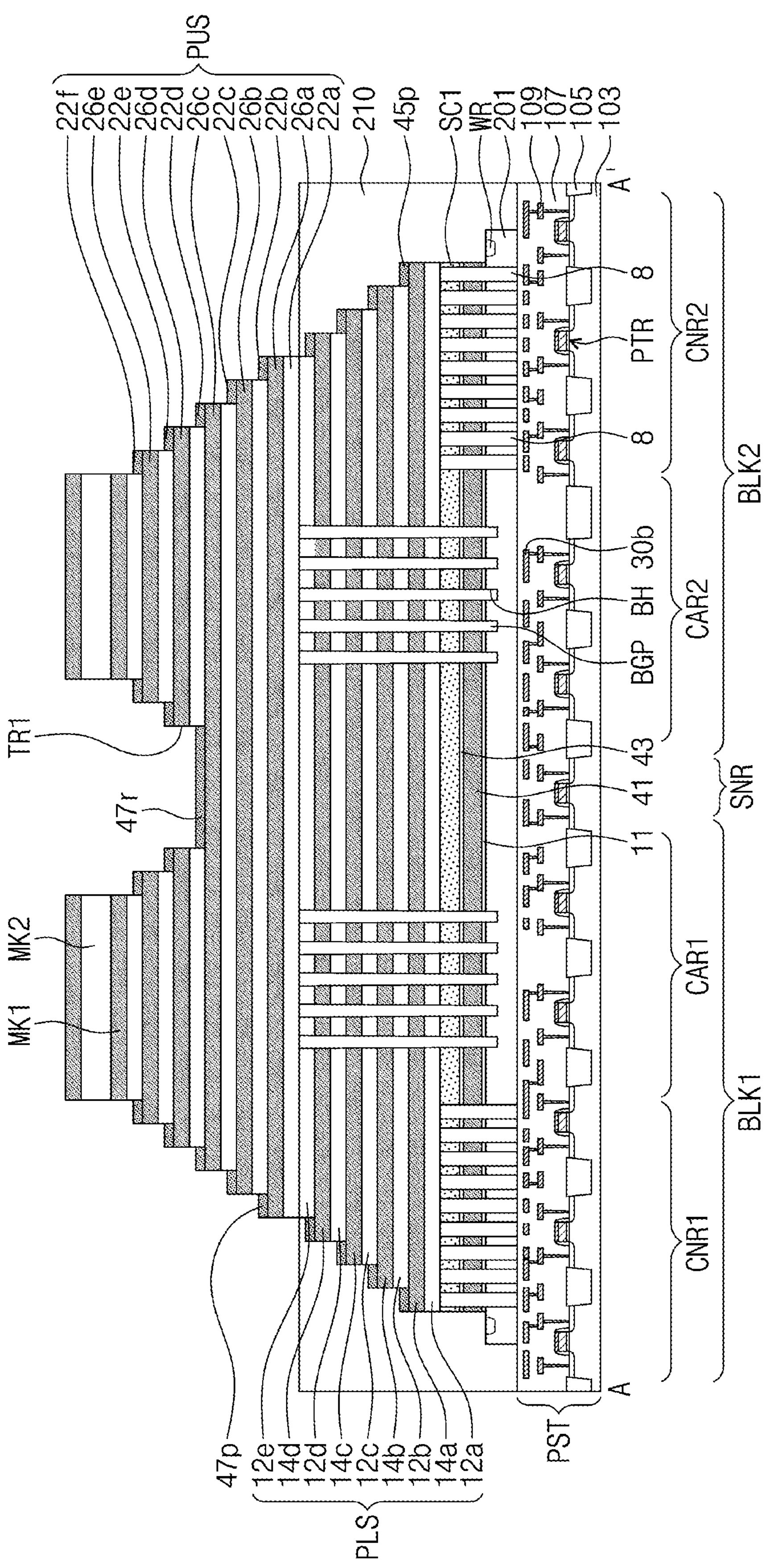
Figure 14C:
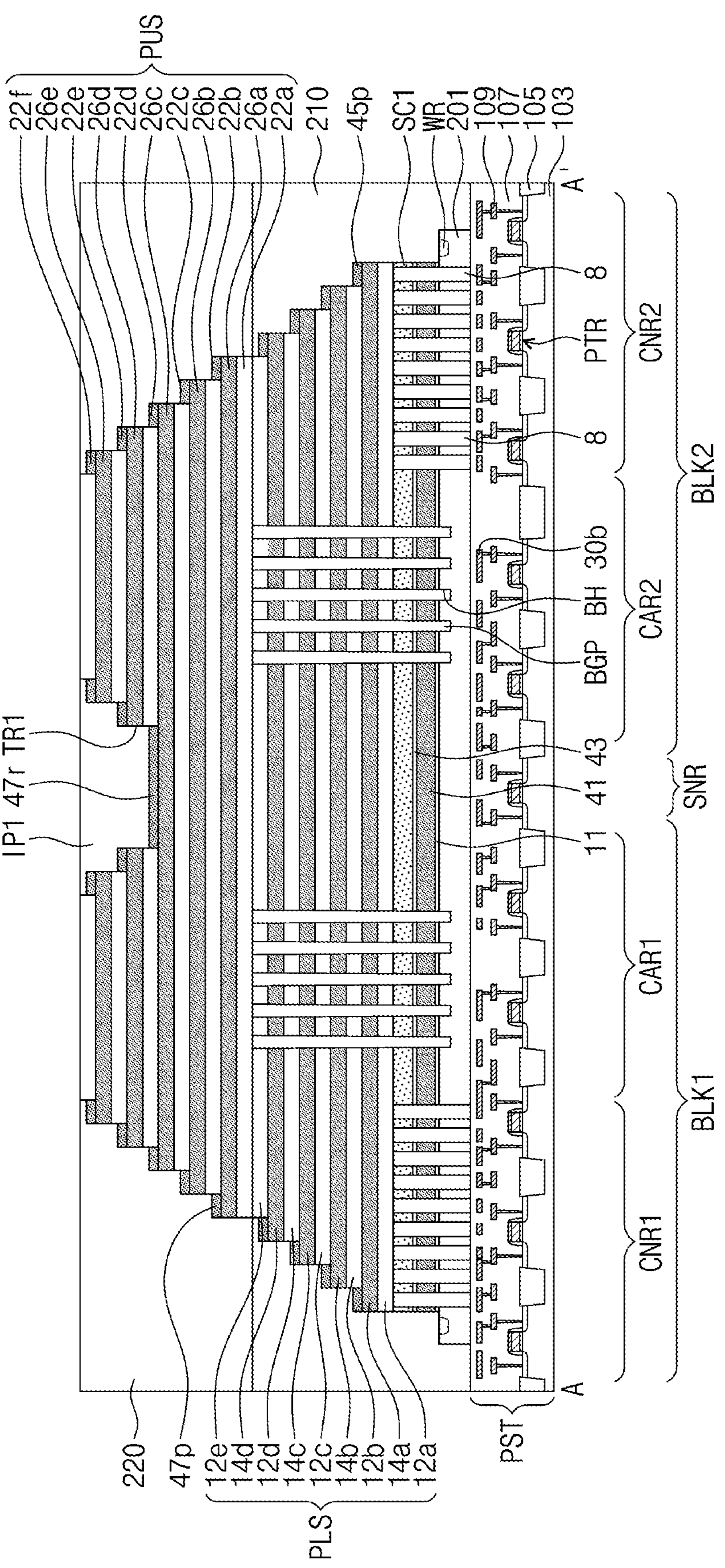

FIG. 13 is a plan view of a process of fabricating a three-dimensional semiconductor memory device having the plan view of FIG. 11. FIGS. 14A to 14C are cross-sectional views of stages in a process of fabricating a three-dimensional semiconductor memory device having the cross-section of FIG. 12A. FIG. 14A is a sectional view taken along line A-A' of FIG. 13.

Referring to FIGS. 13 and 14A, after the step of FIG. 6E, a first photoresist pattern (not shown) may be formed on the preliminary upper stack structure PUS. First trimming processes and first etching processes may be alternately repeated on a portion of the preliminary upper stack structure PUS using the first photoresist pattern. Here, during the processes, the preliminary upper stack structure PUS on the separation region may not be exposed by the first photoresist pattern. As the first trimming processes are repeated, a size of the first photoresist pattern may decrease, and since the first etching processes are performed using such a first photoresist pattern, an inner side surface of the first trench TR1 may be formed to have a stepwise shape. In other words, some (e.g., 26*d* and 26*e*) of the third sacrificial layers 26*a*-26*e* may be formed to have protruding end portions, near the separation region SNR.

The first photoresist pattern may be removed, and then, a second photoresist pattern may be formed on the preliminary upper stack structure PUS. The second photoresist pattern may be formed to fill the first trench TR1, to cover the cell regions CAR1 and CAR2, and to expose the connection regions CNR1 and CNR2. Second trimming processes and second etching processes may be alternately and repeatedly performed on a remaining portion of the preliminary upper stack structure PUS, using the second photoresist pattern. As a result of the first trimming/etching processes and the second trimming/etching processes, the end portions of the second electrode interlayer insulating layers 22*a*-22*e* in the preliminary upper stack structure PUS may be exposed to the outside, near the third sacrificial layers 26*a*-26*e*.

Referring to FIG. 14B, an etching process may be performed to remove the exposed end portions of the second electrode interlayer insulating layers 22*a*-22*e*, which are located near the end portions of the third sacrificial layers 26*a*-26*e*, and as a result, the end portions of the third sacrificial layers 26*a*-26*e* may be exposed to the outside. A second preliminary pad layer may be formed on the preliminary upper stack structure PUS. The second preliminary pad layer may be formed by a deposition process (e.g., a PVD, LPCVD, or sputtering process) having a poor step coverage property. The second preliminary pad layer may be formed of or include the same material (e.g., silicon nitride) as the third sacrificial layers 26*a*-26*e*. An anisotropic etching process may be performed on the second preliminary pad layer to form the second preliminary pad patterns 47*p* on the end portions of the third sacrificial layers 26*a*-26*e* in the connection regions CNR1 and CNR2. The second preliminary pad patterns 47*p* may also be formed on the third sacrificial layers 26*d* and 26*e* exposed through the first trench TR1. In addition, the second preliminary remaining pad pattern 47*r* may be formed on a bottom of the first trench TR1. The second preliminary remaining pad pattern 47$r$ may be in contact with a top surface of one (e.g., 26$c$) of the third sacrificial layers 26$a$-26$e$.

Referring to FIGS. 14B and 14C, the second planarization insulating layer 220 may be formed on the preliminary upper stack structure PUS and the second mask patterns MK2, and then, a CMP process may be performed to remove the first and second mask patterns MK1 and MK2 and to expose the top surface of the preliminary upper stack structure PUS. Here, a portion of the second planarization insulating layer 220 may be formed to fill the first trench TR1 and may be used as the first insulating line pattern IP1. The first insulating line pattern IP1 may have a top surface that is coplanar with the top surface of the preliminary upper stack structure PUS. Thereafter, the processes described with reference to FIGS. 5G to 5I, 6K to 6Q, and 7 may be performed.

Figure 15A:
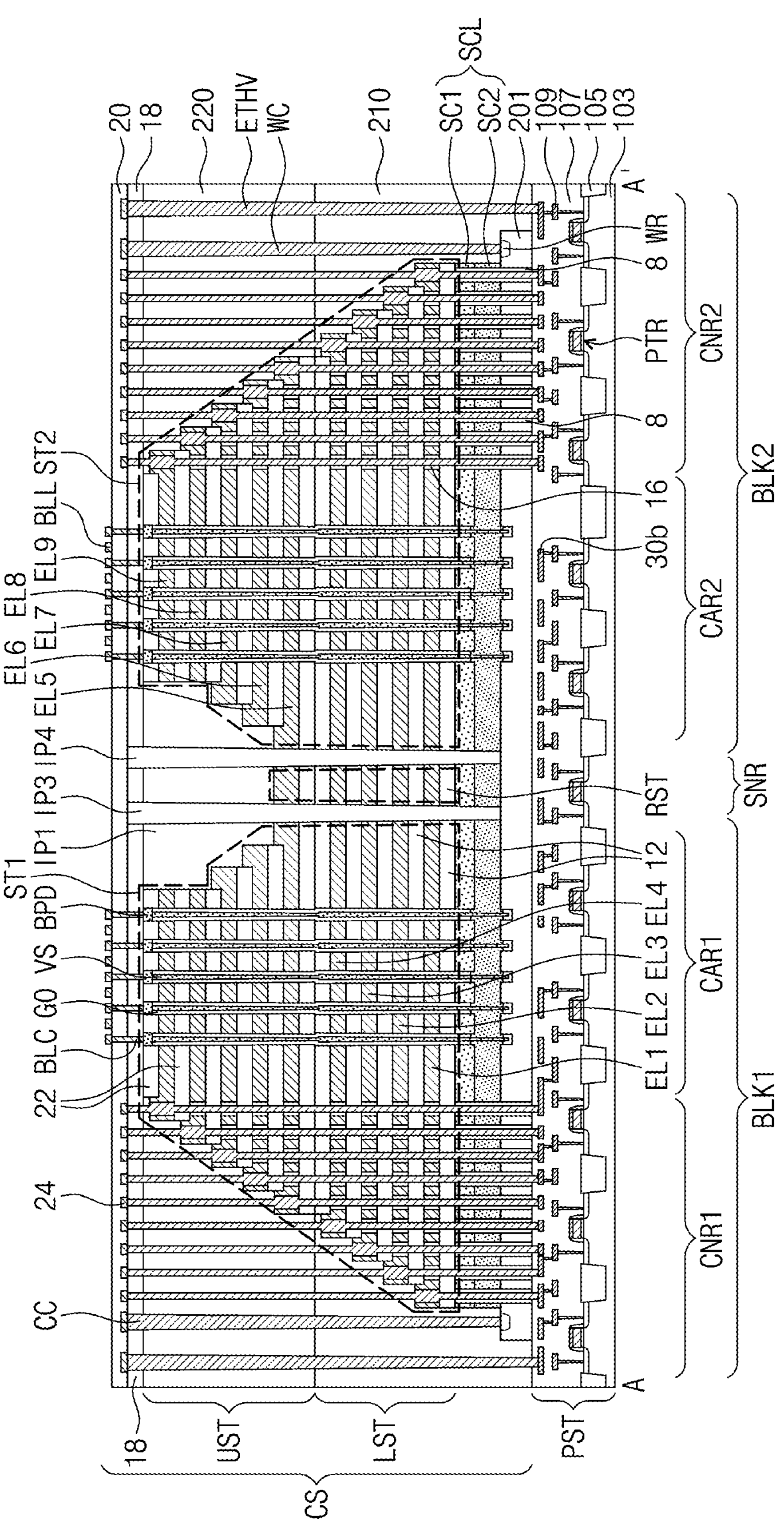
FIGS. 15A and 15B are sectional views illustrating a three-dimensional semiconductor memory device, according to an embodiment.
Figure 15B:
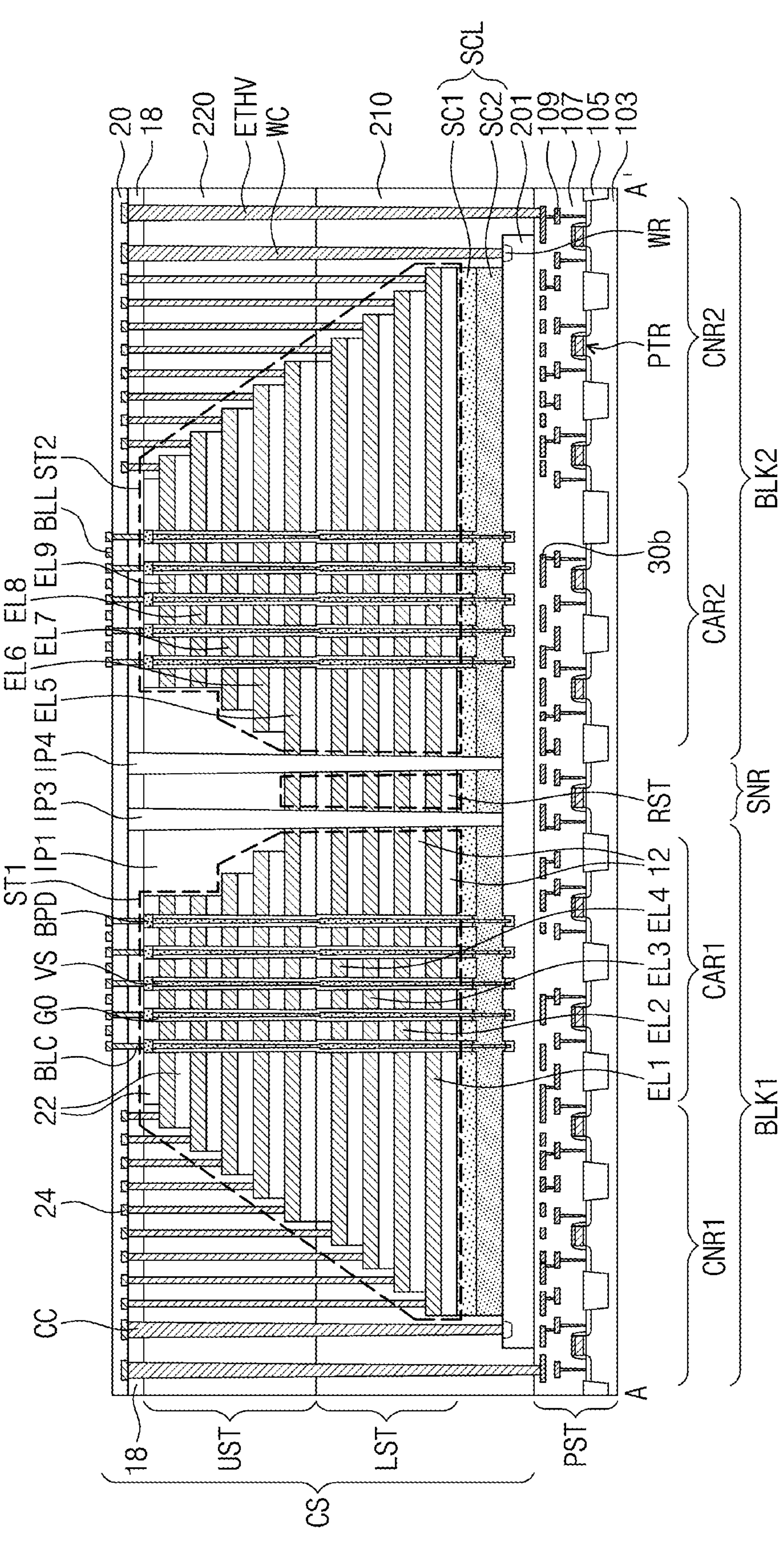

FIGS. 15A and 15B are cross-views illustrating a three-dimensional semiconductor memory device, according to an embodiment.

Referring to FIG. 15A, in the three-dimensional semiconductor memory device according to the present embodiment, the eighth and ninth electrode layers EL8 and EL9 adjacent to the separation region SNR may have side surfaces that are aligned to each other. However, end portions of the sixth and seventh electrode layers EL6 and EL7 adjacent to the separation region SNR may protrude laterally and may form a stepwise shape. Below the first insulating line pattern IP1, the end portions of the sixth and seventh electrode layers EL6 and EL7 adjacent to the separation region SNR may have the eighth thickness described with reference to FIG. 12B. On the separation region SNR, the fifth electrode layer EL5 may have the first thickness described with reference to FIG. 4A or 12B.

Referring to FIG. 15B, the electrode layers EL1-EL9 may have a substantially uniform thickness. The cell contacts CC may not penetrate the electrode layers EL1-EL9. In the connection regions CNR1 and CNR2, the cell contacts CC may be in contact with the top surfaces of the end portions of the electrode layers EL1-EL9. Except for the afore-described features, the semiconductor memory device may have substantially the same or similar features as those in the previous embodiments.

In an embodiment, the cell contacts CC may have a shape penetrating the electrode layers EL1-EL9, as described with reference to FIGS. 3A to 4C, or may have a shape, which does not penetrate the electrode layers EL1-EL9 and is in contact with top surfaces of the electrode layers EL1-EL9, as shown in FIG. 15B.

Figure 16:
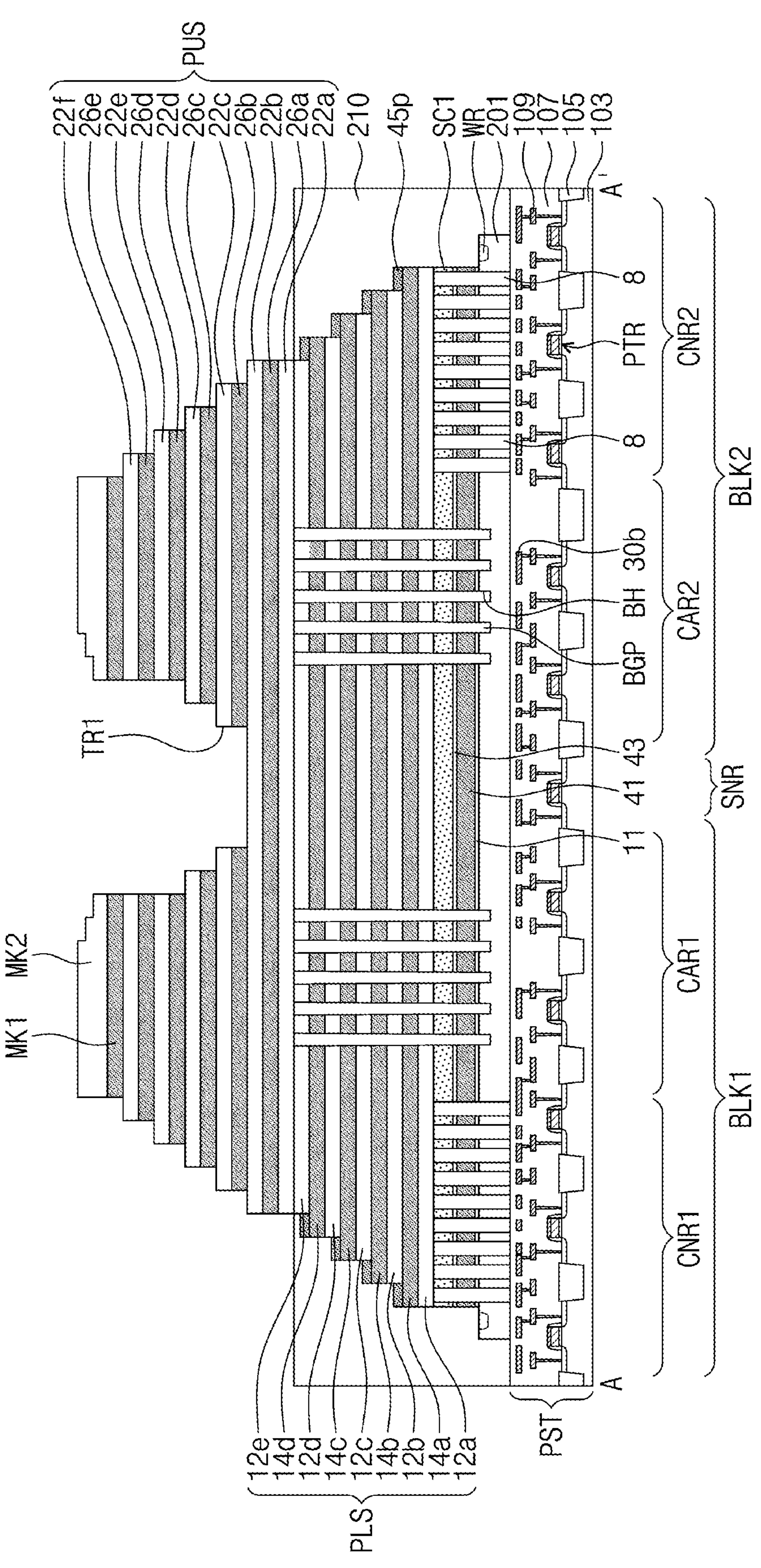
FIG. 16 is a sectional view illustrating a process of fabricating a three-dimensional semiconductor memory device having the section of FIG. 15.

FIG. 16 is a cross-sectional view illustrating a process of fabricating a three-dimensional semiconductor memory device having the cross-sections of FIGS. 15A and 15B.

Referring to FIG. 16, first trimming processes and first etching processes may be alternately and repeatedly performed on a portion of the preliminary upper stack structure PUS, after the step of FIG. 6E, a portion of the preliminary upper stack structure PUS on the separation region SNR may be removed to form the first trench TR1, and then, second trimming processes and second etching processes may be alternately and repeatedly performed on a remaining portion of the preliminary upper stack structure PUS. As a result of the first trimming/etching processes or the second trimming/etching processes, the second mask pattern MK2 may be formed to have a stepwise section. A lower inner side surface of the first trench TR1 may be formed to have an uneven shape. The second electrode interlayer insulating layers 22$b$ and 22$c$ forming the lower inner side surface of the first trench TR1 may include protruding end portions forming a stepwise shape. The second mask pattern MK2 and the first mask pattern MK1 may be removed by the CMP process of FIGS. 6I and 6J. The remaining processes may be performed in substantially the same or similar manner as described above.

In a method of fabricating the three-dimensional semiconductor memory device of FIG. 15B, steps of forming the substrate insulating pattern 8 of FIG. 6A and forming the preliminary pad patterns 45$p$ and 47$p$ of FIGS. 6C and 6I may be omitted.

Figure 17:
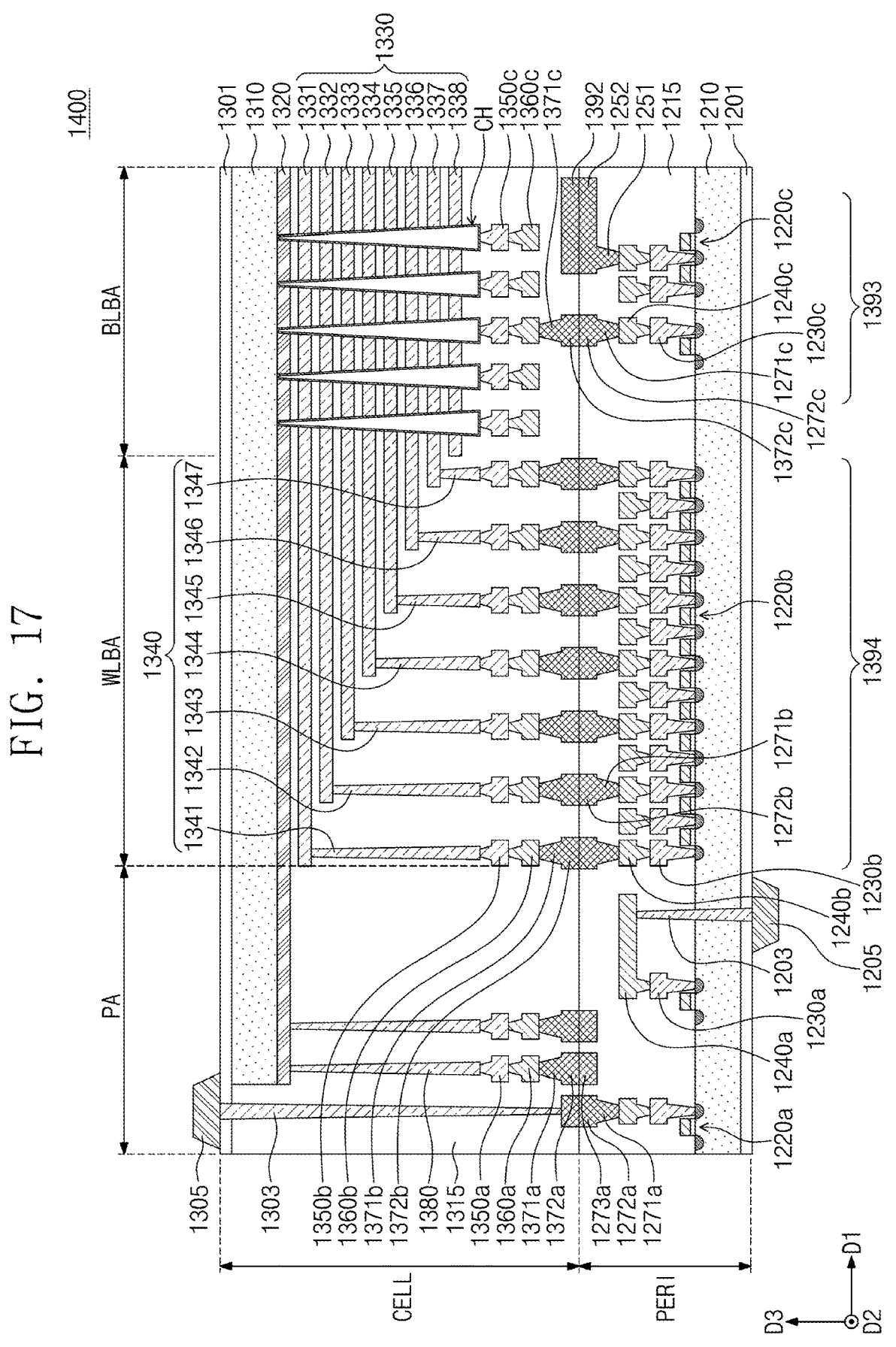

FIG. 17 is a cross-sectional view illustrating a semiconductor device according to an embodiment.

Referring to FIG. 17, a memory device 1400 may have a chip-to-chip (C2C) structure. For the C2C structure, an upper chip including a cell array structure CELL may be fabricated on a first wafer, a lower chip including a peripheral circuit structure PERI may be fabricated on a second wafer different from the first wafer, and the upper chip and the lower chip may be connected to each other in a bonding manner. The bonding manner may mean a way of electrically connecting a bonding metal formed in the uppermost metal layer of the upper chip to a bonding metal formed in the uppermost metal layer of the lower chip. For example, in the case where the bonding metal is formed of copper (Cu), the bonding manner may be a Cu-to-Cu bonding manner, but in an embodiment, aluminum (Al) or tungsten (W) may be used as the bonding metal.

Each of the peripheral circuit structure PERI and the cell array structure CELL of the memory device 1400 may include an outer pad bonding region PA, a word line bonding region WLBA, and a bit line bonding region BLBA.

The peripheral circuit structure PERI may include a first substrate 1210, an interlayer insulating layer 1215, a plurality of circuit devices 1220$a$, 1220$b$, and 1220$c$ formed on the first substrate 1210, first metal layers 1230$a$, 1230$b$, and 1230$c$ connected to the circuit devices 1220$a$, 1220$b$, and 1220$c$, respectively, and second metal layers 1240$a$, 1240$b$, and 1240$c$ formed on the first metal layers 1230$a$, 1230$b$, and 1230$c$. In an embodiment, the first metal layers 1230$a$, 1230$b$, and 1230$c$ may be formed of or include a material (e.g., tungsten) having relatively high electric resistivity, and the second metal layers 1240$a$, 1240$b$, and 1240$c$ may be formed of or include a material (e.g., copper) having relatively low electric resistivity.

Although only the first metal layers 1230$a$, 1230$b$, and 1230$c$ and the second metal layers 1240$a$, 1240$b$, and 1240$c$ are illustrated and described in the present specification, at least one metal layer may be further formed on the second metal layers 1240$a$, 1240$b$, and 1240$c$. At least one of the additional metal layers, which are formed on the second metal layers 1240$a$, 1240$b$, and 1240$c$, may be formed of a material (e.g., aluminum), which has lower electric resistivity than the material (e.g., copper) of the second metal layers 1240$a$ to 1240$c$.

The interlayer insulating layer 1215 may be disposed on the first substrate 1210 to cover the circuit devices 1220$a$, 1220$b$, and 1220$c$, the first metal layers 1230$a$, 1230$b$, and 1230$c$, and the second metal layers 1240$a$, 1240$b$, and 1240$c$ and may be formed of or include at least one of insulating materials (e.g., silicon oxide and silicon nitride).

Lower bonding metals 1271$b$ and 1272$b$ may be formed on the second metal layer 1240$b$ of the word line bonding region WLBA. In the word line bonding region WLBA, the lower bonding metals 1271$b$ and 1272$b$ of the peripheral circuit structure PERI may be electrically connected to upper bonding metals 1371$b$ and 1372$b$ of the cell array structure CELL in a bonding manner, and the lower bonding metals 1271*b* and 1272*b* and the upper bonding metals 1371*b* and 1372*b* may be formed of or include at least one of aluminum, copper, or tungsten.

The cell array structure CELL may correspond to the cell array structure CS described with reference to FIGS. 2 to 15B. The cell array structure CELL may include at least one memory block. The cell array structure CELL may include a second substrate 1310 and a common source line 1320. A plurality of word lines 1331-1338 (1330) may be stacked on the second substrate 1310 in a direction (e.g., a z-axis direction) that is perpendicular to a top surface of the second substrate 1310. String selection lines and a ground selection line may be respectively disposed on and below the word lines 1330; that is, the word lines 1330 may be disposed between the string selection lines and the ground selection line.

In the bit line bonding region BLBA, a channel structure CH may be provided to extend in the direction (e.g., the z-axis direction) perpendicular to a top surface of the second substrate 1310 and to penetrate the word lines 1330, the string selection lines, and the ground selection line. The channel structure CH may include a data storage layer, a channel layer, and an insulating gapfill layer, and the channel layer may be electrically connected to a first metal layer 1350*c* and a second metal layer 1360*c*. For example, the first metal layer 1350*c* may be a bit line contact, and the second metal layer 1360*c* may be a bit line. In an embodiment, the bit line 1360*c* may extend in a first direction (e.g., a y-axis direction) parallel to the top surface of the second substrate 1310.

In an embodiment shown in FIG. 17, a region provided with the channel structure CH and the bit line 1360*c* may be defined as the bit line bonding region BLBA. In the bit line bonding region BLBA, the bit lines 1360*c* may be electrically connected to the circuit devices 1220*c*, which are provided in the peripheral circuit structure PERI to constitute a page buffer 1393. As an example, the bit lines 1360*c* may be connected to the peripheral circuit structure PERI through upper bonding metals 1371*c* and 1372*c*, and the upper bonding metals 1371*c* and 1372*c* may be connected to lower bonding metals 1271*c* and 1272*c*, which are connected to the circuit devices 1220*c* of the page buffer 1393.

In the word line bonding region WLBA, the word lines 1330 may extend in a second direction (e.g., an x-axis direction), which is perpendicular to the first direction and is parallel to the top surface of the second substrate 1310, and may be connected to a plurality of cell contact plugs 1341-1347 (1340). The cell contact plugs 1341-1347 or 1340 may have the same shape as the cell contacts CC of FIG. 3A.

The cell contact plugs 1340 may be connected to pads of the word lines 1330, which extend to have different lengths from each other in the second direction. A first metal layer 1350*b* and a second metal layer 1360*b* may be sequentially connected to upper portions of the cell contact plugs 1340 connected to the word lines 1330. In the word line bonding region WLBA, the cell contact plugs 1340 may be connected to the peripheral circuit structure PERI through the upper bonding metals 1371*b* and 1372*b* of the cell array structure CELL and the lower bonding metals 1271*b* and 1272*b* of the peripheral circuit structure PERI.

In the peripheral circuit structure PERI, the cell contact plugs 1340 may be electrically connected to the circuit devices 1220*b* constituting a row decoder 1394. In an embodiment, an operation voltage of the circuit devices 1220*b* constituting the row decoder 1394 may be different from an operation voltage of the circuit devices 1220*c* constituting the page buffer 1393. As an example, the operation voltage of the circuit devices 1220*c* constituting the page buffer 1393 may be higher than the operation voltage of the circuit devices 1220*b* constituting the row decoder 1394.

A common source line contact plug 1380 may be disposed in the outer pad bonding region PA. The common source line contact plug 1380 may be formed of a conductive material (e.g., metals, metal compounds, or polysilicon) and may be electrically connected to the common source line 1320. A first metal layer 1350*a* and a second metal layer 1360*a* may be sequentially stacked on the common source line contact plug 1380. A region, in which the common source line contact plug 1380, the first metal layer 1350*a*, and the second metal layer 1360*a* are provided, may be defined as the outer pad bonding region PA.

Meanwhile, input/output pads 1205 and 1305 may be disposed in the outer pad bonding region PA. Referring to FIG. 17, a lower insulating layer 1201 may be formed below the first substrate 1210 to cover the bottom surface of the first substrate 1210, and a first input/output pad 1205 may be formed on the lower insulating layer 1201. The first input/output pad 1205 may be connected to at least one of the circuit devices 1220*a*, 1220*b*, and 1220*c* of the peripheral circuit structure PERI through a first input/output contact plug 1203 and may be separated from the first substrate 1210 by the lower insulating layer 1201. In addition, a sidewall insulating layer (not shown) may be disposed between the first input/output contact plug 1203 and the first substrate 1210 to electrically separate the first input/output contact plug 1203 from the first substrate 1210.

Referring to FIG. 17, an upper insulating layer 1301 may be formed on the second substrate 1310 to cover the top surface of the second substrate 1310, and a second input/output pad 1305 may be disposed on the upper insulating layer 1301. The second input/output pad 1305 may be connected to at least one of the circuit devices 1220*a*, 1220*b*, and 1220*c* of the peripheral circuit structure PERI through a second input/output contact plug 1303. In an embodiment, the second input/output pad 1305 may be electrically connected to the circuit device 1220*a*.

In an embodiment, the second substrate 1310 and the common source line 1320 may not be disposed in a region provided with the second input/output contact plug 1303. In addition, the second input/output pad 1305 may not overlap the word lines 1330 in the third direction (i.e., the z-axis direction). Referring to FIG. 17, the second input/output contact plug 1303 may be separated from the second substrate 1310 in a direction parallel to the top surface of the second substrate 1310, may penetrate an interlayer insulating layer 1315 of the cell array structure CELL, and may be connected to the second input/output pad 1305.

In an embodiment, the first input/output pad 1205 and the second input/output pad 1305 may be selectively formed. As an example, the memory device 1400 may be configured to include only the first input/output pad 1205, which is provided on the first substrate 1210, or to include only the second input/output pad 1305, which is provided on the second substrate 1310. Alternatively, the memory device 1400 may be configured to include both of the first and second input/output pads 1205 and 1305.

A metal pattern, which is used as a dummy pattern, may be provided in the uppermost metal layer of the outer pad bonding region PA and the bit line bonding region BLBA, which are included in each of the cell array structure CELL and the peripheral circuit structure PERI, or may not be provided in the uppermost metal layer.

The memory device 1400 may include an upper metal pattern 1372*a* and a lower metal pattern 1273*a*, which are provided in the outer pad bonding region PA, and here, the lower metal pattern 1273*a* may be formed in the uppermost metal layer of the peripheral circuit structure PERI to correspond to the upper metal pattern 1372*a*, which is formed in the uppermost metal layer of the cell array structure CELL, or to have the same shape as the upper metal pattern 1372*a* of the cell array structure CELL. The lower metal pattern 1273*a*, which is formed in the uppermost metal layer of the peripheral circuit structure PERI, may not be connected to any contact plug in the peripheral circuit structure PERI. Similarly, in the outer pad bonding region PA, the upper metal pattern 1372*a* may be formed in the uppermost metal layer of the cell array structure CELL to correspond to the lower metal pattern 1273*a*, which is formed in the uppermost metal layer of the peripheral circuit structure PERI, and in this case, the upper metal pattern 1372*a* may have the same shape as the lower metal pattern 1273*a* of the peripheral circuit structure PERI.

The lower bonding metals 1271*b* and 1272*b* may be formed on the second metal layer 1240*b* of the word line bonding region WLBA. In the word line bonding region WLBA, the lower bonding metals 1271*b* and 1272*b* of the peripheral circuit structure PERI may be electrically connected to the upper bonding metals 1371*b* and 1372*b* of the cell array structure CELL in a bonding manner.

Furthermore, in the bit line bonding region BLBA, an upper metal pattern 1392 may be formed in the uppermost metal layer of the cell array structure CELL to correspond to a lower metal pattern 1252, which is formed in the uppermost metal layer of the peripheral circuit structure PERI, and in this case, the upper metal pattern 1392 may have the same shape as the lower metal pattern 1252 of the peripheral circuit structure PERI. In an embodiment, any contact plug may not be formed on the upper metal pattern 1392, which is formed in the uppermost metal layer of the cell array structure CELL.

In a three-dimensional semiconductor memory device according to an embodiment and an electronic system including the same, first, third, and fourth insulating line patterns may be used to divide a cell array structure into a first memory block region and a second memory block region (or into a first sub-stack structure and a second sub-stack structure), and in this case, an area of a spare memory block region may be reduced. In addition, each of memory block regions may be provided to include just one connection region, and thus, it may be possible to reduce an area occupied by the connection region. As a result, it may be possible to reduce a size of a semiconductor chip.

By way of summation and review, an embodiment provides a highly-integrated and highly-reliable three-dimensional semiconductor memory device and an electronic system including the same.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A three-dimensional semiconductor memory device, comprising:

a substrate including a first connection region, a first cell region, a separation region, a second cell region, and a second connection region, which are sequentially disposed in a first direction;

a stack structure including electrode layers and electrode interlayer insulating layers, which are alternately stacked on the substrate, the electrode layers including upper electrode layers;

a first insulating line pattern on the separation region, the first insulating line pattern penetrating the upper electrode layers and extending in a second direction crossing the first direction;

a second insulating line pattern and a third insulating line pattern on the separation region, the second insulating line pattern and the third insulating line pattern penetrating the first insulating line pattern and the stack structure, and extending in the second direction to divide the stack structure into a first sub-stack structure and a second sub-stack structure; and a remaining stack structure between the second insulating line pattern and the third insulating line pattern, the remaining stack structure being spaced apart from the first sub-stack structure and the second sub-stack structure, wherein a top surface of the first insulating line pattern is lower than top surfaces of the second insulating line pattern and the third insulating line pattern, and wherein a bottom surface of the first insulating line pattern is higher than bottom surfaces of the second insulating line pattern and the third insulating line pattern.

2. The semiconductor memory device as claimed in claim 1, wherein a top surface of the first insulating line pattern is coplanar with a top surface of the stack structure.

3. The semiconductor memory device as claimed in claim 1, wherein:

the electrode layers further include intermediate electrode layers below the first insulating line pattern, a first intermediate electrode layer, which is an uppermost one of the intermediate electrode layers, is in contact with a bottom surface of the first insulating line pattern, and the first intermediate electrode layer has a first thickness, below the first insulating line pattern, and a second thickness, between the electrode interlayer insulating layers, the first thickness being larger than the second thickness.

4. The semiconductor memory device as claimed in claim 3, wherein the intermediate electrode layers further include a second intermediate electrode layer, below the first intermediate electrode layer, the second intermediate electrode layer having a third thickness below the first insulating line pattern, and the third thickness being smaller than the first thickness.

5. The semiconductor memory device as claimed in claim 3, further comprising:

a first high-k dielectric layer between at least one of the upper electrode layers and a side surface of the first insulating line pattern; and a second high-k dielectric layer between the first intermediate electrode layer and a bottom surface of the first insulating line pattern.

6. The semiconductor memory device as claimed in claim 1, further comprising:

a peripheral circuit structure below the substrate;

a penetration electrode on the separation region and penetrating the remaining stack structure and the substrate, the penetration electrode being connected to the peripheral circuit structure; and a penetration insulating layer between the penetration electrode and the remaining stack structure.

7. The semiconductor memory device as claimed in claim 1, wherein:

the upper electrode layers protrude laterally from the electrode interlayer insulating layers to be in contact with the first insulating line pattern, each of the upper electrode layers has a first thickness between the electrode interlayer insulating layers, and end portions of the upper electrode layers in contact with the first insulating line pattern have a second thickness larger than the first thickness.

8. The semiconductor memory device as claimed in claim 1, wherein end portions of the upper electrode layers protrude laterally from the electrode interlayer insulating layers to form a stepwise shape and to be in contact with the first insulating line pattern.

9. The semiconductor memory device as claimed in claim 1, wherein the first insulating line pattern has an uneven side surface and has a width decreasing in a downward direction.

10. The semiconductor memory device as claimed in claim 1, wherein:

the upper electrode layers include first to fourth upper electrode layers, which are sequentially stacked, side surfaces of the third and fourth upper electrode layers are aligned with each other and are in contact with the first insulating line pattern, and end portions of the first and second upper electrode layers protrude laterally from the third upper electrode layer to be in contact with the first insulating line pattern, the end portions of the first and second upper electrode layers forming a stepwise shape.

11. The semiconductor memory device as claimed in claim 1, further comprising:

vertical pillars on the first cell region and penetrating the first sub-stack structure, the vertical pillars being two-dimensionally arranged, in a plan view; and a fourth insulating line pattern extending in the first direction to cross upper portions of some of the vertical pillars, a portion of the fourth insulating line pattern being inserted into the first insulating line pattern, and a bottom surface of the fourth insulating line pattern being lower than a bottom surface of the first insulating line pattern.

12. The semiconductor memory device as claimed in claim 11, wherein the electrode layers further include a first intermediate electrode layer below the first insulating line pattern and in contact with the first insulating line pattern, the fourth insulating line pattern penetrating the first intermediate electrode layer.

13. The semiconductor memory device as claimed in claim 1, further comprising remaining sacrificial patterns on the separation region and in the electrode layers, respectively, the remaining sacrificial patterns penetrating the electrode layers, respectively, and being in contact with the electrode interlayer insulating layers.

14. The semiconductor memory device as claimed in claim 13, wherein the remaining sacrificial patterns have concave side surfaces.

15. The semiconductor memory device as claimed in claim 13, further comprising a high-k dielectric layer between the remaining sacrificial patterns and the electrode layers.

16. The semiconductor memory device as claimed in claim 13, further comprising a penetration electrode penetrating the first insulating line pattern, the electrode interlayer insulating layers, and the remaining sacrificial patterns.

17. A three-dimensional semiconductor memory device, comprising:

a peripheral circuit structure; and a cell array structure on the peripheral circuit structure, the cell array structure including:

a substrate including a first connection region, a first cell region, a separation region, a second cell region, and a second connection region, which are sequentially disposed in a first direction, a source structure on the substrate, a stack structure including electrode layers and electrode interlayer insulating layers, which are alternately stacked on the source structure, the electrode layers including upper electrode layers, a first insulating line pattern on the separation region to penetrate the upper electrode layers and extend in a second direction crossing the first direction, a second insulating line pattern and a third insulating line pattern on the separation region to penetrate the first insulating line pattern and the stack structure and extend in the second direction to divide the stack structure into a first sub-stack structure and a second sub-stack structure, each of the first and second sub-stack structures including a lower stack structure and an upper stack structure thereon, a planarization insulating layer on the first and second connection regions to cover end portions of the first and second sub-stack structures, vertical semiconductor patterns on the first and second cell regions to penetrate the first and second sub-stack structures and the source structure and to be adjacent to the substrate, and bit line pads on the vertical semiconductor patterns, respectively, wherein:

each of side surfaces of the vertical semiconductor patterns has an inflection point, at an interface between the lower stack structure and the upper stack structure, the electrode layers further include intermediate electrode layers below the first insulating line pattern, a first intermediate electrode layer, which is an uppermost one of the intermediate electrode layers, being in contact with a bottom surface of the first insulating line pattern, and the first intermediate electrode layer has a first thickness, below the first insulating line pattern, and a second thickness, between the electrode interlayer insulating layers, the first thickness being larger than the second thickness.

18. The semiconductor memory device as claimed in claim 17, further comprising a remaining stack structure between the second insulating line pattern and the third insulating line pattern, the remaining stack structure being spaced apart from the first and second sub-stack structures.

19. The semiconductor memory device as claimed in claim 17, wherein a top surface of the first insulating line pattern is coplanar with a top surface of the stack structure.

20. An electronic system, comprising:

a semiconductor device including a peripheral circuit structure, a cell array structure on the peripheral circuit structure, and an input/output pad electrically connected to the peripheral circuit structure; and a controller electrically connected to the semiconductor device through the input/output pad, the controller being configured to control the semiconductor device, wherein the cell array structure includes:

a substrate including a first connection region, a first cell region, a separation region, a second cell region, and a second connection region, which are sequentially disposed in a first direction, a stack structure including electrode layers and electrode interlayer insulating layers, which are alternately stacked on the substrate, the electrode layers including upper electrode layers, a first insulating line pattern on the separation region to penetrate the upper electrode layers and extend in a second direction crossing the first direction, a second insulating line pattern and a third insulating line pattern on the separation region to penetrate the first insulating line pattern and the stack structure and to extend in the second direction to divide the stack structure into a first sub-stack structure and a second sub-stack structure, and a remaining stack structure between the second insulating line pattern and the third insulating line pattern and spaced apart from the first and second sub-stack structures, wherein a top surface of the first insulating line pattern is lower than top surfaces of the second insulating line pattern and the third insulating line pattern, and wherein a bottom surface of the first insulating line pattern is higher than bottom surfaces of the second insulating line pattern and the third insulating line pattern.

* * * * *